(12) United States Patent
Inoue et al.

(10) Patent No.: US 9,299,813 B2
(45) Date of Patent: *Mar. 29, 2016

(54) SEMICONDUCTOR DEVICE AND DRIVING METHOD THEREOF

(71) Applicant: SEMICONDUCTOR ENERGY LABORATORY CO., LTD., Atsugi-shi, Kanagawa-ken (JP)

(72) Inventors: Hiroki Inoue, Kanagawa (JP); Kiyoshi Kato, Kanagawa (JP); Takanori Matsuzaki, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/552,551

(22) Filed: Nov. 25, 2014

(65) Prior Publication Data

US 2015/0155289 A1 Jun. 4, 2015

Related U.S. Application Data

(63) Continuation of application No. 13/861,681, filed on Apr. 12, 2013, now Pat. No. 8,902,640, which is a continuation of application No. 13/195,105, filed on Aug. 1, 2011, now Pat. No. 8,422,272.

(30) Foreign Application Priority Data

Aug. 6, 2010 (JP) .................. 2010-176982
May 13, 2011 (JP) .................. 2011-108051

(51) Int. Cl.
G11C 11/24 (2006.01)
H01L 29/66 (2006.01)
(Continued)

(52) U.S. Cl.
CPC ........ *H01L 29/66969* (2013.01); *G11C 11/404* (2013.01); *G11C 11/405* (2013.01);
(Continued)

(58) Field of Classification Search
CPC ............... G11C 11/404; G11C 11/405; G11C 11/4074; G11C 11/4091
USPC ............... 365/149, 185.1, 185.14, 185.26
See application file for complete search history.

(56) References Cited

U.S. PATENT DOCUMENTS 4,466,081 A  8/1984  Masuoka
5,349,366 A  9/1994  Yamazaki et al.
(Continued)

FOREIGN PATENT DOCUMENTS

CN  101335273 A  12/2008
EP    1737044 A  12/2006
(Continued)

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

(Continued)

*Primary Examiner* — Pho M Luu
(74) *Attorney, Agent, or Firm* — Fish & Richardson P.C.

(57) ABSTRACT

A semiconductor device including a nonvolatile memory cell in which a writing transistor which includes an oxide semiconductor, a reading transistor which includes a semiconductor material different from that of the writing transistor, and a capacitor are included is provided. Data is written to the memory cell by turning on the writing transistor and applying a potential to a node where a source electrode (or a drain electrode) of the writing transistor, one electrode of the capacitor, and a gate electrode of the reading transistor are electrically connected, and then turning off the writing transistor, so that the predetermined amount of charge is held in the node. Further, when a p-channel transistor is used as the reading transistor, a reading potential is a positive potential.

19 Claims, 28 Drawing Sheets

(51) Int. Cl.

| | | |
|---|---|---|
| G11C 11/404 | (2006.01) | |
| G11C 11/405 | (2006.01) | |
| G11C 16/04 | (2006.01) | |
| H01L 27/115 | (2006.01) | |
| H01L 27/12 | (2006.01) | |
| H01L 27/108 | (2006.01) | |
| G11C 16/08 | (2006.01) | |
| G11C 16/24 | (2006.01) | |
| H01L 29/786 | (2006.01) | |
| H01L 21/02 | (2006.01) | |
| H01L 21/425 | (2006.01) | |
| H01L 21/441 | (2006.01) | |
| H01L 21/477 | (2006.01) | |
| G11C 11/4091 | (2006.01) | |

(52) U.S. Cl.
CPC ........... *G11C16/0408* (2013.01); *G11C 16/08* (2013.01); *G11C 16/24* (2013.01); *H01L 21/02565* (2013.01); *H01L 21/02631* (2013.01); *H01L 21/425* (2013.01); *H01L 21/441* (2013.01); *H01L 21/477* (2013.01); *H01L 27/108* (2013.01); *H01L 27/1156* (2013.01); *H01L 27/11521* (2013.01); *H01L 27/11526* (2013.01); *H01L 27/1207* (2013.01); *H01L 27/1225* (2013.01); *H01L 29/7869* (2013.01); *G11C 11/4091* (2013.01)

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,314,017 B1 | 11/2001 | Emori et al. | |
| 6,445,026 B1 | 9/2002 | Kubota et al. | |
| 6,536,013 B2 | 3/2003 | Kobayashi et al. | |
| 6,563,174 B2 | 5/2003 | Kawasaki et al. | |
| 6,727,522 B1 | 4/2004 | Kawasaki et al. | |
| 6,873,009 B2 | 3/2005 | Hisamoto et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,072,202 B2 | 7/2006 | Horiguchi et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,298,662 B2 | 11/2007 | Horiguchi et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,663,165 B2 | 2/2010 | Mouli | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,859,889 B2 | 12/2010 | Kameshiro et al. | |
| 7,910,490 B2 | 3/2011 | Akimoto et al. | |
| 7,932,521 B2 | 4/2011 | Akimoto et al. | |
| 7,935,582 B2 | 5/2011 | Iwasaki | |
| 8,036,036 B2 | 10/2011 | Nishiyama | |
| 8,084,331 B2 | 12/2011 | Ofuji et al. | |
| 8,202,365 B2 | 6/2012 | Umeda et al. | |
| 8,212,248 B2 | 7/2012 | Itagaki et al. | |
| 8,274,077 B2 | 9/2012 | Akimoto et al. | |
| 8,354,674 B2 | 1/2013 | Kimura | |
| 8,384,076 B2 | 2/2013 | Park et al. | |
| 8,384,077 B2 | 2/2013 | Yano et al. | |
| 8,422,272 B2 * | 4/2013 | Inoue et al. | 365/149 |
| 8,441,841 B2 * | 5/2013 | Nagatsuka et al. | 365/149 |
| 8,466,463 B2 | 6/2013 | Akimoto et al. | |
| 8,493,766 B2 | 7/2013 | Kawae | |
| 8,514,609 B2 | 8/2013 | Kawae et al. | |
| 8,559,220 B2 | 10/2013 | Yamazaki et al. | |
| 8,563,973 B2 | 10/2013 | Inoue et al. | |
| 8,576,636 B2 * | 11/2013 | Kato et al. | 365/187 |
| 8,582,348 B2 * | 11/2013 | Inoue et al. | 365/149 |
| 8,629,069 B2 | 1/2014 | Akimoto et al. | |
| 8,634,228 B2 | 1/2014 | Matsuzaki et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,797,791 B2 * | 8/2014 | Osada et al. | 365/156 |
| 8,902,640 B2 * | 12/2014 | Inoue et al. | 365/149 |
| 8,981,369 B2 | 3/2015 | Yano et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0209739 A1 | 11/2003 | Hisamoto et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0073871 A1 | 4/2005 | Luk et al. | |
| 2005/0128803 A1 | 6/2005 | Luk et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |

(56) References Cited

U.S. PATENT DOCUMENTS

| | | |
|---|---|---|
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0305461 A1 | 12/2009 | Akimoto et al. |
| 2010/0065838 A1 | 3/2010 | Yamazaki et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0136743 A1 | 6/2010 | Akimoto et al. |
| 2010/0148171 A1 | 6/2010 | Hayashi et al. |
| 2010/0193785 A1 | 8/2010 | Kimura |
| 2010/0276689 A1 | 11/2010 | Iwasaki |
| 2011/0024741 A1 | 2/2011 | Abe et al. |
| 2011/0101351 A1 | 5/2011 | Yamazaki |
| 2011/0104851 A1 | 5/2011 | Akimoto et al. |
| 2011/0121290 A1 | 5/2011 | Akimoto et al. |
| 2011/0121878 A1 | 5/2011 | Kato et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175083 A1 | 7/2011 | Sekine et al. |
| 2011/0175087 A1 | 7/2011 | Yamazaki et al. |
| 2011/0175104 A1 | 7/2011 | Yamazaki |
| 2011/0175646 A1 | 7/2011 | Takemura et al. |
| 2011/0176263 A1 | 7/2011 | Yamazaki et al. |
| 2011/0176348 A1 | 7/2011 | Yamazaki et al. |
| 2011/0176354 A1 | 7/2011 | Yamazaki et al. |
| 2011/0176355 A1 | 7/2011 | Furutani et al. |
| 2011/0176377 A1 | 7/2011 | Koyama |
| 2011/0182110 A1 | 7/2011 | Yamazaki et al. |
| 2011/0186837 A1 | 8/2011 | Takahashi et al. |
| 2011/0187410 A1 | 8/2011 | Kato et al. |
| 2011/0194327 A1 | 8/2011 | Kawae |
| 2011/0194331 A1 | 8/2011 | Kawae et al. |
| 2011/0194332 A1 | 8/2011 | Saito |
| 2011/0198593 A1 | 8/2011 | Kato et al. |
| 2011/0199807 A1 | 8/2011 | Saito et al. |
| 2011/0199816 A1 | 8/2011 | Inoue et al. |
| 2011/0204365 A1 | 8/2011 | Saito |
| 2011/0205774 A1 | 8/2011 | Takemura |
| 2011/0205785 A1 | 8/2011 | Nagatsuka et al. |
| 2011/0210339 A1 | 9/2011 | Yamazaki et al. |
| 2011/0215317 A1 | 9/2011 | Yamazaki et al. |
| 2011/0216571 A1 | 9/2011 | Yamazaki et al. |
| 2011/0220891 A1 | 9/2011 | Fujii et al. |
| 2011/0227062 A1 | 9/2011 | Kato et al. |
| 2011/0227072 A1 | 9/2011 | Inoue et al. |
| 2011/0228584 A1 | 9/2011 | Takemura |
| 2011/0249484 A1 | 10/2011 | Takemura |
| 2011/0255325 A1 | 10/2011 | Nagatsuka et al. |
| 2011/0260158 A1 | 10/2011 | Takemura |
| 2011/0278571 A1 | 11/2011 | Yamazaki et al. |
| 2011/0280061 A1 | 11/2011 | Saito et al. |
| 2011/0284838 A1 | 11/2011 | Saito |
| 2011/0286290 A1 | 11/2011 | Kamata |
| 2011/0297928 A1 | 12/2011 | Isobe et al. |
| 2011/0297939 A1 | 12/2011 | Kato |
| 2011/0298057 A1 | 12/2011 | Kato |
| 2011/0316057 A1 | 12/2011 | Kurata et al. |
| 2011/0317474 A1 | 12/2011 | Kato |
| 2012/0001243 A1 | 1/2012 | Kato |
| 2012/0012837 A1 | 1/2012 | Yamazaki et al. |
| 2012/0012845 A1 | 1/2012 | Kato et al. |
| 2012/0014157 A1 | 1/2012 | Kato et al. |
| 2012/0025284 A1 | 2/2012 | Kato et al. |
| 2012/0026774 A1 | 2/2012 | Shionoiri |
| 2012/0032161 A1 | 2/2012 | Matsubayashi |
| 2012/0032162 A1 | 2/2012 | Matsubayashi |
| 2012/0032171 A1 | 2/2012 | Saito et al. |
| 2012/0033483 A1 | 2/2012 | Koyama |
| 2012/0033485 A1 | 2/2012 | Matsuzaki et al. |
| 2012/0033486 A1 | 2/2012 | Inoue et al. |
| 2012/0250397 A1 | 10/2012 | Ohmaru |
| 2012/0287702 A1 | 11/2012 | Fujita |
| 2012/0294068 A1 | 11/2012 | Ishizu |
| 2013/0092932 A1 | 4/2013 | Yamazaki et al. |

FOREIGN PATENT DOCUMENTS

| | | |
|---|---|---|
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 56-162875 A | 12/1981 |
| JP | 57-105889 A | 7/1982 |
| JP | 60-198861 A | 10/1985 |
| JP | 62-274773 A | 11/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-119298 A | 5/1993 |
| JP | 05-251705 A | 9/1993 |
| JP | 06-251588 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-028443 A | 1/2001 |
| JP | 2001-053164 A | 2/2001 |
| JP | 2001-053167 A | 2/2001 |
| JP | 2002-076356 A | 3/2002 |
| JP | 2002-093924 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2007-042172 A | 2/2007 |
| JP | 2007-103918 A | 4/2007 |
| JP | 2009-033145 A | 2/2009 |
| JP | 2009-135350 A | 6/2009 |
| JP | 2009-164393 A | 7/2009 |
| JP | 2009-167087 A | 7/2009 |
| JP | 2009-182194 A | 8/2009 |
| JP | 2009-212443 A | 9/2009 |
| JP | 2009-260378 A | 11/2009 |
| JP | 2010-161382 A | 7/2010 |
| TW | 462127 | 11/2001 |
| TW | 201027752 | 7/2010 |
| WO | WO-2004/114391 | 12/2004 |
| WO | WO-2007/029844 | 3/2007 |
| WO | WO-2009/075281 | 6/2009 |

(56) References Cited

FOREIGN PATENT DOCUMENTS

| WO | WO-2009/087943 | 7/2009 |
|---|---|---|
| WO | WO-2009/110623 | 9/2009 |
| WO | WO-2010/029859 | 3/2010 |

OTHER PUBLICATIONS

Shukuri.S et al., "A Complementary Gain Cell Technology for sub-1 V Supply DRAMs", IEDM 92: Technical Digest of International Electron Devices Meeting, Dec. 13, 1992, pp. 1006-1008.
Ishii.T et al., "A Poly-Silicon TFT With a Sub-5-nm Thick Channel for Low-Power Gain Cell Memory in Mobile Applications", IEEE Transactions on Electrons Devices, Nov. 1, 2004, vol. 51, No. 11, pp. 1805-1810.
Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array", SID Digest '08 : SID International Symposium Disgest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In—Ga—Zn—Oxide TFT", AM-FPD '09 Digest of Technical Papers, Jul. 1, 2009, pp. 33-39.

Hirao.T et al., "Novel Top-Gate Zinc Oxide Thin-Film Transistors (ZnO TFTs) for AMLCDs", J. Soc. Inf. Display (Journal of the Society of Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn]at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B. (Physical Review. B), 2008, vol 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physicas Letters) , Sep. 1, 2003, vol. 83, No. 9, pp. 1755-1757.

European Office Action (Application No. 11176423.9) Dated Sep. 30, 2014.

Chinese Office Action(Application No. 201110233033.7) Dated Feb. 25, 2015.

Taiwanese Office Action (Application No. 100127747) Dated Oct. 23, 2015.

\* cited by examiner

FIG. 13A    FIG. 13B
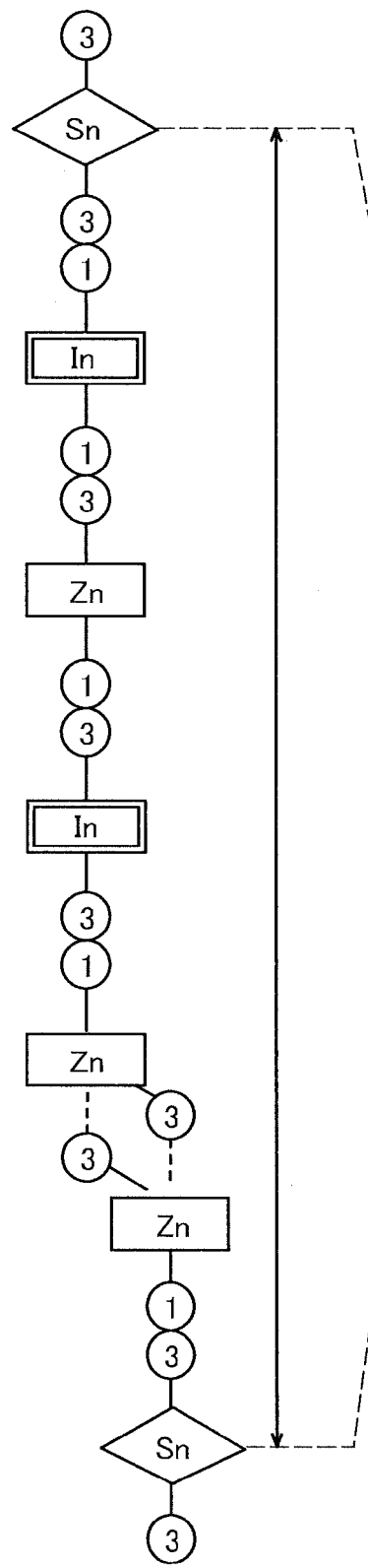
FIG. 13C
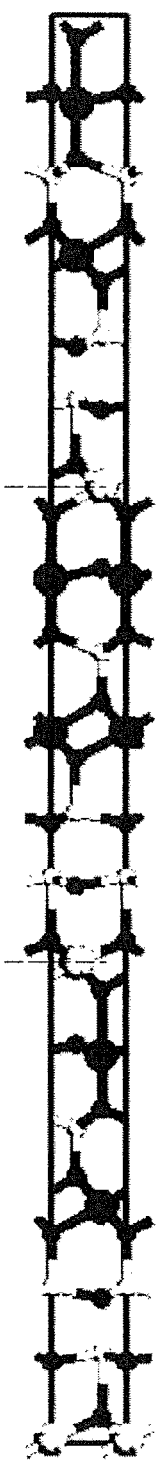
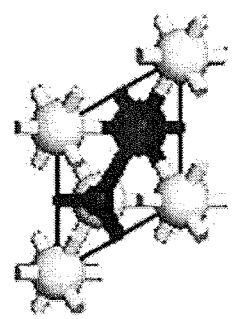
● In
☾ Sn
╰ Zn
• O

- In
- Ga
- Zn
- O

SEMICONDUCTOR DEVICE AND DRIVING METHOD THEREOF

CROSS-REFERENCE TO RELATED APPLICATIONS

This application is a continuation of U.S. application Ser. No. 13/861,681, filed Apr. 12, 2013, now U.S. Pat. No. 8,902,640, which is a continuation of U.S. application Ser. No. 13/195,105, filed Aug. 1, 2011, now U.S. Pat. No. 8,422,272, which claims the benefit of foreign priority applications filed in Japan as Serial No. 2010-176982 on Aug. 6, 2010, and Serial No. 2011-108051 on May 13, 2011, all of which are incorporated by reference.

BACKGROUND OF THE INVENTION

1. Field of the Invention

The disclosed invention relates to a semiconductor device using a semiconductor element and a method for manufacturing the semiconductor device. The disclosed invention also relates to a driving method of the semiconductor device.

2. Description of the Related Art

Storage devices using semiconductor elements are broadly classified into two categories: a volatile device that loses stored data when power supply stops, and a non-volatile device that retains stored data even when power is not supplied.

A typical example of a volatile storage device is a DRAM (dynamic random access memory). A DRAM stores data in such a manner that a transistor included in a storage element is selected and electric charge is stored in a capacitor.

On the above-described principle, when data is read from a DRAM, charge in a capacitor is lost; thus, another writing operation is necessary every time data is read out. Moreover, since leakage current (off-state current) flows between a source and a drain of a transistor included in a memory element when the transistor is in an off state, charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is an SRAM (static random access memory). An SRAM holds stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data holding time is extremely long (almost permanent) and refresh operation which is necessary in a volatile storage device is not needed (e.g., Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

In addition, high voltage is necessary in order to inject charge into the floating gate or removing the charge, and a circuit therefor is required. Further, it takes a relatively long time to inject or remove charge, and it is not easy to increase the speed of writing and erasing data.

REFERENCE

Patent Document 1: Japanese Published Patent Application No. S57-105889

SUMMARY OF THE INVENTION

In view of the foregoing problems, an object of one embodiment of the disclosed invention is to provide a semiconductor device having a novel structure, which can hold stored data even when not powered and which has an unlimited number of write cycles.

In the disclosed invention, a semiconductor device is formed using a material which allows a sufficient reduction in off-state current of a transistor; for example, an oxide semiconductor material, which is a wide-gap semiconductor, is used. When a semiconductor material which allows a sufficient reduction in off-state current of a transistor is used, the semiconductor device can hold data for a long period.

Further, one embodiment of the disclosed invention provides a semiconductor device including a nonvolatile memory cell including a writing transistor which includes an oxide semiconductor, a reading transistor which includes a semiconductor material different from that of the writing transistor, and a capacitor. Data is written or rewritten to the memory cell by turning on the writing transistor and applying a potential to a node where one of a source electrode and drain electrode of the writing transistor, one electrode of the capacitor, and a gate electrode of the reading transistor are electrically connected, and then turning off the writing transistor, so that the predetermined amount of charge is held in the node. Further, when a p-channel transistor is used as the reading transistor, a reading potential is a positive potential.

Specifically, structures described below can be employed, for example.

One embodiment of the present invention is a semiconductor device that includes a bit line, a source line, a write word line, a write-read word line, and a memory cell. The memory cell includes a first transistor which is a p-channel transistor and includes a first gate electrode, a first source electrode, a first drain electrode, and a first channel formation region; a second transistor including a second gate electrode, a second source electrode, a second drain electrode, and a second channel formation region; and a capacitor. The first channel formation region contains a semiconductor material different from that of the second channel formation region. The first gate electrode, the second drain electrode, and one electrode of the capacitor are electrically connected to form a node where charge is held. The bit line, the first source electrode, and the second source electrode are electrically connected; the source line and the first drain electrode are electrically connected; the write word line and the second gate electrode are electrically connected; and the write-read word line and the other electrode of the capacitor are electrically connected.

Another embodiment of the present invention is a semiconductor device that includes a bit line, a source line, a write word line, a write-read word line, a memory cell array including a plurality of memory cells, and a potential switching circuit. One of the memory cells includes a first transistor which is a p-channel transistor and includes a first gate electrode, a first source electrode, a first drain electrode, and a first channel formation region; a second transistor including a second gate electrode, a second source electrode, a second drain electrode, and a second channel formation region; and a capacitor. The first channel formation region contains a semiconductor material different from that of the second channel formation region. The first gate electrode, the second drain electrode, and one electrode of the capacitor are electrically connected to form a node where charge is held. The bit line, the first source electrode, and the second source electrode are electrically connected; one terminal of the potential switching circuit, the source line, and the first drain electrode are electrically connected; the write word line and the second gate electrode are electrically connected; the write-read word line and the other electrode of the capacitor are electrically connected; and the source line is electrically connected to the memory cells in a plurality of columns. The potential switching circuit has a function of selectively supplying a ground potential to the source line in a writing period.

In the above semiconductor device, the second channel formation region preferably includes an oxide semiconductor.

In the above semiconductor device, the second transistor is preferably provided so as to overlap with at least part of the first transistor.

In the above semiconductor device, the first channel formation region may include silicon.

In the above semiconductor device, the second transistor may be an n-channel transistor.

Another embodiment of the present invention is a driving method of a semiconductor device that includes a bit line, a source line, a plurality of write word lines, a plurality of write-read word lines, and a memory cell array including a plurality of memory cells. One of the memory cells includes a first p-channel transistor including a first gate electrode, a first source electrode, a first drain electrode, and a first channel formation region; a second transistor including a second gate electrode, a second source electrode, a second drain electrode, and a second channel formation region; and a capacitor. The first gate electrode, the second drain electrode, and one electrode of the capacitor are electrically connected to form a node where charge is held. The bit line, the first source electrode, and the second source electrode are electrically connected; the source line and the first drain electrode are electrically connected; one of the write word lines and the second gate electrode are electrically connected; and one of the write-read word lines and the other electrode of the capacitor are electrically connected. A ground potential is supplied to the source line in a writing period. In a reading period, a power supply potential is supplied to one of the write-read word lines which is connected to one of the memory cells in a non-selected state.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. In addition, the term ∀electrode∀ or ∀wiring∀ can also mean a combination of a plurality of ∀electrodes∀ and ∀wirings∀, for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Since the off-state current of a transistor including an oxide semiconductor is extremely low, stored data can be held for an extremely long time by using the transistor. In other words, power consumption can be adequately reduced because refresh operation is not needed or the frequency of refresh operation can be extremely low. Moreover, stored data can be held for a long time even when power is not supplied (note that a potential is preferably fixed).

Further, a semiconductor device according to one embodiment of the disclosed invention does not need high voltage for writing of data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to the disclosed invention has no limitation on the number of times data can be rewritten, which is a problem of a conventional nonvolatile memory, and the reliability thereof is drastically improved. Furthermore, since data is written by turning on or off the transistor, high-speed operation can be easily realized. Additionally, there is an advantage in that operation for erasing data is not needed.

When a transistor which includes a material other than an oxide semiconductor and can operate at sufficiently high speed is used as a reading transistor in combination with a transistor which includes an oxide semiconductor and is used as a writing transistor, a semiconductor device can perform operation (e.g., data reading) at sufficiently high speed. Further, a transistor including a material other than an oxide semiconductor can favorably realize a variety of circuits (e.g., a logic circuit or a driver circuit) which needs to be able to operate at high speed.

A semiconductor device having a novel feature can be realized by being provided with both the transistor including a material other than an oxide semiconductor (in other words, a transistor capable of operating at sufficiently high speed) and the transistor including an oxide semiconductor (in a broader sense, a transistor whose off-state current is sufficiently small).

BRIEF DESCRIPTION OF THE DRAWINGS

FIGS. 13A to 13C are views illustrating a crystal structure of an oxide material.

DETAILED DESCRIPTION OF THE INVENTION

Figures 1, 1A:
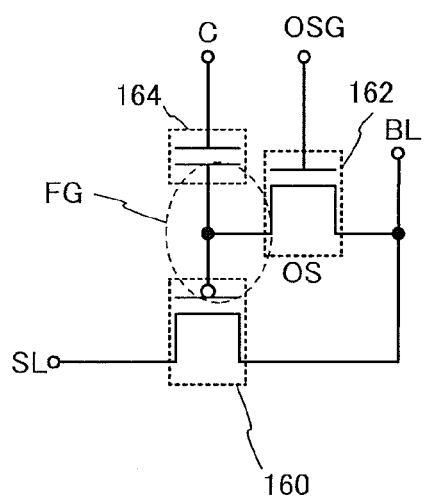
FIGS. 1A-1, 1A-2, and 1B are circuit diagrams of a semiconductor device.

Hereinafter, embodiments and examples of the present invention will be described with reference to the drawings.

Note that the present invention is not limited to the following description and it will be readily appreciated by those skilled in the art that the modes and details of the present invention can be modified in various ways without departing from the spirit and scope thereof. Therefore, the invention should not be construed as being limited to the description in following the embodiments and examples.

Note that the position, size, range, and the like of each component illustrated in the drawings and the like are not accurately represented for easy understanding in some cases. Therefore, the disclosed invention is not necessarily limited to the position, size, range, and the like in the drawings and the like.

In this specification and the like, ordinal numbers such as "first", "second", and "third" are used in order to avoid confusion among components, and the terms do not limit the components numerically.

Embodiment 1

In this embodiment, a basic circuit structure and operation of a semiconductor device according to one embodiment of the disclosed invention will be described with reference to FIGS. 1A-1, 1A-2, and 1B and FIGS. 2A and 2B. Note that in each of circuit diagrams, in some cases, "OS" is written beside a transistor in order to indicate that the transistor includes an oxide semiconductor.

<Basic Circuit 1>

First, the most basic circuit configuration and its operation will be described with reference to FIGS. 1A-1, 1A-2, and 1B. In a semiconductor device illustrated in FIG. 1A-1, a bit line BL, a source electrode (or a drain electrode) of a transistor 160, and a source electrode (or a drain electrode) of a transistor 162 are electrically connected; and a source line SL and the drain electrode (or the source electrode) of the transistor 160 are electrically connected. A write word line OSG and a gate electrode of the transistor 162 are electrically connected. A gate electrode of the transistor 160 and the drain electrode (or the source electrode) of the transistor 162 are electrically connected to one electrode of a capacitor 164. A write-read word line C and the other electrode of the capacitor 164 are electrically connected. Note that the source electrode (or the drain electrode) of the transistor 160 and the source electrode (or the drain electrode) of the transistor 162 may be connected to different wirings without being electrically connected to each other.

Here, a transistor including an oxide semiconductor is used as the transistor 162, for example. A transistor including an oxide semiconductor has a characteristic of a significantly small off-state current. For that reason, a potential of the gate electrode of the transistor 160 can be held for an extremely long time by turning off the transistor 162. When the capacitor 164 is provided, holding of charge supplied to the gate electrode of the transistor 160 and reading of stored data can be facilitated.

Note that there is no particular limitation on a semiconductor material used for the transistor 160. In terms of increasing the speed of reading data, it is preferable to use, for example, a transistor with high switching rate such as a transistor formed using single crystal silicon. Note that a p-channel transistor is used as the transistor 160.

Figure 1B:
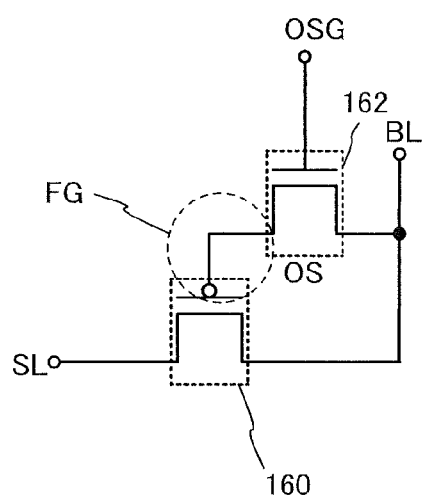

The capacitor 164 may be omitted as in FIG. 1B.

The semiconductor device in FIG. 1A-1 can write, hold, and read data as described below, utilizing a characteristic in which the potential of the gate electrode of the transistor 160 can be held.

First, writing and holding of data will be described. First, the potential of the write word line OSG is set to a potential which allows the transistor 162 to be turned on, so that the transistor 162 is turned on. Accordingly, the potential of the bit line BL is supplied to a node (also referred to as a node FG) where the drain electrode (or the source electrode) of the transistor 162, the gate electrode of the transistor 160, and one electrode of the capacitor 164 are electrically connected. In other words, predetermined charge is supplied to the node FG (data writing). Here, one of charges for supply of two different potentials (hereinafter, a charge for supply of a low potential is referred to as a charge $Q_L$ and a charge for supply of a high potential is referred to as a charge $Q_H$) is supplied. Note that charges giving three or more different potentials may be supplied to improve a storage capacitor. After that, the potential of the write word line OSG is set to a potential which allows the transistor 162 to be turned off, so that the transistor 162 is turned off. Thus, the charge supplied to the node FG is held (data holding).

Since the off-state current of the transistor 162 is significantly small, the charge of the gate electrode of the transistor 160 is held for a long time.

Secondly, reading of data will be described. When an appropriate potential (a reading potential) is supplied to the write-read word line C with the source line SL supplied with a predetermined potential (a constant potential), the bit line BL has a potential which varies depending on the amount of charge held in the node FG. In other words, the conductance of the transistor 160 is controlled by the charge held in the gate electrode of the transistor 160 (which can also be referred to as the node FG).

In general, when the transistor 160 is a p-channel transistor, an apparent threshold voltage $V_{th\_H}$ in the case where $Q_H$ is supplied to the gate electrode of the transistor 160 is lower than an apparent threshold voltage $V_{th\_L}$ in the case where $Q_L$ is supplied to the gate electrode of the transistor 160. For example, in the case where $Q_L$ is supplied in writing, when the potential of the write-read word line C is $V_0$ (a potential intermediate between $V_{th\_H}$ and $V_{th\_L}$), the transistor 160 is turned on. In the case where $Q_H$ is supplied in writing, even when the potential of the write-read word line C is $V_0$, the transistor 160 remains off. Thus, the data held can be read out by detecting the potential of the bit line BL.

Thirdly, rewriting of data will be described. Rewriting of data is performed in a manner similar to that of the writing and holding of data. In other words, the potential of the write word line OSG is set to a potential which allows the transistor 162 to be turned on, whereby the transistor 162 is turned on. Accordingly, the potential of the bit line BL (a potential for new data) is supplied to the node FG. After that, the potential of the write word line OSG is set to a potential which allows the transistor 162 to be turned off, whereby the transistor 162 is turned off. Accordingly, charge for new data is held in the node FG.

In the semiconductor device according to the invention disclosed, data can be directly rewritten by another writing of data as described above. Therefore, extracting of charge from a floating gate with the use of a high voltage needed in a flash memory or the like is not necessary and thus, reduction in operation speed, which is attributed to erasing operation, can be suppressed. In other words, high-speed operation of the semiconductor device can be realized.

Writing, holding, and reading of data, for example, in the case where either a potential $V_{DD}$ or a ground potential GND is supplied to the node FG will be specifically described below. In the description below, data that is held when the potential $V_{DD}$ is supplied to the node FG is referred to as data "1", and data that is held when the ground potential GND is supplied to the node FG is referred to as data "0". Note that the relationship among potentials supplied to the node FG is not limited to this example.

In the case where data is written, the source line SL is set to GND, the write-read word line C is set to GND, and the write word line OSG is set to $V_{DD}$, so that the transistor 162 is turned on. Then, in the case where data "0" is written to the node FG, GND is supplied to the bit line BL; in the case where data "1" is written to the node FG, the potential of the bit line BL is set to $V_{DD}$. Note that in the case where data "1" is written to the node FG, the potential of the write word line OSG may be set to $V_{DD}+V_{th\_OS}$ in order to prevent the potential supplied to the node FG from being lower than $V_{DD}$ by the threshold voltage of the transistor 162 ($V_{th\_OS}$).

In the case where the data is held, the write word line OSG is set to GND, so that the transistor 162 is turned off. The bit line BL and the source line SL are made to have the same potential in order to prevent power consumption due to current flowing in the bit line BL and the source line SL through the transistor 160 that is a p-channel transistor (hereinafter, also the p-channel transistor 160). Note that the potential of the write-read word line C may be either $V_{DD}$ or GND as long as the bit line BL and the source line SL have the same potential.

Note that in the above description, "the same potential" includes "substantially the same potential". In other words, the purpose of the above operation lies in that the potential difference between the bit line BL and the source line SL is sufficiently reduced to reduce current flowing in the bit line BL and the source line SL; therefore, "the same potential" includes "substantially the same potential", for example, a potential which allows power consumption to be sufficiently reduced (to one hundredth or less) compared to the case where the potential of the source line SL is fixed to GND or the like. In addition, potential deviation due to wiring resistance or the like are reasonably acceptable.

In the case where the data is read out, the write word line OSG is set to GND, the write-read word line C is set to GND, and the source line SL is set to $V_{DD}$ or a potential which is slightly lower than $V_{DD}$ (hereinafter, referred to as $V_R$). Here, in the case where data "1" has been written to the node FG, the p-channel transistor 160 is turned off, and the potential of the bit line BL is maintained at the level of the beginning of reading or is increased. Note that it depends on a reading circuit connected to the bit line BL whether the potential of the bit line BL is maintained or increased. Further, in the case where data "0" has been written to the node FG, the transistor 160 is turned on, and the potential of the bit line BL becomes $V_{DD}$ or $V_R$ which is equal to the potential of the source line SL. Thus, data "1" or data "0" held in the node FG can be read out by detecting the potential of the bit line BL.

Note that in the case where a potential $V_{DD}$ is held in the node FG (that is, data "1" has been written to the node FG), when the potential of the source line SL is set to $V_{DD}$ at the time of reading, the voltage between the gate and the source of the transistor 160 (hereinafter, referred to as $V_{gsp}$) becomes 0 V ($V_{gsp}=V_{DD}-V_{DD}=0$ V), so that $V_{gsp}$ is higher than the threshold voltage of the transistor 160 (hereinafter, referred to as $V_{th\_p}$); thus, the p-channel transistor 160 is turned off. Here, even in the case where the potential held in the node FG is lower than $V_{DD}$ because, for example, the potential written to the node FG is lower than $V_{DD}$, as long as the potential of the node FG is higher than or equal to $V_{DD}-|V_{th\_p}|$, the equation, $V_{gsp}=(V_{DD}-|V_{th\_p}|)-V_{DD}=-|V_{th\_p}|=V_{th\_p}$, is satisfied and the transistor 160 is turned off; thus, data "1" can be read correctly. However, in the case where the potential of the node FG is lower than $V_{DD}-|V_{th\_p}|$, $V_{gsp}$ is lower than $V_{th\_p}$; thus, the transistor 160 is turned on and not data "1" but data "0" is read, which is incorrect data reading. In other words, in the case where data "1" has been written, the lowest potential at which data "1" can be read is $V_{DD}-|V_{th\_p}|$ which is lower than the potential of the source line SL by $|V_{th\_p}|$.

In contrast, when the potential of the source line SL is set to $V_R$ at the time of reading, the lowest potential which allows data "1" to be read out is $V_R-|V_{th\_p}|$ which is lower than the potential $V_R$ of the source line SL by $|V_{th\_p}|$, as described above. Here, since $V_R$ is lower than $V_{DD}$, $V_R-|V_{th\_p}|$ is lower than $V_{DD}-|V_{th\_p}|$. In other words, the lowest potential which allows data "1" to be read out in the case where the potential of the source line SL is set to $V_R$ is lower than that in the case where the potential of the source line SL is set to $V_{DD}$. Thus, setting the potential of the source line SL to $V_R$ is preferable to setting the potential to $V_{DD}$, in which case the range of the potential which allows reading of data "1" can be widened. As for the highest potential which allows data to be read out, in the case where the potential of the source line SL is set to $V_R$, $V_{gsp}$ in the case where $V_{DD}$ has been written to the node FG is $V_{DD}-V_R>V_{th\_p}$ (because of $V_{DD}>V_R$); thus, the transistor 160 can be turned off without any problem.

Here, the node (the node FG) where the drain electrode (or the source electrode) of the transistor 162, the gate electrode of the transistor 160, and one electrode of the capacitor 164 are electrically connected has a function similar to that of a floating gate of a floating-gate transistor used for a nonvolatile memory element. When the transistor 162 is off, the node FG can be regarded as being embedded in an insulator and charge is held in the node FG. The off-state current of the transistor 162 including an oxide semiconductor is smaller than or equal to one hundred thousandth of the off-state current of a transistor including a silicon semiconductor or the like; thus, loss of the charge accumulated in the node FG due to leakage current of the transistor 162 is negligible. In other words, with the transistor 162 including an oxide semiconductor, a nonvolatile memory device which can store data without being supplied with power can be realized.

For example, when the off current of the transistor 162 is 10 zA (1 zA (zeptoampere) is $1\times10^{-21}$ A) or less at room temperature (25° C.) and the capacitance value of the capacitor 164 is approximately 10 fF, data can be stored for $10^4$ seconds or longer. Needless to say, the holding time depends on transistor characteristics and the capacitance value.

Further, the semiconductor device according to an embodiment of the disclosed invention does not have the problem of deterioration of a gate insulating layer (a tunnel insulating film), which is a problem of a conventional floating-gate transistor. In other words, the problem of deterioration of a gate insulating layer due to injection of electrons into a floating gate, which has been regarded as a problem, can be solved. This means that there is no limit on the number of times of writing in principle. Furthermore, a high voltage needed for writing or erasing in a conventional floating-gate transistor is not necessary.

Figures 1, 1A, 2:
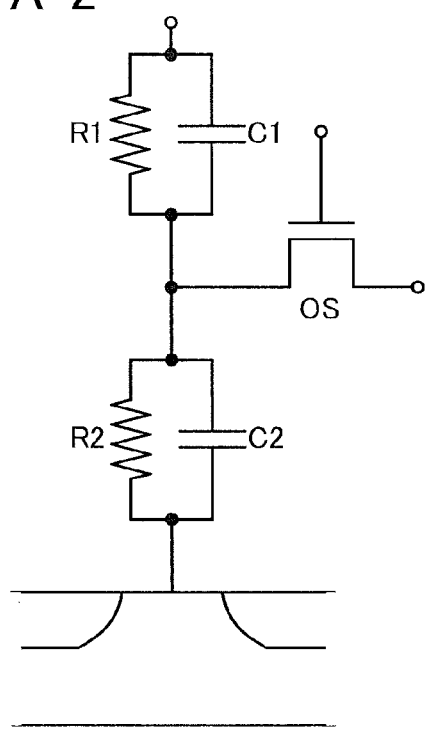

Components such as transistors in the semiconductor device in FIG. 1A-1 can be regarded as including resistors and capacitors as illustrated in FIG. 1A-2. In other words, in FIG. 1A-2, the transistor 160 and the capacitor 164 are each regarded as including a resistor and a capacitor. R1 and C1 denote the resistance and the capacitance of the capacitor 164, respectively. The resistance R1 corresponds to the resistance of the insulating layer included in the capacitor 164. R2 and C2 denote the resistance and the capacitance of the transistor 160, respectively. The resistance R2 corresponds to the resistance of the gate insulating layer at the time when the transistor 160 is turned on. The capacitance C2 corresponds to a so-called gate capacitance (capacitance formed between the gate electrode and the source or drain electrode, and capacitance formed between the gate electrode and the channel formation region).

A charge holding period (also referred to as a data holding period) is determined mainly by the off-state current of the transistor 162 under the conditions where the gate leakage current of the transistor 162 is sufficiently small and R1 and R2 satisfy R1≥ROS and R2≥ROS, where ROS is the resistance (also referred to as effective resistance) between the source electrode and the drain electrode in a state where the transistor 162 is turned off.

On the other hand, in the case where the conditions are not satisfied, it is difficult to secure a sufficient holding period even if the off-state current of the transistor 162 is small enough. This is because a leakage current other than the off-state current of the transistor 162 (e.g., a leakage current generated between the source electrode and the gate electrode) is large. Accordingly, it can be said that it is preferable that the semiconductor device disclosed in this embodiment satisfies the above relationships of R1≥ROS and R2≥ROS.

Meanwhile, it is desirable that C1 and C2 satisfy C1≥C2. This is because if C1 is large, when the potential of the node FG is controlled by the read-write word line C, the potential of the read-write word line C can be efficiently supplied to the node FG and the difference between potentials supplied to the read-write word line C (e.g., a reading potential and a non-reading potential) can be kept small.

As described above, when the above relation is satisfied, a more favorable semiconductor device can be realized. Note that R1 and R2 are controlled by the gate insulating layer of the transistor 160 and the insulating layer of the capacitor 164. The same relation is applied to C1 and C2. Therefore, the material, the thickness, and the like of the gate insulating layer are desirably set as appropriate to satisfy the above relation.

In the semiconductor device described in this embodiment, the node FG has an effect similar to a floating gate of a floating-gate transistor in a flash memory or the like, but the node FG of this embodiment has a feature which is essentially different from that of the floating gate in the flash memory or the like.

In a flash memory, since a potential supplied to a control gate is high, it is necessary to keep a proper distance between cells in order to prevent the potential from affecting a floating gate of the adjacent cell. This is one of inhibiting factors for high integration of the semiconductor device. The factor is attributed to a basic principle of a flash memory, in which a tunneling current flows in applying a high electrical field.

In contrast, the semiconductor device according to this embodiment is operated by switching of a transistor including an oxide semiconductor and does not use the above-described principle of charge injection by tunneling current. In other words, a high electric field for charge injection is not necessary unlike a flash memory. Accordingly, it is not necessary to consider an influence of a high electric field from a control gate on an adjacent cell, which facilitates high integration.

In addition, the semiconductor device according to the disclosed invention is advantageous over a flash memory in that a high electric field is not necessary and a large peripheral circuit (such as a booster circuit) is not necessary. For example, the highest voltage applied to the memory cell according to this embodiment (the difference between the highest potential and the lowest potential supplied to terminals of the memory cell at the same time) can be 5 V or lower, preferably 3 V or lower in each memory cell in the case where two levels (one bit) of data are written.

In the case where the dielectric constant ∈r1 of the insulating layer included in the capacitor 164 is different from the dielectric constant ∈r2 of the insulating layer included in the transistor 160, C1 and C2 can easily satisfy C1≥C2 while S1 which is the area of the insulating layer included in the capacitor 164 and S2 which is the area of an insulating layer forming gate capacitance of the transistor 160 satisfy 2×S2≥S1 (desirably S2≥S1). In other words, C1 can easily be made greater than or equal to C2 while the area of the insulating layer included in the capacitor 164 is made small. Specifically, for example, a film formed of a high-k material such as hafnium oxide or a stack of a film formed of a high-k material such as hafnium oxide and a film formed of an oxide semiconductor is used for the insulating layer including in the capacitor 164 so that ∈r1 can be set to 10 or more, preferably 15 or more, and silicon oxide is used for the insulating layer forming the gate capacitance of the transistor 160 so that ∈r2 can be set to 3 to 4.

Combination of such structures enables higher integration of the semiconductor device according to the disclosed invention.

<Basic Circuit 2>

Figure 2A:
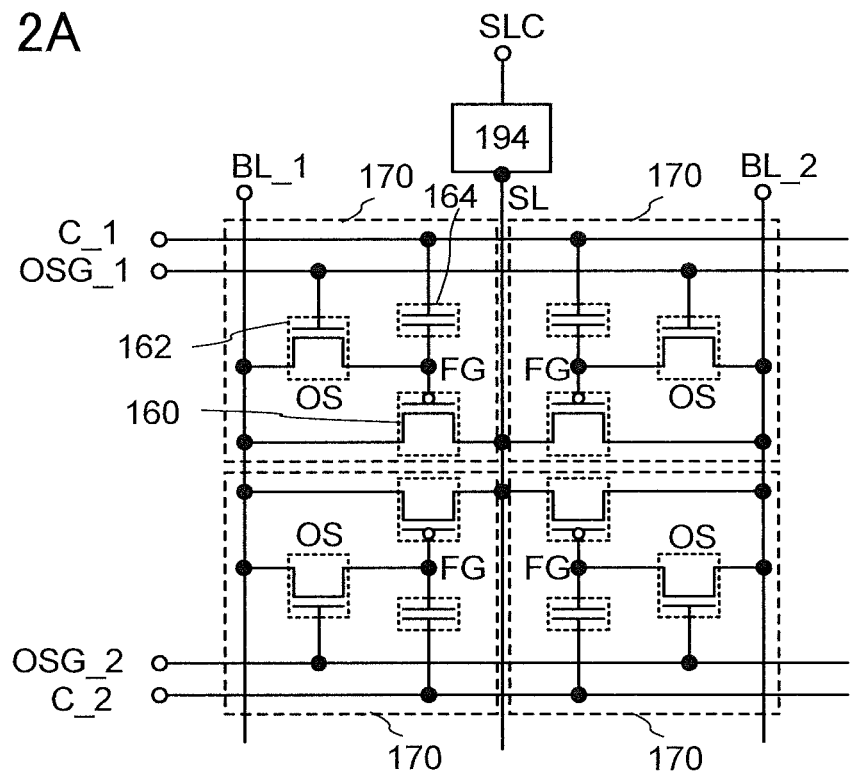
FIGS. 2A and 2B are circuit diagrams of a semiconductor device.
Figure 2B:
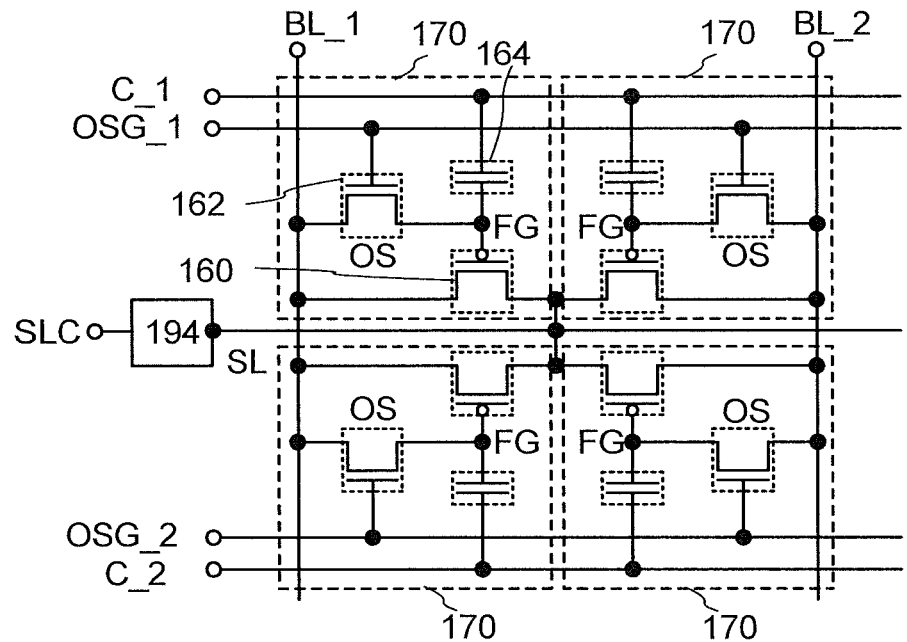

FIGS. 2A and 2B are circuit diagrams of memory cell arrays in each of which the memory cells illustrated in FIG. 1A-1 are arranged in a matrix in two rows and two columns. The structures of memory cells 170 in FIGS. 2A and 2B are similar to that in FIG. 1A-1. Note that the memory cells in two columns share the source line SL in FIG. 2A, and the memory cells in two rows share the source line SL in FIG. 2B.

When memory cells in two columns or two rows share the source line SL as in FIG. 2A or 2B, the number of signal lines connected to the memory cells 170 can be reduced to 3.5 (3+½) from 4 that is the number of signal lines in the case where the source line SL is not shared.

Note that without limitation to two columns (or two rows), plural columns (or plural rows) such as three or more columns (or three or more rows) may share the source line SL. The number of columns (or rows) which share the source line SL may be determined as appropriate in consideration of parasitic resistance and parasitic capacitance generated when the source line SL is shared. Further, the number of columns (or rows) which share the source line SL is preferably large, in which case the number of signal lines connected to the memory cells 170 can be reduced.

In FIGS. 2A and 2B, the source line SL is connected to a source line switching circuit 194. Here, the source line switching circuit 194 is connected to a source line switching signal line SLC in addition to the source line SL.

In semiconductor devices illustrated in FIGS. 2A and 2B, writing, holding, and reading of data are performed in a manner similar to that in the case of FIGS. 1A-1, 1A-2, and 1B; therefore, the above description can be referred to. Note that, a writing operation, for example, in the case where either a power supply potential $V_{DD}$ or a ground potential GND is supplied to the node FG and in the case where data held at the time when a power supply potential $V_{DD}$ is supplied to the node FG is data "1" and data held at the time when a ground potential GND is supplied to the node FG is data "0" will be specifically described below. First, the potential of the write-read word line C connected to the memory cell 170 is set to GND and the potential of the write word line OSG connected to the memory cell 170 is set to $V_{DD}$, so that the memory cell 170 is selected. Accordingly, the potential of the bit line BL is supplied to the node FG of the selected memory cell 170.

Here, in the case where a ground potential GND is supplied to the node FG (i.e., in the case where data "0" is held), a potential which allows the transistor 160 to be turned on is supplied to the gate electrode of the transistor 160. In that case, the potential of the source line SL needs to be set to a ground potential GND in order to suppress an increase in potential written to the node FG due to current flowing in the bit line BL and the source line SL.

Thus, the signal path in the source line switching circuit 194 is switched with a signal of the source line switching signal line SLC to supply a ground potential GND to the source line SL.

The operation is characterized in that the potential of the source line SL is set to a ground potential GND when data is written. This can suppress generation of current flowing in the bit line BL and the source line SL even when a potential which allows the transistor 160 to be turned on is supplied to the node FG.

In the case where the memory cells 170 are arrayed as in FIGS. 2A and 2B, it is necessary to read out data only from the intended memory cell 170 when data is read. In order to read out data only from the predetermined memory cell 170 and not to read out data from the other memory cells 170 as described above, the memory cells 170 from which data is not read out need to be in a non-selected state.

For example, as described in <Basic Circuit 1>, in the case where either a power supply potential $V_{DD}$ or a ground potential GND is supplied to the node FG and in the case where data held at the time when a power supply potential $V_{DD}$ is supplied to the node FG is data "1" and data held at the time when a ground potential GND is supplied to the node FG is data "0", the source line SL is set to GND, the write-read word line C is set to $V_{DD}$, and the write word line OSG is set to GND, so that the memory cell 170 can be brought into a non-selected state.

When the write-read word line C is set to $V_{DD}$, the potential of the node FG is increased by $V_{DD}$ due to capacitive coupling with the capacitor 164. In the case where $V_{DD}$ that is data "1" has been written to the node FG, the potential of the node FG is increased by $V_{DD}$ to be $2V_{DD}$ ($V_{DD}+V_{DD}=2V_{DD}$) and $V_{gsp}$ is higher than $V_{th\_p}$; accordingly, the p-channel transistor 160 is turned off. In contrast, in the case where GND that is data "0" has been written to the node FG, the potential of the node FG is increased by $V_{DD}$ to be $V_{DD}$ (GND+$V_{DD}=V_{DD}$) and $V_{gsp}$ is higher than $V_{th\_p}$; accordingly, the p-channel transistor 160 is turned off. In other words, by setting the write-read word line C to $V_{DD}$, the transistor 160 can be turned off, that is, the memory cell 170 can be brought into a non-selected state regardless of the data held in the node FG.

Note that if n-channel transistors are used as the reading transistors 160, in the case where the potentials of gate electrodes of the n-channel transistors are higher than the threshold voltage of the transistors, not all memory cells can be turned off even by setting the write-read word line C to 0 V. Thus, a negative potential needs to be supplied to the write-read word line C in a non-selected row in order to bring the memory cells into a non-selected state. In contrast, in the semiconductor device described in this embodiment, p-channel transistors are used as the reading transistors. Thus, memory cells in a non-selected row can be turned off by setting the write-read word line C in a non-selected row to a high potential. Accordingly, a power supply generating a negative potential does not need to be provided for the memory cell. As a result, power consumption can be reduced and the semiconductor device can be downsized.

As described above, in the semiconductor devices having the circuit configurations illustrated in FIGS. 2A and 2B, the area of the memory cell array can be reduced by sharing the source line SL by plural columns (or plural rows). Accordingly, the die size can be reduced. Moreover, the reduction in the die size allows cost reduction in manufacturing the semiconductor device or improvement in yield.

Application Example 1

Next, a more specific circuit configuration to which the circuit illustrated in FIGS. 1A-1, 1A-2 and 1B is applied and its operation thereof will be described with reference to FIG. 3 and FIG. 4. Note that the case where an n-channel transistor is used as a writing transistor (the transistor 162) and a p-channel transistor is used as a reading transistor (the transistor 160) will be described below as an example. Note that in the circuit diagram illustrated in FIG. 3, wirings with slashes are bus signal lines.

Figure 3:
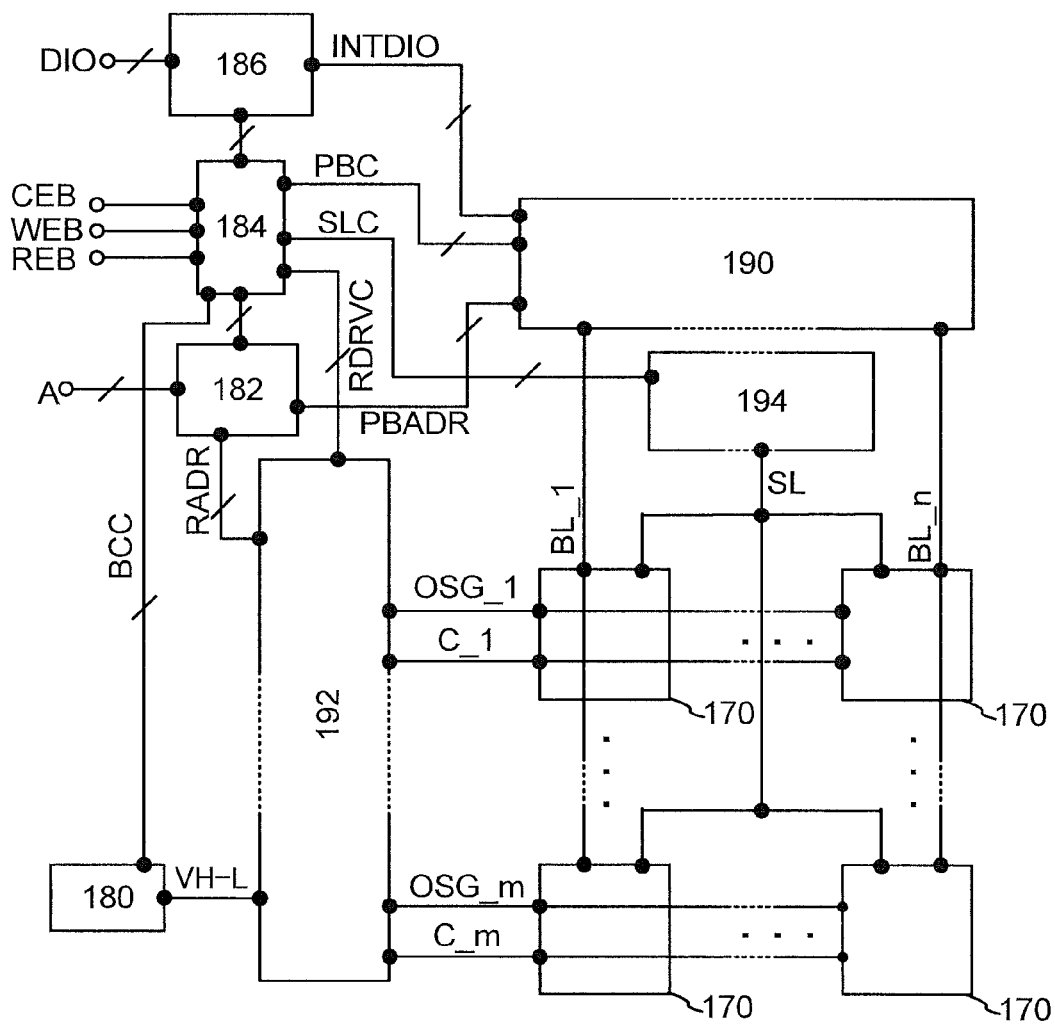
FIG. 3 is a circuit diagram of a semiconductor device.

FIG. 3 is an example of a circuit diagram of a semiconductor device including (m×n) memory cells 170. The configuration of the memory cells 170 in FIG. 3 is similar to that in FIG. 1A-1.

The semiconductor device illustrated in FIG. 3 includes m (m is an integer greater than or equal to 2) write word lines OSG, m write-read word lines C, n (n is an integer greater than or equal to 2) bit lines BL, a source line SL, a memory cell array having the memory cells 170 arranged in a matrix of m (rows)×n (columns), a step-up circuit 180, a first driver circuit 182 including an address decoder, a second driver circuit 192 including a row driver, a third driver circuit 190 including a page buffer, a fourth driver circuit 184 including a controller, a fifth driver circuit 186 including an input-output control circuit, and the source line switching circuit 194. The number of driver circuits is not limited to the number in FIG. 3. Driver circuits having various functions may be combined. Alternatively, functions of each driver circuit may be separated for other driver circuits.

In the semiconductor device illustrated in FIG. 3, the first driver circuit 182 includes an address decoder. The address decoder is a circuit which decodes an address selection signal line A and outputs the decoded address selection signal to a row selection signal line RADR and a page buffer address selection signal line PBADR. The address selection signal line A corresponds to a terminal to which a row address selection signal of the memory cells 170 and a page buffer address selection signal are input. One or more address selection signal lines A are provided depending on the numbers of columns and rows of the memory cells 170 or the structure of the page buffer. The row selection signal line RADR is a signal line which specifies the row address of memory cells. The page buffer address selection signal line PBADR is a signal line which specifies the page buffer address.

The second driver circuit 192 includes a row driver. The row driver outputs a row selection signal of the memory cells 170, a signal to the write word line OSG, and a signal to the write-read word line C on the basis of a signal output to the row selection signal line RADR from the address decoder included in the first driver circuit 182.

The step-up circuit 180 is connected to the second driver circuit 192 through a wiring VH-L and is configured to step up a constant potential (e.g., a power supply potential $V_{DD}$) which is input from the step-up circuit 180 and to output a potential (VH) higher than the constant potential to the second driver circuit 192. In order to prevent a potential written to the node FG of the memory cell 170 from being decreased by the threshold voltage ($V_{th\_OS}$) of the transistor 162 that is a writing transistor, the potential of the write word line OSG needs to be set higher than the sum of the potential of the bit line BL and $V_{th\_OS}$. Thus, for example, when the power supply potential $V_{DD}$ is written to the node FG, VH is set higher than or equal to ($V_{DD}+V_{th\_OS}$). Note that if a decrease in the potential written to the node FG by $V_{th\_OS}$ does not cause any problem, the step-up circuit 180 is not necessarily provided.

The third driver circuit 190 includes a page buffer. The page buffer functions as both a data latch and a sense amplifier. The page buffer functions as a data latch as follows: the page buffer temporarily holds data output from an internal data input-output signal line INTDIO or the bit line BL and outputs the held data to the internal data input-output signal line INTDIO or the bit line BL. The page buffer functions as a sense amplifier as follows: the page buffer senses the bit line BL to which data is output from the memory cell when data is read.

The fourth driver circuit 184 is a circuit which includes a controller and generates signals for controlling the first driver circuit 182, the second driver circuit 192, the third driver circuit 190, the fifth driver circuit 186, the source line switching circuit 194, and the step-up circuit 180, from a signal from a chip-enable bar signal line CEB, a write-enable bar signal line WEB, or a read-enable bar signal line REB.

The chip-enable bar signal line CEB is a signal line for outputting a selection signal for the entire circuit, and accepts an input signal and outputs an output signal only when it is active. The write-enable bar signal line WEB is a signal line for outputting a signal which allows latch data of the page buffer in the third driver circuit 190 to be written to the memory cell array. The read-enable bar signal line REB is a signal line for outputting a signal which allows data of the memory cell array to be read out. The fourth driver circuit 184 is connected to the step-up circuit 180 through a step-up circuit control signal line BCC. The step-up circuit control signal line BCC is a wiring for transmitting a control signal of the step-up circuit which is output from the controller in the fourth driver circuit 184. No step-up circuit control signal line BCC or plural step-up circuit control signal lines BCC are provided depending on the circuit configuration. In addition, the fourth driver circuit 184 is connected to the third driver circuit 190 through a page buffer control signal line PBC. The page buffer control signal line PBC is a wiring for transmitting a control signal of the page buffer which is output from the controller in the fourth driver circuit 184. No page buffer control signal line PBC or plural page buffer control signal lines PBC are provided depending on the circuit configuration. In addition, the fourth driver circuit 184 is connected to the second driver circuit 192 through a row driver control signal line RDRVC. In addition, the fourth driver circuit 184 is connected to the source line switching circuit 194 through the source line switching signal line SLC.

The source line switching circuit 194 is a circuit which switches the potential of the source line SL on the basis of a source line switching signal from the controller in the fourth driver circuit 184. The source line switching circuit 194 may have a function of switching the potential of the source line SL, and a multiplexer, an inverter, or the like may be used. The source line switching signal line SLC is a wiring for transmitting a signal which is for switching the potential of the source line SL and is output from the controller in the fourth driver circuit 184. One or more signal lines are provided depending on the circuit configuration.

The fifth driver circuit 186 includes an input-output control circuit. The input-output control circuit is a circuit for outputting an input signal from a data input-output signal line DIO to the internal data input-output signal line INTDIO or outputting an input signal from the internal data input-output signal line INTDIO to the data input-output signal line DIO. A terminal of the data input-output signal line DIO is a terminal to which external data is input or from which memory data is output to the outside. One or more signal lines are provided depending on the circuit configuration. The internal data input-output signal line INTDIO is a signal line for inputting an output signal from the input-output control circuit to the page buffer or inputting an output signal from the page buffer to the input-output control circuit. One or more signal lines are provided depending on the circuit configuration. Further, the data input-output signal line DIO may be divided into a date-input signal line and a data output signal line.

In the semiconductor device illustrated in FIG. 3, writing, holding, and reading of data are basically similar to those in the case of FIGS. 1A-1, 1A-2, and 1B and FIGS. 2A and 2B. FIG. 4 is an example of a timing chart for the writing and reading operations of the semiconductor device in FIG. 3. Specifically, an example of an operation of writing latch data of the page buffer to the memory cell array and an example of an operation of reading out data written to the memory cell array and latching the data in the page buffer will be described. In the timing chart, CEB, WEB, and the like denote the wirings to which the potentials in the timing chart are applied. Wirings having a similar function are distinguished by "1", "m", "n", and the like added to the end of their names. Note that the disclosed invention is not limited to the arrangement described below. Although CEB, WEB, and REB are active when a potential of "Low" is input in the circuit configuration described in this embodiment, a circuit may be employed in which CEB, WEB, and REB are active when a potential of "High" is input.

The timing chart shows the relationship among the potentials of the wirings in the case where data "1" is written to the memory cell in the first row and the first column, data "0" is written to the memory cell in the first row and the n-th column, data "0" is written to the memory cell in the m-th row and the first column, and data "1" is written to the memory cell in the m-th row and the n-th column in the memory cells in m rows and n columns, and then the written data in all the above memory cells is read out.

In a writing period, first, the chip-enable bar signal line CEB is set to a low potential and an address of the memory cell 170 to which data is written is specified by a signal from the address selection signal line A. After that, the write-enable bar signal line WEB is set to a low potential. Thus, writing is performed. The page buffer outputs latch data which is writing data to the bit line BL. The row driver outputs a high potential to the write word line OSG in a selected row and the write-read word line C in a non-selected row and outputs a low potential to the write word line in a non-selected row and the write-read word line C in a selected row.

In the writing period, writing data is output to the bit line BL from the page buffer in accordance with the timing of row selection. The bit line BL in the case of writing of data "1" has a high potential, whereas the bit line BL in the case of writing of data "0" has a low potential. Note that the signal input period of the bit line BL is set so as to be longer than that of the write word line OSG in a selected row and the write-read word line C in a selected row for the following reason: if the signal input period of the bit line BL is short, incorrect writing of data to the memory cell might be caused.

Note that in the case where a ground potential GND is supplied to the node FG in the writing period, the potential of the source line SL is set to a ground potential GND in order to prevent current flowing in the bit line BL and the source line SL. This driving is performed by switching the signal path in the source line switching circuit 194 with a signal from the source line switching signal line SLC.

In a reading period, first, the chip-enable bar signal line CEB is set to a low potential and an address of the memory cell 170 from which data is read is specified by a signal from the address selection signal line A. After that, the read-enable bar signal line REB is set to a low potential. Thus, reading is performed. The page buffer latches data which is read out to the bit line BL from the memory cell. The row driver outputs a low potential to the write-read word line C in a selected row and outputs a high potential to the write-read word line C in a non-selected row. The write word line OSG has a low potential regardless of a selected state or a non-selected state. The source line switching circuit 194 outputs a high potential to the source line SL.

In the reading period, a potential corresponding to the data which has been written to the memory cell 170 is output to the bit line BL in accordance with the timing of row selection. The bit line BL has a low potential when data "1" has been written to the memory cell, whereas the bit line BL has a high potential when data "0" has been written to the memory cell.

In a standby and data holding period, the chip-enable bar signal line CEB is set to a high potential to make the entire circuit illustrated in FIG. 3 non-active. In this case, neither writing nor reading is performed; thus, control signals for WEB, REB, and the like may have either a high potential or a low potential.

Figure 4:
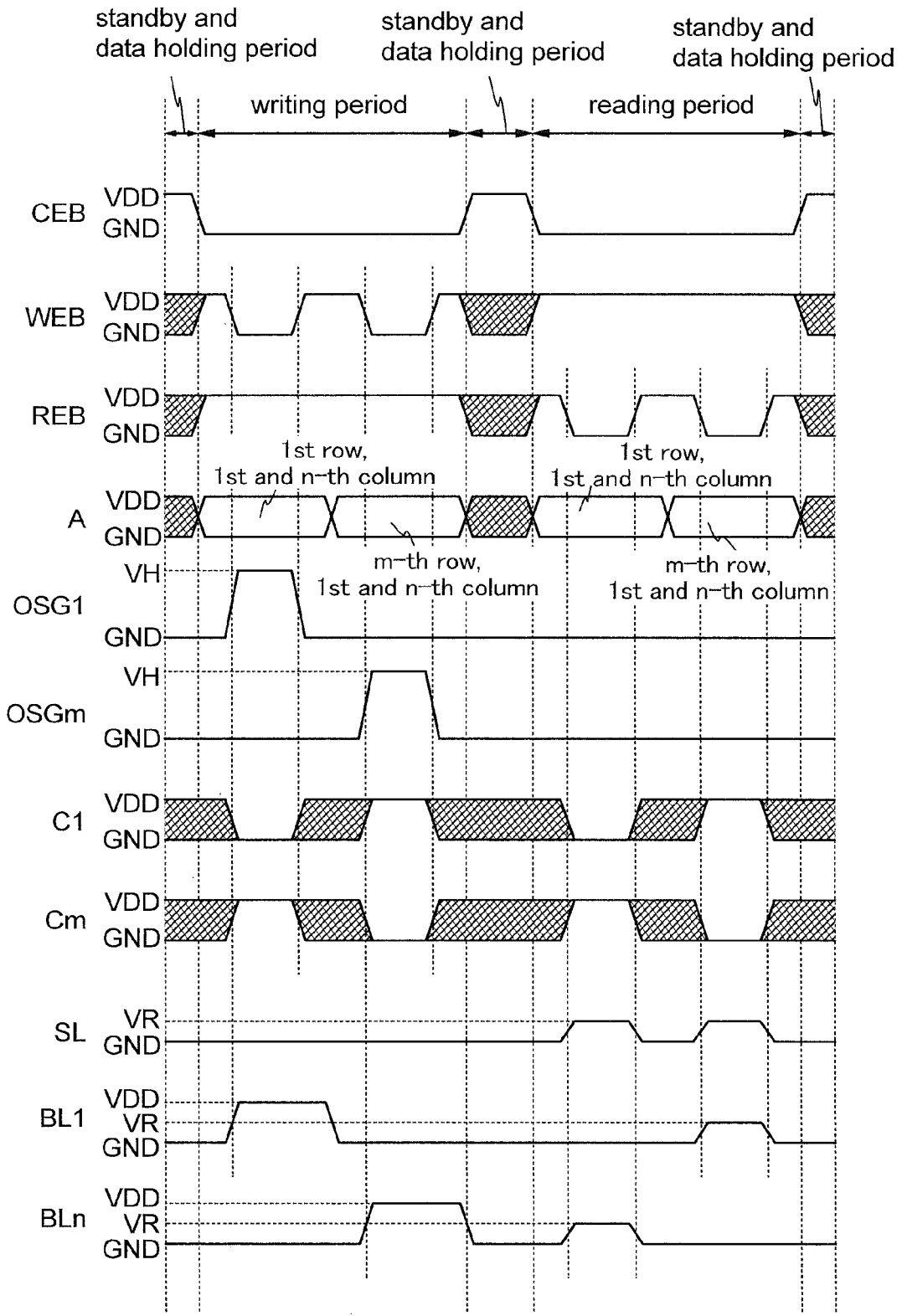
FIG. 4 is a timing chart.

Note that the slashes in the timing chart of FIG. 4 means that the corresponding line may have either a high potential or a low potential.

As described above, in the semiconductor device having the circuit configuration illustrated in FIG. 3, the area of the memory cell array can be reduced by sharing the source line SL with plural columns. Accordingly, the die size can be reduced. Moreover, the reduction in the die size allows cost reduction in manufacturing the semiconductor device or improvement in yield.

Further, in the semiconductor device illustrated in FIG. 3, memory cells in a non-selected row need to be turned off when data is read. In the semiconductor device described in this embodiment, p-channel transistors are used as the reading transistors. Thus, memory cells in a non-selected row can be turned off by setting the write-read word line C of the non-selected row to a high potential (e.g., a power supply potential). Accordingly, a power supply generating a negative potential does not need to be provided for the memory cell. As a result, power consumption can be reduced and the semiconductor device can be downsized.

Note that the operation method, the operation voltage, and the like relating to the semiconductor device of an embodiment of the disclosed invention are not limited to the above description and can be changed appropriately in accordance with an embodiment in which the operation of the semiconductor device is implemented.

The methods and structures described in this embodiment can be combined as appropriate with any of the methods and structures described in the other embodiments.

Embodiment 2

In this embodiment, a structure and a manufacturing method of a semiconductor device according to one embodiment of the disclosed invention will be described with reference to FIGS. 5A and 5B, FIGS. 6A to 6G, FIGS. 7A to 7E, FIGS. 8A to 8D, FIGS. 9A to 9D, and FIGS. 10A to 10C.

Cross-Sectional Structure and Planar Structure of Semiconductor Device

Figure 5A:
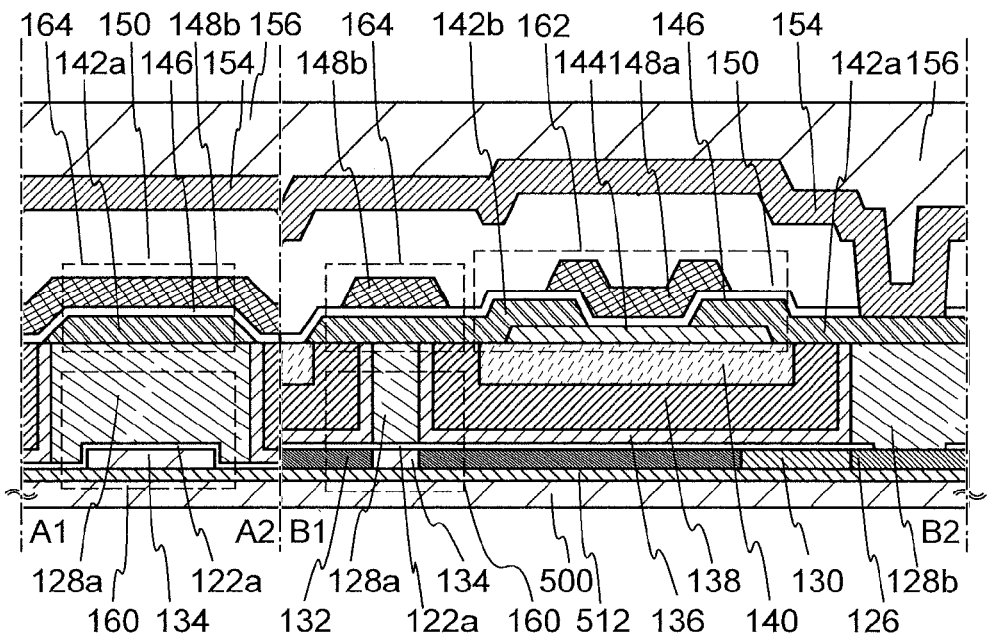
FIGS. 5A and 5B are a cross-sectional view and a plan view of a semiconductor device.
Figure 5B:
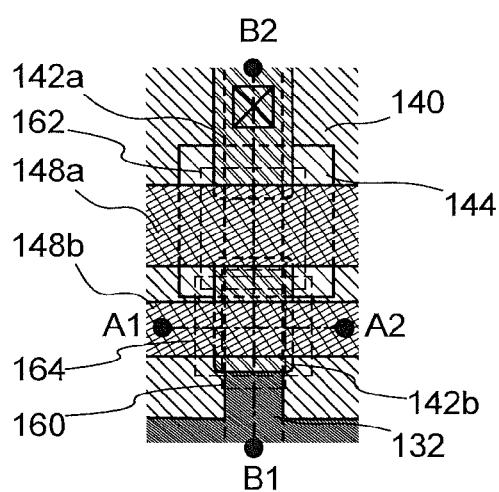

FIGS. 5A and 5B illustrate an example of a structure of a semiconductor device. FIG. 5A illustrates a cross section of the semiconductor device, and FIG. 5B illustrates a plan view of the semiconductor device. FIG. 5A corresponds to a cross section along line A1-A2 and line B1-B2 in FIG. 5B. The semiconductor device illustrated in FIGS. 5A and 5B includes a transistor 160 including a first semiconductor material in a lower portion, and a transistor 162 including a second semiconductor material in an upper portion. It is preferable that the first semiconductor material and the second semiconductor material be different from each other. For example, a semiconductor material other than an oxide semiconductor can be used as the first semiconductor material, and an oxide semiconductor can be used as the second semiconductor material. The semiconductor material other than an oxide semiconductor can be, for example, silicon, germanium, silicon germanium, silicon carbide, indium phosphide, gallium arsenide, or the like and is preferably single crystalline. An organic semiconductor material or the like may be used. A transistor including such a semiconductor material other than an oxide semiconductor can operate at high speed easily. On the other hand, a transistor including an oxide semiconductor can hold charge for a long time owing to its characteristics. The semiconductor device illustrated in FIGS. 5A and 5B can be used as a memory cell.

The technical feature of the invention disclosed herein lies in the use of a semiconductor material with which off-state current can be sufficiently reduced, such as an oxide semiconductor, in the transistor 162 in order to hold data. Therefore, it is not necessary to limit specific conditions, such as a material, a structure, or the like of the semiconductor device, to those given here.

The transistor 160 in FIGS. 5A and 5B includes a channel formation region 134 provided in a semiconductor layer over a semiconductor substrate 500, impurity regions 132 (also referred to as a source region and a drain region) with the channel formation region 134 provided therebetween, a gate insulating layer 122a provided over the channel formation region 134, and a gate electrode 128a provided over the gate insulating layer 122a so as to overlap with the channel formation region 134. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". In other words, in this specification, the term "source electrode" may include a source region.

Further, a conductive layer 128b is connected to an impurity region 126 provided in the semiconductor layer over the semiconductor substrate 500. Here, the conductive layer 128b functions as a source electrode or a drain electrode of the transistor 160. In addition, an impurity region 130 is provided between the impurity region 132 and the impurity region 126. Further, insulating layers 136, 138, and 140 are provided so as to cover the transistor 160. Note that for high integration, it is preferable that, as in FIGS. 5A and 5B, the transistor 160 does not have a sidewall insulating layer. On the other hand, when importance is put on the characteristics of the transistor 160, sidewall insulating layers may be provided on side surfaces of the gate electrode 128a, and the impurity region 132 may include regions with different impurity concentrations.

The transistor 162 in FIGS. 5A and 5B includes an oxide semiconductor layer 144 which is provided over the insulating layer 140 and the like; a source electrode (or a drain electrode) 142a and a drain electrode (or a source electrode) 142b which are electrically connected to the oxide semiconductor layer 144; a gate insulating layer 146 which covers the oxide semiconductor layer 144, the source electrode 142a, and the drain electrode 142b; and a gate electrode 148a which is provided over the gate insulating layer 146 so as to overlap with the oxide semiconductor layer 144.

Here, the oxide semiconductor layer 144 is preferably a purified oxide semiconductor layer by sufficiently removing impurities such as hydrogen or sufficiently supplying oxygen. Specifically, the hydrogen concentration of the oxide semiconductor layer 144 is $5\times10^{19}$ atoms/cm$^3$ or lower, preferably $5\times10^{18}$ atoms/cm$^3$ or lower, more preferably $5\times10^{17}$ atoms/cm$^3$ or lower. Note that the hydrogen concentration of the oxide semiconductor layer 144 is measured by secondary ion mass spectrometry (SIMS). In the oxide semiconductor layer 144 which is purified by sufficiently reducing the concentration of hydrogen therein and in which defect levels in an energy gap due to oxygen deficiency are reduced by supplying a sufficient amount of oxygen, the carrier concentration is lower than $1\times10^{12}$/cm$^3$, preferably lower than $1\times10^{11}$/cm$^3$, more preferably lower than $1.45\times10^{10}$/cm$^3$. For example, the off-state current (here, current per micrometer (μm) of channel width) at room temperature (25° C.) is lower than or equal to 100 zA (1 zA (zeptoampere) is $1\times10^{-21}$ A), preferably lower than or equal to 10 zA. In this manner, by using an oxide semiconductor which is made to be an i-type (intrinsic) oxide semiconductor or a substantially i-type oxide semiconductor, the transistor 162 which has extremely favorable off-state current characteristics can be obtained.

Note that although the transistor 162 in FIGS. 5A and 5B includes the oxide semiconductor layer 144 which is processed into an island shape in order to suppress leakage current between elements which is caused due to miniaturization, the oxide semiconductor layer 144 which is not processed into an island shape may be employed. In the case where the oxide semiconductor layer is not processed into an island shape, contamination of the oxide semiconductor layer 144 due to etching in the processing can be prevented.

A capacitor 164 in FIGS. 5A and 5B includes the drain electrode 142b, the gate insulating layer 146, and a conductive layer 148b. In other words, the drain electrode 142b functions as one electrode of the capacitor 164, and the conductive layer 148b functions as the other electrode of the capacitor 164. Such a structure allows sufficient capacitance to be secured. Further, insulation between the drain electrode 142b and the conductive layer 148b can be sufficiently secured by stacking the oxide semiconductor layer 144 and the gate insulating layer 146. The capacitor 164 may be omitted in the case where a capacitor is not needed.

In this embodiment, the transistor 162 and the capacitor 164 are provided so that at least parts of the transistor 162 and the capacitor 164 overlap with the transistor 160. Such a planar layout allows the degree of integration to be increased. For example, when F is used to express the minimum feature size, the area of a memory cell can be expressed as 15F$^2$ to 25F$^2$.

An insulating layer 150 is provided over the transistor 162 and the capacitor 164. A wiring 154 is provided in an opening formed in the gate insulating layer 146 and the insulating layer 150. The wiring 154 is a wiring which connects one memory cell to another memory cell and corresponds to the bit line BL in the circuit diagrams in FIGS. 2A and 2B. The wiring 154 is connected to the impurity region 126 through the source electrode 142a and the conductive layer 128b. The above structure allows a reduction in the number of wirings as compared to a structure in which the source region or the drain region in the transistor 160 and the source electrode 142a in the transistor 162 are connected to different wirings. Thus, the degree of integration of a semiconductor device can be increased.

Since the conductive layer 128b is provided, the position where the impurity region 126 and the source electrode 142a are connected to each other and the position where the source electrode 142a and the wiring 154 are connected to each other can overlap with each other. Such a planar layout makes it possible to suppress an increase in the element area due to contact regions. In other words, the degree of integration of the semiconductor device can be increased.

<Manufacturing Method of SOI Substrate>

Next, an example of a manufacturing method of an SOI substrate used for manufacturing the above semiconductor device will be described with reference to FIGS. 6A to 6G.

Figure 6A:
FIGS. 6A to 6G are cross-sectional views illustrating manufacturing steps of a semiconductor device.
Figure 6B:
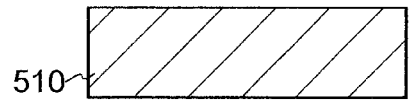

First, a semiconductor substrate 500 is prepared as a base substrate (see FIG. 6A). As the semiconductor substrate 500, a semiconductor substrate such as a single crystal silicon substrate or a single crystal germanium substrate can be used. As the semiconductor substrate, a solar grade silicon (SOG-Si) substrate or the like may be used. A polycrystalline semiconductor substrate may be used. Manufacturing cost in the case of using a SOG-Si substrate, a polycrystalline semiconductor substrate, or the like can be lower than that in the case of using a single crystal silicon substrate or the like.

Note that instead of the semiconductor substrate 500, a variety of glass substrates used in the electronics industry, such as substrates made of aluminosilicate glass, aluminoborosilicate glass, and barium borosilicate glass; a quartz substrate; a ceramic substrate; or a sapphire substrate can be used. Further, a ceramic substrate which contains silicon nitride and aluminum nitride as its main components and whose coefficient of thermal expansion is close to that of silicon may be used.

A surface of the semiconductor substrate 500 is preferably cleaned in advance. Specifically, the semiconductor substrate 500 is preferably subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), a mixed solution of hydrofluoric acid, hydrogen peroxide water, and pure water (FPM), or the like.

Next, a bond substrate is prepared. Here, a single crystal semiconductor substrate 510 is used as the bond substrate (see FIG. 6B). Note that although a substrate whose crystallinity is single crystal is used as the bond substrate here, the crystallinity of the bond substrate is not necessarily limited to single crystal.

For example, as the single crystal semiconductor substrate 510, a single crystal semiconductor substrate formed using an element of Group 14, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 510 is not limited to circular, and the single crystal semiconductor substrate 510 may be a substrate which has been processed into, for example, a rectangular shape or the like. Further, the single crystal semiconductor substrate 510 can be formed by a Czochralski (CZ) method or a Floating Zone (FZ) method.

Figure 6C:
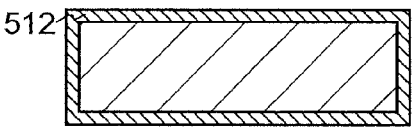

An oxide film 512 is formed on a surface of the single crystal semiconductor substrate 510 (see FIG. 6C). In view of removal of contamination, it is preferable that the surface of the single crystal semiconductor substrate 510 be cleaned with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before the formation of the oxide film 512. Dilute hydrofluoric acid and ozone water may be discharged alternately for cleaning.

The oxide film 512 can be formed with, for example, a single layer or a stacked layer of a silicon oxide film, a silicon oxynitride film, and the like. As a manufacturing method of the oxide film 512, a thermal oxidation method, a CVD method, a sputtering method, or the like can be used. In the case where the oxide film 512 is formed by a CVD method, a silicon oxide film is preferably formed using organosilane such as tetraethoxysilane (abbreviation: i) (chemical formula: $Si(OC_2H_5)_4$), so that favorable bonding can be achieved.

In this embodiment, the oxide film 512 (here, a $SiO_x$ film) is formed by performing thermal oxidation treatment on the single crystal semiconductor substrate 510. The thermal oxidation treatment is preferably performed in an oxidizing atmosphere to which a halogen is added.

For example, thermal oxidation treatment of the single crystal semiconductor substrate 510 is performed in an oxidizing atmosphere to which chlorine (Cl) is added, whereby the oxide film 512 can be formed through chlorine oxidation. In this case, the oxide film 512 is a film containing chlorine atoms. By such chlorine oxidation, heavy metal (e.g., Fe, Cr, Ni, or Mo) that is an extrinsic impurity is trapped and chloride of the metal is formed and then removed to the outside; thus, contamination of the single crystal semiconductor substrate 510 can be reduced.

Note that the halogen atoms contained in the oxide film 512 are not limited to chlorine atoms. A fluorine atom may be contained in the oxide film 512. As a method for fluorine oxidation of the surface of the single crystal semiconductor substrate 510, a method in which the single crystal semiconductor substrate 510 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Figure 6D:
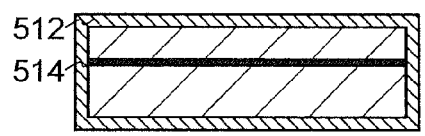
Figure 6E:
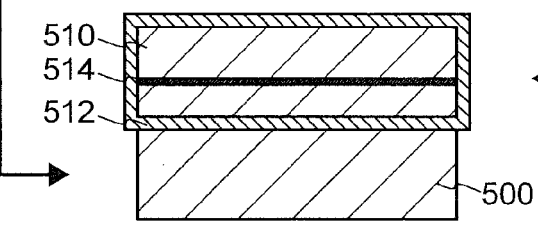

Next, ions are accelerated by an electric field and the single crystal semiconductor substrate 510 is irradiated with the ions, and the ions are added to the single crystal semiconductor substrate 510, whereby an embrittled region 514 where the crystal structure is damaged is formed in the single crystal semiconductor substrate 510 at a predetermined depth (see FIG. 6D).

The depth at which the embrittled region 514 is formed can be adjusted by the kinetic energy, mass, charge, or incidence angle of the ions, or the like. The embrittled region 514 is formed at approximately the same depth as the average penetration depth of the ions. Therefore, the thickness of the single crystal semiconductor layer to be separated from the single crystal semiconductor substrate 510 can be adjusted with the depth at which the ions are added. For example, the average penetration depth may be controlled such that the thickness of a single crystal semiconductor layer is approximately 10 nm to 500 nm, preferably, 50 nm to 200 nm.

The above ion irradiation treatment can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of ion species generated. In this apparatus, the object to be processed is irradiated with ion species of plasma without mass separation. In contrast, an ion implantation apparatus is a mass-separation apparatus. In the ion-implantation apparatus, mass separation of ion species of plasma is performed and the object to be processed is irradiated with ion species having predetermined masses.

In this embodiment, an example is described in which an ion doping apparatus is used to add hydrogen to the single crystal semiconductor substrate 510. A gas containing hydrogen is used as a source gas. As for ions used for the irradiation, the proportion of $H_3^+$ is preferably set high. Specifically, it is preferable that the proportion of $H_3^+$ be set 50% or higher (more preferably, 80% or higher) with respect to the total amount of $H^+$, $H_2^+$, and $H_3^+$. With a high proportion of $H_3^+$, the efficiency of ion irradiation can be improved.

Note that ions to be added are not limited to ions of hydrogen. Ions of helium or the like may be added. Further, ions to be added are not limited to one kind of ions, and plural kinds of ions may be added. For example, in the case of performing irradiation with hydrogen and helium concurrently using an ion-doping apparatus, the number of steps can be reduced as compared to the case of performing irradiation with hydrogen and helium in different steps, and surface roughness of a single crystal semiconductor layer to be formed later can be suppressed.

Note that heavy metal may also be added when the embrittled region 514 is formed with the ion doping apparatus; however, the ion irradiation is performed through the oxide film 512 containing halogen atoms, whereby contamination of the single crystal semiconductor substrate 510 due to the heavy metal can be prevented.

Then, the semiconductor substrate 500 and the single crystal semiconductor substrate 510 are disposed to face each other and are made to be closely attached to each other with the oxide film 512 therebetween. As a result, the semiconductor substrate 500 and the single crystal semiconductor substrate 510 are bonded to each other (see FIG. 6E). Note that an oxide film or a nitride film may be formed on the surface of the semiconductor substrate 500 to which the single crystal semiconductor substrate 510 is attached.

When bonding is performed, it is preferable that pressure greater than or equal to 0.001 N/cm² and less than or equal to 100 N/cm², e.g., a pressure greater than or equal to 1 N/cm² and less than or equal to 20 N/cm², be applied to one part of the semiconductor substrate 500 or one part of the single crystal semiconductor substrate 510. When the bonding surfaces are made close to each other and disposed in close contact with each other by applying a pressure, a bonding between the semiconductor substrate 500 and the oxide film 512 is generated at the part where the close contact is made, and from that part, the bonding spontaneously spreads to almost the entire area. This bonding is performed under the action of the Van der Waals force or hydrogen bonding and can be performed at room temperature.

Note that before the single crystal semiconductor substrate 510 and the semiconductor substrate 500 are bonded to each other, surfaces to be bonded to each other are preferably subjected to surface treatment. Surface treatment can improve the bonding strength at the interface between the single crystal semiconductor substrate 510 and the semiconductor substrate 500.

As the surface treatment, wet treatment, dry treatment, or a combination of wet treatment and dry treatment can be used. Alternatively, wet treatment may be used in combination with different wet treatment or dry treatment may be used in combination with different dry treatment.

Note that heat treatment for increasing the bonding strength may be performed after bonding. This heat treatment is performed at a temperature at which separation at the embrittled region 514 does not occur (for example, a temperature higher than or equal to room temperature and lower than 400° C.). Bonding of the semiconductor substrate 500 and the oxide film 512 may be performed while heating them at a temperature in this range. The heat treatment can be performed using a diffusion furnace, a heating furnace such as a resistance heating furnace, a rapid thermal annealing (RTA) apparatus, a microwave heating apparatus, or the like. The above temperature condition is merely an example, and an embodiment of the disclosed invention should not be construed as being limited to this example.

Figure 6F:
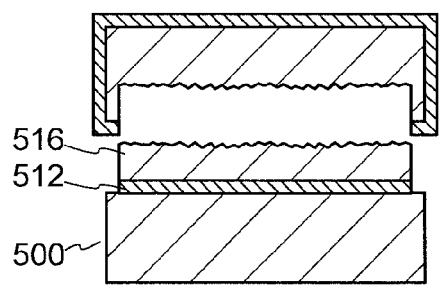

Next, heat treatment is performed for separation of the single crystal semiconductor substrate 510 at the embrittled region, whereby a single crystal semiconductor layer 516 is formed over the semiconductor substrate 500 with the oxide film 512 interposed therebetween (FIG. 6F).

Note that it is desirable that the temperature for heat treatment in the separation be as low as possible. This is because as the temperature in the separation is low, generation of roughness on the surface of the single crystal semiconductor layer 516 can be suppressed. Specifically, the temperature for the heat treatment in the separation may be higher than or equal to 300° C. and lower than or equal to 600° C. and the heat treatment is more effective when the temperature is higher than or equal to 400° C. and lower than or equal to 500° C.

Note that after the single crystal semiconductor substrate 510 is separated, the single crystal semiconductor layer 516 may be subjected to heat treatment at 500° C. or higher so that concentration of hydrogen remaining in the single crystal semiconductor layer 516 is reduced.

Figure 6G:
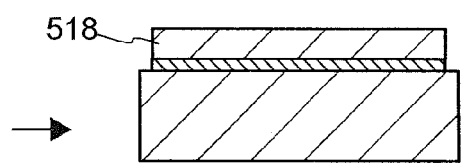

Next, the surface of the single crystal semiconductor layer 516 is irradiated with laser light, whereby a single crystal semiconductor layer 518 whose surface planarity is improved and in which defects is reduced are formed (see FIG. 6G). Note that instead of the laser light irradiation treatment, heat treatment may be performed.

Although the irradiation treatment with the laser light is performed immediately after the heat treatment for separation of the single crystal semiconductor layer 516 in this embodiment, one embodiment of the present invention is not construed as being limited to this. The laser light irradiation treatment may be performed after the heat treatment for splitting the single crystal semiconductor layer 516 and etching treatment for removing a region including many defects at the surface of the single crystal semiconductor layer 516 are performed in this order. Alternatively, the laser light irradiation treatment may be performed after the surface planarity of the single crystal semiconductor layer 516 is improved. Note that the etching treatment may be either wet etching or dry etching. Further, after the irradiation with laser light is performed as described above, a step of reducing the thickness of the single crystal semiconductor layer 516 may be performed. In order to reduce the thickness of the single crystal semiconductor layer 516, either or both of dry etching and wet etching may be employed.

Through the above steps, an SOI substrate including the single crystal semiconductor layer 518 with favorable characteristics can be obtained (see FIG. 6G).

Manufacturing Method of Semiconductor Device

Next, a manufacturing method of a semiconductor device including the above SOI substrate will be described with reference to FIGS. 7A to 7E, FIGS. 8A to 8D, FIGS. 9A to 9D, and FIGS. 10A to 10C.

Manufacturing Method of Transistor in Lower Portion

First, a manufacturing method of the transistor 160 in the lower portion will be described with reference to FIGS. 7A to 7E and FIGS. 8A to 8D. Note that FIGS. 7A to 7E and FIGS. 8A to 8D illustrate part of the SOI substrate formed by the method illustrated in FIGS. 6A to 6G, and are cross-sectional views illustrating the transistor in the lower portion illustrated in FIG. 5A.

Figure 7A:
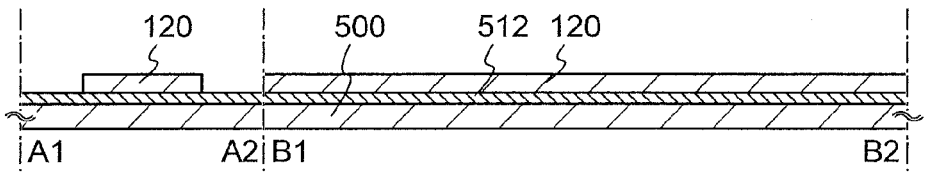
FIGS. 7A to 7E are cross-sectional views illustrating manufacturing steps of the semiconductor device.

First, the single crystal semiconductor layer 518 is patterned to have an island shape, so that a semiconductor layer 120 is formed (see FIG. 7A). Note that before or after this step, an impurity element imparting n-type conductivity or an impurity element imparting p-type conductivity may be added to the semiconductor layer in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Figure 7B:
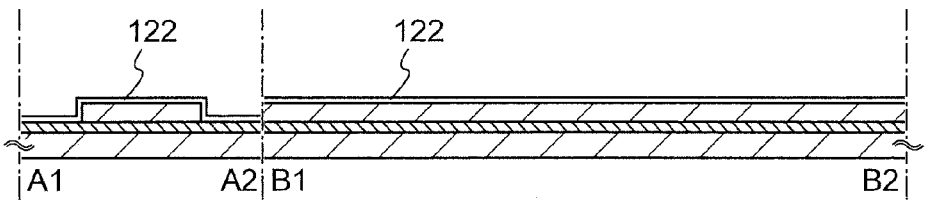

Next, an insulating layer 122 is formed so as to cover the semiconductor layer 120 (see FIG. 7B). The insulating layer 122 is to be a gate insulating layer later. For example, the insulating layer 122 can be formed by performing heat treatment (e.g., thermal oxidation treatment, thermal nitridation treatment, or the like) on a surface of the semiconductor layer 120. High-density plasma treatment may be employed instead of heat treatment. The high-density plasma treatment can be performed using, for example, a mixed gas of a rare gas such as He, Ar, Kr, or Xe and any of oxygen, nitrogen oxide, ammonia, nitrogen, or hydrogen. Needless to say, the insulating layer may be formed by a CVD method, a sputtering method, or the like. The insulating layer 122 preferably has a single-layer structure or a stacked structure including any of silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate to which nitrogen is added ($HfSi_xO_yN_z$(x>0, y>0, z>0)), hafnium aluminate to which nitrogen is added ($HfAl_xO_yN_z$ (x>0, y>0, z>0)), and the like. The thickness of the insulating layer 122 can be, for example, greater than or equal to 1 nm and less than or equal to 100 nm, preferably greater than or equal to 10 nm and less than or equal to 50 nm. In this embodiment, a single layer of an insulating layer containing silicon oxide is formed by a plasma CVD method.

Figure 7C:
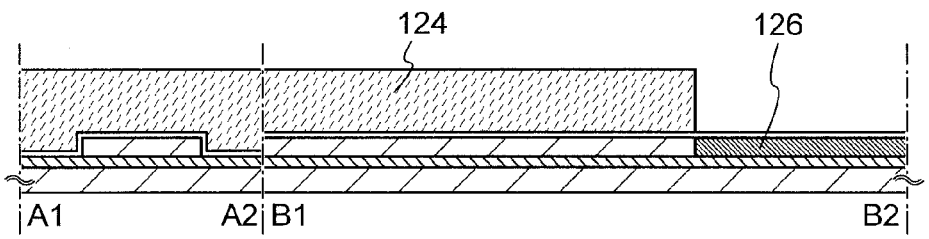

Next, a mask 124 is formed over the insulating layer 122 and an impurity element imparting one conductivity type is added to the semiconductor layer 120, so that the impurity region 126 is formed (see FIG. 7C). Note that here, the mask 124 is removed after the impurity element is added.

Figure 7D:
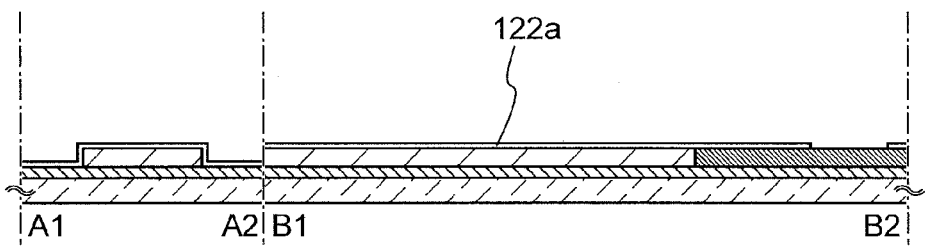

Next, a mask is formed over the insulating layer 122 and a region of the insulating layer 122 that overlaps with the impurity region 126 is partly removed, so that the gate insulating layer 122a is formed (see FIG. 7D). Part of the insulating layer 122 can be removed by etching such as wet etching or dry etching.

Figure 7E:
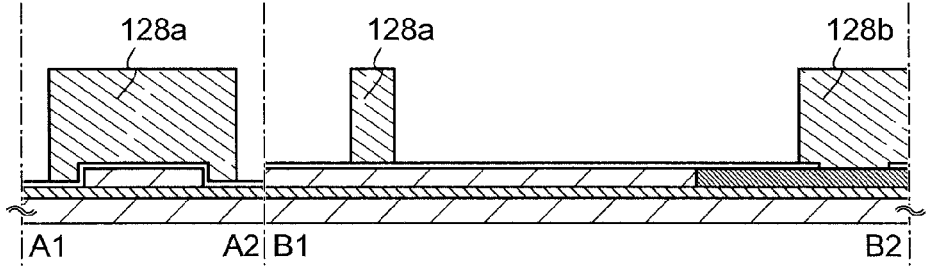

Next, a conductive layer for forming a gate electrode (including a wiring formed using the same layer as the gate electrode) is formed over the gate insulating layer 122a and is processed, so that the gate electrode 128a and the conductive layer 128b are formed (see FIG. 7E).

The conductive layer used for the gate electrode 128a and the conductive layer 128b can be formed using a metal material such as aluminum, copper, titanium, tantalum, or tungsten. The conductive layer may be formed using a semiconductor material such as polycrystalline silicon. There is no particular limitation on the method for forming the layer containing a conductive material, and a variety of film formation methods such as an evaporation method, a CVD method, a sputtering method, or a spin coating method can be employed. The conductive layer may be processed by etching using a resist mask.

Figure 8A:
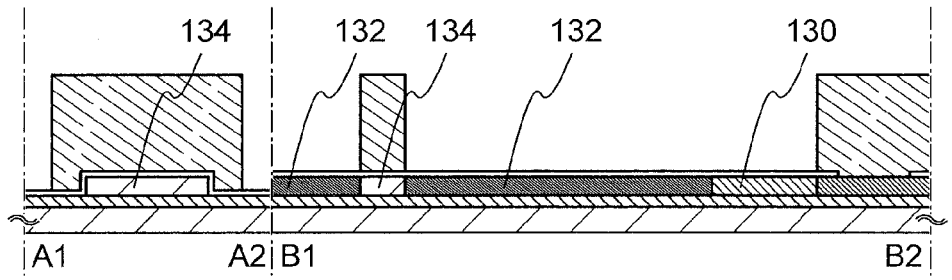
FIGS. 8A to 8D are cross-sectional views illustrating manufacturing steps of the semiconductor device.

Next, an impurity element imparting one conductivity type is added to the semiconductor layer with the use of the gate electrode 128a and the conductive layer 128b as masks, so that the channel formation region 134, the impurity region 132, and the impurity region 130 are formed (see FIG. 8A). Here, an impurity element such as boron (B) or aluminum (A) is added in order to form a p-channel transistor. Here, the concentration of the impurity element to be added can be set as appropriate. In addition, after the impurity element is added, heat treatment for activation is performed. Here, the concentration of the impurity element in the impurity region is increased in the following order: the impurity region 126, the impurity region 132, and the impurity region 130.

Figure 8B:
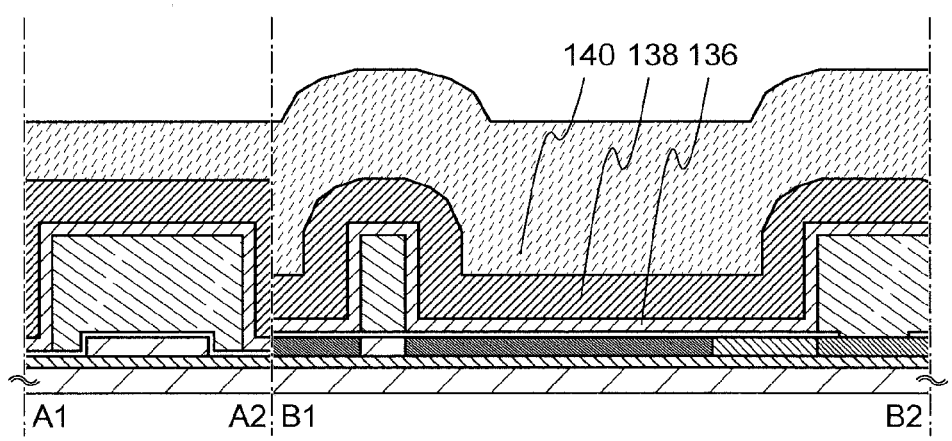

Next, the insulating layer 136, the insulating layer 138, and the insulating layer 140 are formed so as to cover the gate insulating layer 122a, the gate electrode 128a, and the conductive layer 128b (see FIG. 8B).

The insulating layer 136, the insulating layer 138, and the insulating layer 140 can be formed using a material including an inorganic insulating material such as silicon oxide, silicon oxynitride, silicon nitride oxide, silicon nitride, or aluminum oxide. The insulating layer 136, the insulating layer 138, and the insulating layer 140 are particularly preferably formed using a low dielectric constant (low-k) material, because capacitance due to overlapping electrodes or wirings can be sufficiently reduced. Note that the insulating layer 136, the insulating layer 138, and the insulating layer 140 may be porous insulating layers formed using any of these materials. Since the porous insulating layer has low dielectric constant as compared to a dense insulating layer, capacitance due to electrodes or wirings can be further reduced. Alternatively, the insulating layer 136, the insulating layer 138, and the insulating layer 140 can be formed using an organic insulating material such as polyimide or acrylic. In this embodiment, the case of using silicon oxynitride for the insulating layer 136, silicon nitride oxide for the insulating layer 138, and silicon oxide for the insulating layer 140 will be described. A stacked structure of the insulating layer 136, the insulating layer 138, and the insulating layer 140 is employed here; however, one embodiment of the disclosed invention is not limited to this. A single-layer structure, a stacked structure of two layers, or a stacked structure of four or more layers may also be used.

Figure 8C:
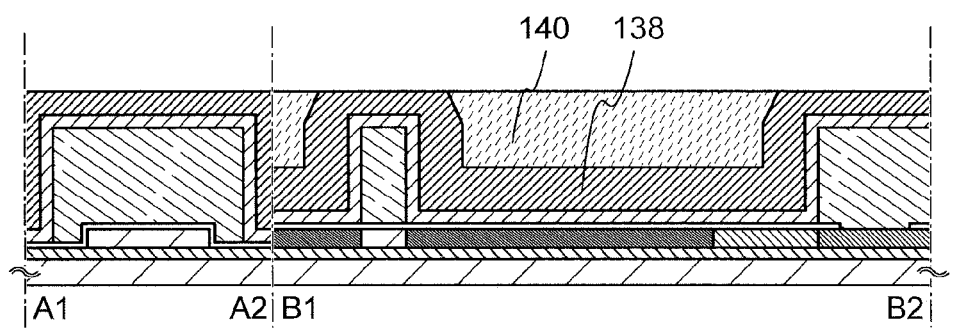

Next, the insulating layer 138 and the insulating layer 140 are subjected to chemical mechanical polishing (CMP) treatment, or etching treatment, so that the insulating layer 138 and the insulating layer 140 are flattened (see FIG. 8C). Here, CMP treatment is performed until the insulating layer 138 is partly exposed. In the case where silicon nitride oxide is used for the insulating layer 138 and silicon oxide is used for the insulating layer 140, the insulating layer 138 functions as an etching stopper.

Figure 8D:
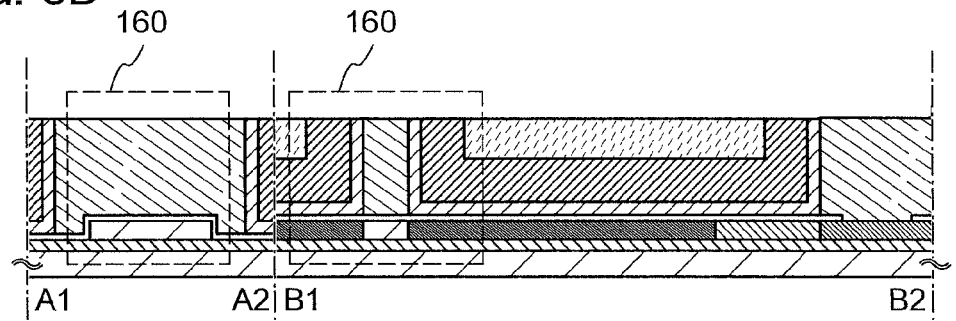

Next, the insulating layer 138 and the insulating layer 140 are subjected to CMP treatment, or etching treatment, so that upper surfaces of the gate electrode 128a and the conductive layer 128b are exposed (see FIG. 8D). Here, etching is performed until the gate electrode 128a and the conductive layer 128b are partly exposed. For the etching treatment, dry etching is preferably performed, but wet etching may be performed. In the step of partly exposing the gate electrode 128a and the conductive layer 128b, in order to improve the characteristics of the transistor 162 which is formed later, the surfaces of the insulating layer 136, the insulating layer 138, and the insulating layer 140 are preferably flattened as much as possible.

Through the above steps, the transistor 160 in the lower portion can be formed (see FIG. 8D).

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, so that a highly-integrated semiconductor device can be provided.

<Manufacturing Method of Transistor in Upper Portion>

Next, a method for manufacturing the transistor 162 in the upper portion will be described with reference to FIGS. 9A to 9D and FIGS. 10A and 10C.

Figure 9A:
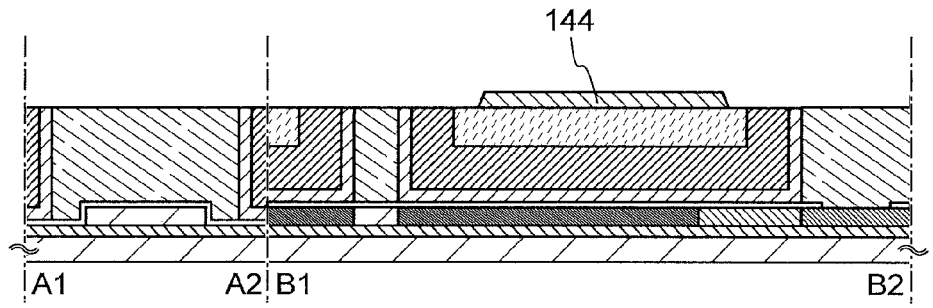
FIGS. 9A to 9D are cross-sectional views illustrating manufacturing steps of the semiconductor device.

First, an oxide semiconductor layer is formed over the gate electrode 128a, the conductive layer 128b, the insulating layer 136, the insulating layer 138, the insulating layer 140, and the like and is processed, so that the oxide semiconductor layer 144 is formed (see FIG. 9A). Note that an insulating layer functioning as a base may be formed over the insulating layer 136, the insulating layer 138, and the insulating layer 140 before the oxide semiconductor layer is formed. The insulating layer can be formed by a PVD method such as a sputtering method, or a CVD method such as a plasma CVD method.

An oxide semiconductor to be used preferably contains at least indium (In) or zinc (Zn). In particular, In and Zn are preferably contained. As a stabilizer for reducing change in electrical characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn—O-based oxide" means an oxide containing In, Ga, and Zn as its main component and there is no particular limitation on the ratio of In:Ga:Zn. Further, a metal element in addition to In, Ga, and Zn may be contained.

As a material used for the oxide semiconductor layer, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; or a single-component metal oxide such as an In—O-based material; a Sn—O-based material; a Zn—O-based material; or the like can be used. In addition, the above materials may contain $SiO_2$. Here, for example, an In—Ga—Zn—O-based material means an oxide film containing indium (In), gallium (Ga), and zinc (Zn), and there is no particular limitation on the composition ratio. Further, the In—Ga—Zn—O-based oxide semiconductor may contain an element other than In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, $R_a$ is obtained by three-dimension expansion of center line average roughness that is defined by JIS B0601 so as to be applied to a plane. The $R_a$ can be expressed as an "average value of the absolute values of deviations from a reference surface to a specific surface" and is defined by the formula below.

$$Ra = \frac{1}{S_0} \int_{x_2}^{x_1} \int_{y_2}^{y_1} |f(x, y) - Z_0| dx dy \quad \text{[FORMULA 1]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured with an atomic force microscope (AFM).

As the oxide semiconductor layer, a thin film including a material expressed as the chemical formula, $InMO_3(ZnO)_m$ (m>0) can be used. Here, M represents one or more metal elements selected from Ga, Al, Mn, and Co. For example, M may be Ga, Ga and Al, Ga and Mn, Ga and Co, or the like.

The thickness of the oxide semiconductor layer is preferably greater than or equal to 3 nm and less than or equal to 30 nm for the following reason: the transistor might possibly be normally on when the oxide semiconductor layer is too thick (e.g., a thickness of 50 nm or more).

The oxide semiconductor layer is preferably formed by a method in which impurities such as hydrogen, water, a hydroxyl group, or hydride do not enter the oxide semiconductor layer. For example, a sputtering method can be used.

In the case where an In—Zn-based oxide material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn-based oxide semiconductor which has an atomic ratio of In:Zn:O=X:Y:Z, the relation of Z>1.5X+Y is satisfied.

Further, an In—Sn—Zn oxide can be referred to as ITZO. An oxide target which has an atomic ratio of In, Sn, and Zn of 1:2:2, 2:1:3, 1:1:1, 20:45:35, or the like is used.

In this embodiment, the oxide semiconductor layer is formed by a sputtering method with the use of an In—Ga—Zn-based oxide target.

As the In—Ga—Zn-based oxide target, for example, an oxide target having a composition ratio of $In_2O_3$:$Ga_2O_3$:ZnO=1:1:1 [molar ratio] can be used. Note that it is not necessary to limit the material and the composition ratio of the target to the above. For example, an oxide target having a composition ratio of $In_2O_3$:$Ga_2O_3$:ZnO=1:1:2 [molar ratio] can be used.

The filling rate of the oxide target is greater than or equal to 90% and less than or equal to 100%, preferably greater than or equal to 95% and greater than or equal to 99.9%. With the use of the metal oxide target with a high filling rate, a dense oxide semiconductor layer can be formed.

The deposition atmosphere may be a rare gas (typically argon) atmosphere, an oxygen atmosphere, or a mixed atmosphere containing a rare gas and oxygen. An atmosphere of a high-purity gas from which an impurity such as hydrogen, water, a hydroxyl group, or hydride is removed is preferable, in order to prevent hydrogen, water, a hydroxyl group, hydride, or the like from entering the oxide semiconductor layer.

For example, the oxide semiconductor layer can be formed as described below.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas in which impurities such as hydrogen, water, a hydroxyl group, or hydride are sufficiently removed is introduced into the deposition chamber from which remaining moisture is being removed, and the oxide semiconductor layer is formed over the substrate with the use of the target. In order to remove moisture remaining in the deposition chamber, an entrapment vacuum pump such as a cryopump, an ion pump, or a titanium sublimation pump is desirably used. Further, an evacuation unit may be a turbo pump provided with a cold trap. In the deposition chamber which is evacuated with the cryopump, for example, impurities such as hydrogen, water, a hydroxyl group, or hydride (preferably, also a compound containing a carbon atom) or the like are removed, whereby the concentration of impurities such as hydrogen, water, a hydroxyl group, or hydride in the oxide semiconductor layer formed in the deposition chamber can be reduced.

In the case where the substrate temperature is low (for example, 100° C. or lower) during deposition, a substance including a hydrogen atom may enter the oxide semiconductor; thus, it is preferable that the substrate be heated at a temperature in the above range. When the oxide semiconductor layer is formed with the substrate heated at the temperature, the substrate temperature is increased, so that hydrogen bonds are cut by heat and are less likely to be taken into the oxide semiconductor layer. Therefore, the oxide semiconductor layer is formed with the substrate heated at the above temperature, whereby the concentration of impurities such as hydrogen, water, a hydroxyl group, or hydride in the oxide semiconductor layer can be sufficiently reduced. Moreover, damage due to sputtering can be reduced.

As an example of the film formation conditions, the following conditions can be employed: the distance between the substrate and the target is 60 mm, the pressure is 0.4 Pa, the direct-current (DC) power source is 0.5 kW, the substrate temperature is 400° C., and the film formation atmosphere is an oxygen atmosphere (the proportion of the oxygen flow rate is 100%). Note that a pulse direct current power source is preferable because powder substances (also referred to as particles or dust) generated in deposition can be reduced and the film thickness can be uniform.

Note that before the oxide semiconductor layer is formed by a sputtering method, powdery substances (also referred to as particles or dust) attached on a formation surface of the oxide semiconductor layer are preferably removed by reverse sputtering in which an argon gas is introduced and plasma is generated. The reverse sputtering refers to a method in which voltage is applied to a substrate side to generate plasma in the vicinity of the substrate to modify a surface. Note that a gas of nitrogen, helium, oxygen or the like may be used instead of argon.

The oxide semiconductor layer can be processed by being etched after a mask having a desired shape is formed over the oxide semiconductor layer. The mask may be formed by a method such as photolithography or an ink-jet method. The metal oxide film and the like are also processed while the oxide semiconductor film is processed. Note that the etching of the oxide semiconductor layer may be dry etching or wet etching. Needless to say, both of them may be employed in combination.

After that, heat treatment (first heat treatment) may be performed on the oxide semiconductor layer 144. The heat treatment further removes substances including hydrogen atoms in the oxide semiconductor layer 144. The heat treatment is performed under an inert gas atmosphere at greater than or equal to 250° C. and less than or equal to 700° C., preferably greater than or equal to 450° C. and less than or equal to 600° C. or less than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

The heat treatment can be performed in such a manner that, for example, an object to be heated is introduced into an electric furnace in which a resistance heating element or the like is used and heated, under a nitrogen atmosphere at 450° C. for an hour. The oxide semiconductor layer 144 is not exposed to the air during the heat treatment so that entry of water and hydrogen can be prevented.

The above heat treatment has an effect of removing hydrogen, water, and the like and can be referred to as dehydration treatment, dehydrogenation treatment, or the like. The heat treatment can be performed at the timing, for example, before the oxide semiconductor layer is processed into an island shape or after the gate insulating layer is formed. Such dehydration treatment or dehydrogenation treatment may be performed once or plural times.

Figure 9B:
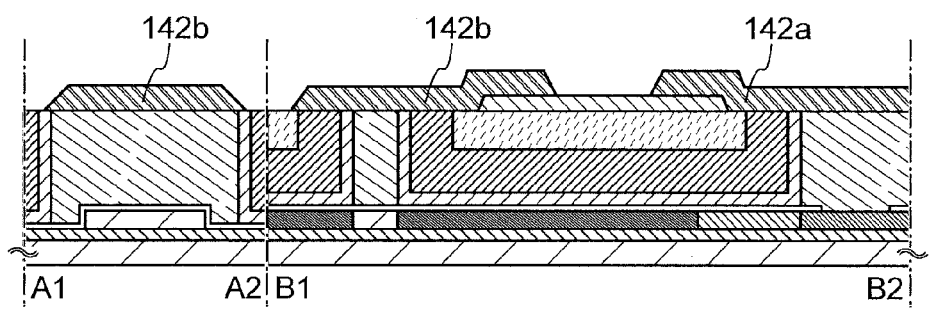

Next, a conductive layer for forming a source electrode and a drain electrode (including a wiring formed in the same layer as the source electrode and the drain electrode) is formed over the oxide semiconductor layer 144 and the like and is processed, so that the source and drain electrodes 142a and 142b are formed (see FIG. 9B).

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

The conductive layer may have a single-layer structure or a stacked structure including two or more layers. For example, the conductive layer may have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive layer having a single-layer structure of a titanium film or a titanium nitride film has an advantage in that it can be easily processed into the source electrode 142a and the drain electrode 142b having tapered shapes.

The conductive layer may be formed using a conductive metal oxide. As the conductive metal oxide, indium oxide ($In_2O_3$), tin oxide ($SnO_2$), zinc oxide (ZnO), an indium oxide-tin oxide compound ($In_2O_3$—$SnO_2$, which is abbreviated to ITO in some cases), an indium oxide-zinc oxide compound ($In_2O_3$—ZnO), or any of these metal oxide materials in which silicon or silicon oxide is contained can be used.

The conductive layer is preferably etched so that end portions of the source electrode 142a and the drain electrode 142b that are to be formed are tapered. Here, a taper angle is, for example, preferably greater than or equal to 30° and less than or equal to 60°. The etching is performed so that the end portions of the source electrode 142a and the drain electrode 142b are tapered, whereby coverage with the gate insulating layer 146 formed later can be improved and disconnection can be prevented.

The channel length (L) of the transistor in the upper portion is determined by a distance between lower edge portions of the source electrode 142a and the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Moreover, miniaturization allows low power consumption of a semiconductor device.

As an example which is different from that in FIG. 9B, oxide conductive layers can be provided as a source region and a drain region, between the oxide semiconductor layer 144 and the source and drain electrodes. A material of the oxide conductive layer preferably contains zinc oxide as a component and preferably does not contain indium oxide. For such an oxide conductive layer, zinc oxide, aluminum zinc oxide, aluminum zinc oxynitride, gallium zinc oxide, or the like can be used.

For example, the oxide conductive layers which serve as a source region and a drain region, the source electrode 142a, and the drain electrode 142b can be formed by forming an oxide conductive film over the oxide semiconductor layer 144, forming a conductive layer over the oxide conductive film, and processing the oxide conductive film and the conductive layer in one photolithography step.

Alternatively, a stacked layer of an oxide semiconductor film and an oxide conductive film is formed and the stacked layer is processed in one photolithography step, so that the island-shaped oxide semiconductor layer 144 and oxide conductive film may be formed. After the source electrode 142a and the drain electrode 142b are formed, the island-shaped oxide conductive film is etched using the source electrode 142a and the drain electrode 142b as masks, so that the oxide conductive layers which serve as a source region and a drain region can be formed.

Note that when etching treatment for processing the oxide conductive layer is performed, etching conditions (e.g., type of etching agent, the concentration of an etching agent, and etching time) are adjusted as appropriate in order to prevent excessive etching of the oxide semiconductor layer.

When the oxide conductive layer is provided between the oxide semiconductor layer and the source and drain electrode layers, the source region and the drain region can have lower resistance and the transistor can operate at high speed. Moreover, with the structure including the oxide semiconductor layer 144, the oxide conductive layer, and the drain electrode formed using a metal material, withstand voltage of the transistor can be further increased.

In order to improve frequency characteristics of a peripheral circuit (a driver circuit), it is effective to use the oxide conductive layer for a source region and a drain region for the reason below. The contact resistance can be reduced when a metal electrode (e.g., molybdenum or tungsten) and the oxide conductive layer are in contact, as compared to the case where a metal electrode (e.g., molybdenum or tungsten) and the oxide semiconductor layer are in contact. The contact resistance can be reduced by interposing an oxide conductive layer between the oxide semiconductor layer and source and drain electrodes; thus, frequency characteristics of a peripheral circuit (driver circuit) can be improved.

Figure 9C:
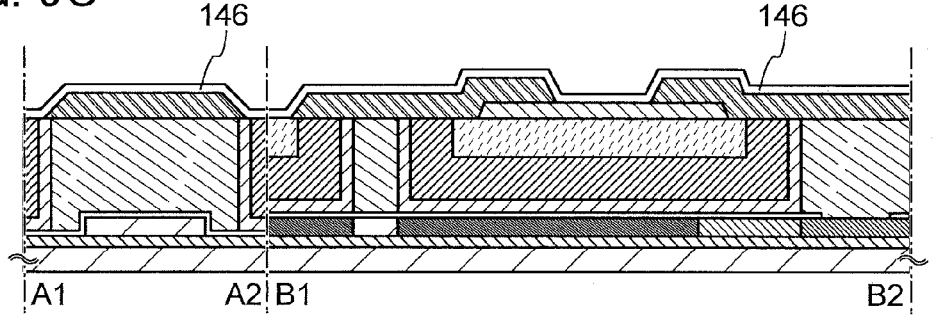

Next, the gate insulating layer 146 is formed so as to cover the source electrode 142a and the drain electrode 142b and to be in contact with part of the oxide semiconductor layer 144 (see FIG. 9C).

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, gallium oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like. The gate insulating layer 146 may have a single-layer structure or a stacked structure in which these elements are combined. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the gate insulating layer is thin as described above, a problem of gate leakage due to a tunnel effect or the like is caused. In order to solve the problem of gate leakage, a high dielectric constant (high-k) material such as hafnium oxide, tantalum oxide, yttrium oxide, hafnium silicate ($HfSi_xO_y$ (x>0, y>0)), hafnium silicate to which nitrogen is added ($HfSi_xO_yN_z$ (x>0, y>0, z>0)), or hafnium aluminate to which nitrogen is added ($HfAl_xO_yN_z$ (x>0, y>0, z>0)) is preferably used for the gate insulating layer 146. The use of a high-k material for the gate insulating layer 146 makes it possible to ensure electrical characteristics and to increase the thickness in order to suppress gate leakage. Note that a stacked structure of a film containing a high-k material and a film containing any one of silicon oxide, silicon nitride, silicon oxynitride, silicon nitride oxide, aluminum oxide, and the like may be employed.

Further, the insulating layer in contact with the oxide semiconductor layer 144 (in this embodiment, the gate insulating layer 146) may be an insulating material containing an element belonging to Group 13 and oxygen. Many oxide semiconductor materials contain an element belonging to Group 13, and an insulating material containing an element belonging to Group 13 is compatible with an oxide semiconductor. By using such an insulating material for the insulating layer in contact with the oxide semiconductor layer, an interface with the oxide semiconductor layer can be kept favorable.

An insulating material containing an element belonging to Group 13 refers to an insulating material containing one or more elements belonging to Group 13. As examples of the insulating material containing an element belonging to Group 13, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming a gate insulating layer in contact with an oxide semiconductor layer containing gallium, the use of a material containing gallium oxide for the gate insulating layer allows the characteristics of the interface between the oxide semiconductor layer and the gate insulating layer to be kept favorable. Moreover, when the oxide semiconductor layer and the insulating layer containing gallium oxide are provided in contact with each other, pileup of hydrogen at the interface between the oxide semiconductor layer and the insulating layer can be reduced. Note that a similar effect can be obtained in the case where an element belonging to the same group as a constituent element of the oxide semiconductor is used for the insulating layer. For example, it is effective to form an insulating layer with the use of a material containing an aluminum oxide. Aluminum oxide is impermeable to water. Therefore, it is preferable to use a material containing aluminum oxide in terms of preventing entry of water to the oxide semiconductor layer.

The insulating layer in contact with the oxide semiconductor layer 144 preferably contains oxygen in a proportion higher than that in the stoichiometric composition, by heat treatment under an oxygen atmosphere or oxygen doping. "Oxygen doping" refers to addition of oxygen into a bulk. Note that the term "bulk" is used in order to clarify that oxygen is added not only to a surface of a thin layer but also to the inside of the thin layer. In addition, "oxygen doping" includes "oxygen plasma doping" in which oxygen which is made to be plasma is added to a bulk. The oxygen doping may be performed using an ion implantation method or an ion doping method.

For example, in the case where the insulating layer in contact with the oxide semiconductor layer 144 is formed using gallium oxide, the composition of gallium oxide can be set to be $Ga_2O_x$ (x=3+α, 0<α<1) by heat treatment under an oxygen atmosphere or oxygen doping. Further, in the case where the insulating layer in contact with the oxide semiconductor layer 144 is formed of aluminum oxide, the composition of aluminum oxide can be set to be $Al_2O_x$ (x=3+a, 0<a<1) by heat treatment under an oxygen atmosphere or oxygen doping. Further, in the case where the insulating layer in contact with the oxide semiconductor layer 144 is formed of gallium aluminum oxide (or aluminum gallium oxide), the composition of gallium aluminum oxide (or aluminum gallium oxide) can be set to be $Ga_xAl_{2-x}O_{3+α}$ (0<x<2, 0<α<1) by heat treatment under an oxygen atmosphere or oxygen doping.

By oxygen doping or the like, an insulating layer which includes a region where the proportion of oxygen is higher than that in the stoichiometric composition can be formed. When the insulating layer having such a region is in contact with the oxide semiconductor layer, oxygen that exists excessively in the insulating layer is supplied to the oxide semiconductor layer, which allows oxygen deficiency in the oxide semiconductor layer or at an interface between the oxide semiconductor layer and the insulating layer to be reduced.

The insulating layer which includes a region where the proportion of oxygen is higher than that in the stoichiometric composition may be applied to the insulating layer which serves as a base film of the oxide semiconductor layer 144, instead of the gate insulating layer 146, or may be applied to both the gate insulating layer 146 and the base film.

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for an hour in a nitrogen atmosphere. The second heat treatment allows a reduction in variation in the electrical characteristics of the transistor. Further, in the case where the gate insulating layer 146 contains oxygen, oxygen is supplied to the oxide semiconductor layer 144 which has been subjected to the dehydration treatment or dehydrogenation treatment to compensate for oxygen deficiency in the oxide semiconductor layer 144, so that an i-type (intrinsic) or substantially i-type oxide semiconductor layer can be formed.

Note that although the second heat treatment is performed after the gate insulating layer 146 is formed in this embodiment, the timing of the second heat treatment is not limited thereto. The second heat treatment may be performed, for example, after the gate electrode is formed. Alternatively, the second heat treatment may be performed following the first heat treatment, the first heat treatment may double as the second heat treatment, or the second heat treatment may double as the first heat treatment.

Figure 9D:
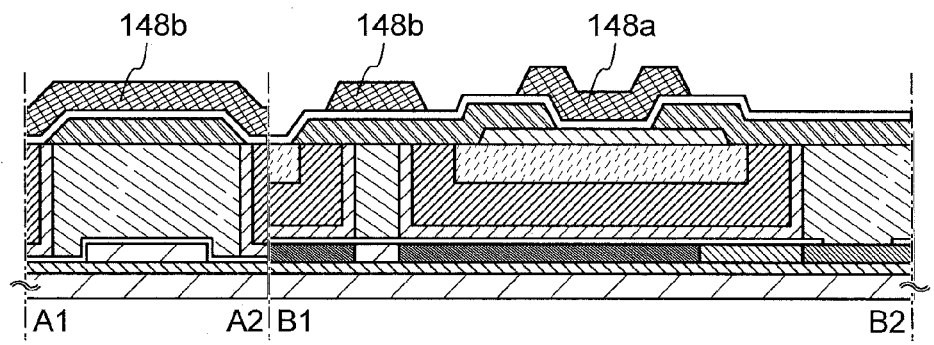

Next, a conductive layer for forming a gate electrode (including a wiring formed using the same layer as the gate electrode) is formed and is processed, so that the gate electrode 148a and the conductive layer 148b are formed (see FIG. 9D).

The gate electrode 148a and the conductive layer 148b can be formed using a metal material such as molybdenum, titanium, tantalum, tungsten, aluminum, copper, neodymium, or scandium, or an alloy material containing any of these materials as a main component. Note that the gate electrode 148a and the conductive layer 148b may have a single-layer structure or a stacked structure.

Figure 10A:
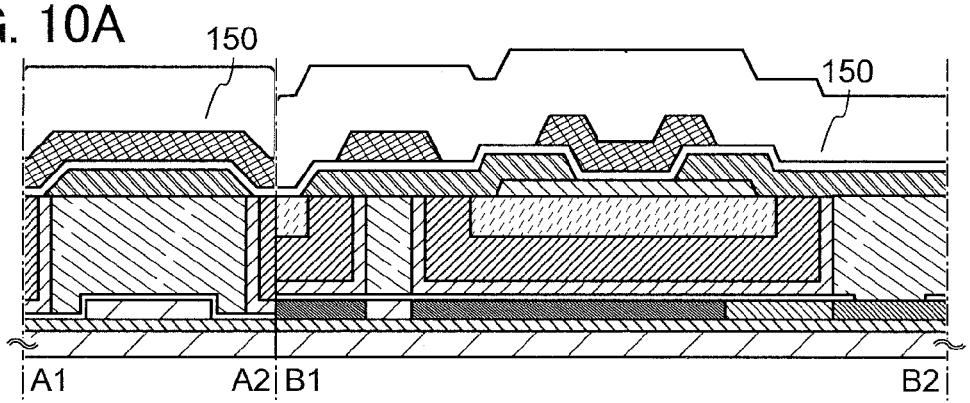
FIGS. 10A to 10C are cross-sectional views illustrating manufacturing steps of the semiconductor device.
Figure 10B:
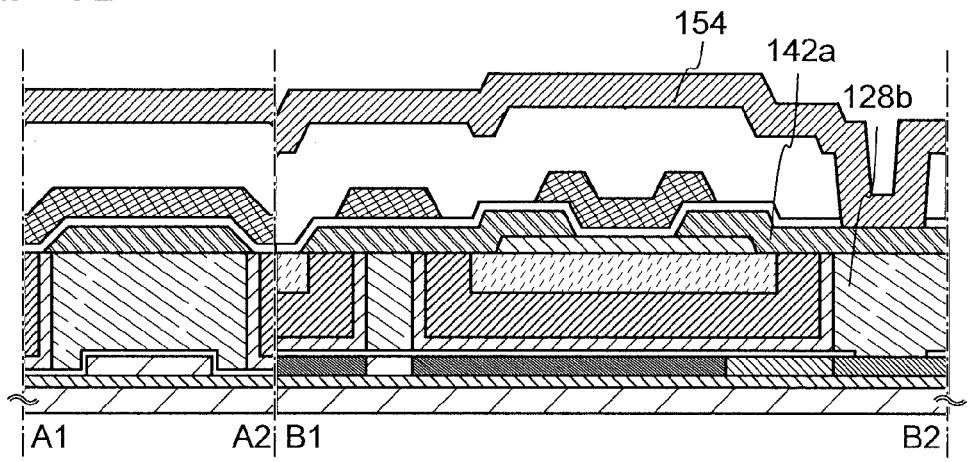

Next, an insulating layer 150 is formed over the gate insulating layer 146, the gate electrode 148a, and the conductive layer 148b (see FIG. 10A). The insulating layer 150 can be formed by a PVD method, a CVD method, or the like. The insulating layer 150 can be formed using a material containing an inorganic insulating material such as silicon oxide, silicon oxynitride, silicon nitride, hafnium oxide, gallium oxide, or aluminum oxide. Note that for the insulating layer 150, a material with a low dielectric constant may be preferably used or a structure with a low dielectric constant (e.g., a porous structure) is preferably employed for the following reason: the low dielectric constant of the insulating layer 150 allows capacitance generated between wirings, electrodes, or the like to be reduced and operation speed to be increased. Note that although the insulating layer 150 has a single-layer structure in this embodiment, an embodiment of the disclosed invention is not limited to this. The insulating layer 150 may have a stacked structure including two or more layers.

Next, an opening reaching the source electrode 142a is formed in the gate insulating layer 146 and the insulating layer 150. After that, a wiring 154 connected to the source electrode 142a is formed over the insulating layer 150 (see FIG. 10B). The opening is formed by selective etching using a mask or the like.

A conductive layer is formed by a PVD method or a CVD method and then is patterned, so that the wiring 154 is formed. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

Specifically, it is possible to employ a method, for example, in which a thin (about 5 nm) titanium film is formed in a region including the opening of the insulating layer 150 by a PVD method, and then, an aluminum film is formed so as to be embedded in the openings. Here, the titanium film formed by a PVD method has a function of reducing an oxide film (such as a natural oxide film) over which the titanium film is to be formed, and thereby lowering contact resistance with the lower electrode or the like (here, the source electrode 142a). In addition, hillock of aluminum film can be prevented. A copper film may be formed by a plating method after the formation of the barrier film of titanium, titanium nitride, or the like.

The opening formed in the insulating layer 150 is preferably formed in a region overlapping with the conductive layer 128b. By forming the opening in such a region, an increase in the element area due to a contact region of electrodes can be suppressed.

Here, the case where the position where the impurity region 126 and the source electrode 142a are connected and the position where the source electrode 142a and the wiring 154 are connected overlap with each other without using the conductive layer 128b will be described. In this case, an opening (also referred to as a contact in a lower portion) is formed in the insulating layer 136, the insulating layer 138, and the insulating layer 140 which are formed over the impurity region 126, and the source electrode 142a is formed in the contact in the lower portion; after that, an opening (also referred to as a contact in an upper portion) is formed in a region overlapping with the contact in the lower portion in the gate insulating layer 146 and the insulating layer 150, and then the wiring 154 is formed. When the contact in the upper portion is formed in the region overlapping with the contact in the lower portion, the source electrode 142a formed in the contact in the lower portion might be disconnected due to etching. When the contacts in the lower portion and in the upper portion are formed so as not to overlap with each other in order to avoid the disconnection, an increase in the element area is caused.

As described in this embodiment, with the use of the conductive layer 128b, the contact in the upper portion can be formed without disconnection of the source electrode 142a. Thus, the contacts in the lower portion and in the upper portion can be formed so as to overlap with each other, so that the increase in the element area due to the contact regions can be suppressed. In other words, the degree of integration of the semiconductor device can be increased.

Figure 10C:
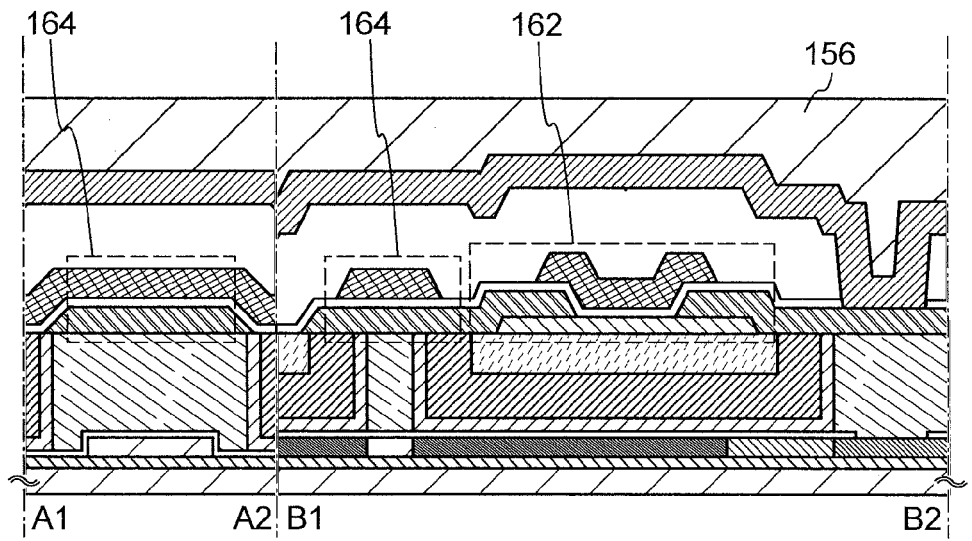

Next, an insulating layer 156 is formed so as to cover the wiring 154 (see FIG. 10C).

Through the above steps, the transistor 162 and the capacitor 164 including the purified oxide semiconductor layer 144 are completed (see FIG. 10C).

Since the oxide semiconductor layer 144 is purified in the transistor 162 described in this embodiment, the hydrogen concentration is $5 \times 10^{19}$ atoms/cm$^3$ or lower, preferably $5 \times 10^{18}$ atoms/cm$^3$ or lower, more preferably $5 \times 10^{17}$ atoms/ cm³ or lower. In addition, the value of the carrier concentration of the oxide semiconductor layer 144 is sufficiently low (e.g., lower than $1 \times 10^{12}/cm^3$, preferably lower than $1.45 \times 10^{10}/cm^3$) in comparison with that of a general silicon wafer (approximately $1 \times 10^{14}/cm^3$). Accordingly, the off-state current is also sufficiently small. For example, the off-state current (here, current per unit channel width (1 μm)) at room temperature (25° C.) is 100 zA (1 zA (zeptoampere) is $1 \times 10^{-21}$ A) or less, preferably 10 zA or less.

In this manner, by using the purified intrinsic oxide semiconductor layer 144, the off-state current of the transistor can be sufficiently reduced easily. In addition, by using such a transistor, a semiconductor device in which stored data can be held for an extremely long time can be obtained.

Further, in the semiconductor device described in this embodiment, a wiring can be shared; thus, a semiconductor device with sufficiently increased degree of integration can be achieved.

The methods and structures described in this embodiment can be combined as appropriate with any of the methods and structures described in the other embodiments.

Embodiment 3

In this embodiment, the case where the semiconductor device described in the above embodiments is applied to electronic devices will be described with reference to FIGS. 11A to 11F. In this embodiment, examples of the electronic device to which the semiconductor device described in any of the above embodiments is applied include a computer, a mobile phone (also referred to as a cellular phone or a mobile phone device), a personal digital assistant (including a portable game machine, an audio reproducing device, and the like), a camera such as a digital camera or a digital video camera, an electronic paper, and a television device (also referred to as a television or a television receiver).

Figure 11A:
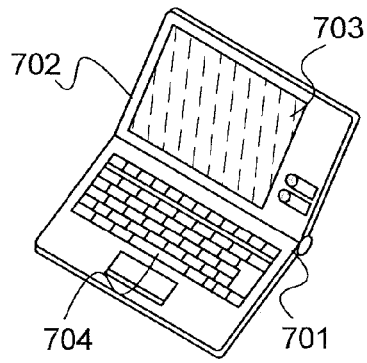
FIGS. 11A to 11F are views each illustrating an electronic device including a semiconductor device.

FIG. 11A illustrates a laptop personal computer, which includes a housing 701, a housing 702, a display portion 703, a keyboard 704, and the like. The semiconductor device described in any of the above embodiments is provided in at least one of the housing 701 and the housing 702. Therefore, a laptop personal computer in which writing and reading of data are performed at high speed, data is stored for a long time, and power consumption is sufficiently reduced can be realized.

Figure 11B:
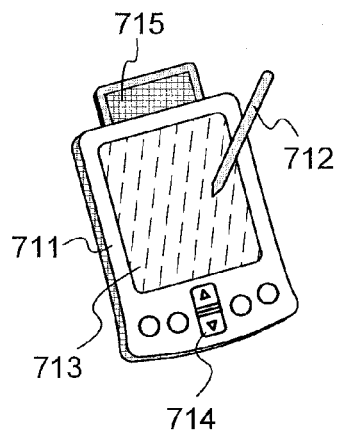

FIG. 11B illustrates a personal digital assistant (PDA). A main body 711 is provided with a display portion 713, an external interface 715, operation buttons 714, and the like. Further, a stylus 712 and the like for operation of the personal digital assistant are provided. In the main body 711, the semiconductor device described in any of the above embodiments is provided. Therefore, a personal digital assistant in which writing and reading of data are performed at high speed, data is stored for a long time, and power consumption is sufficiently reduced can be realized.

Figure 11C:
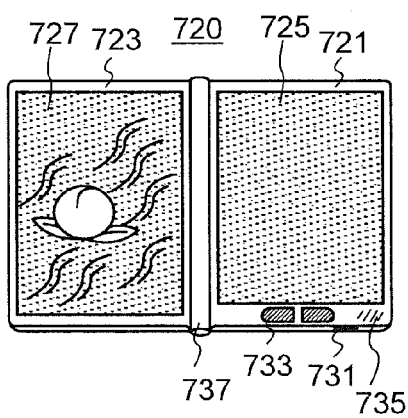

FIG. 11C illustrates an e-book reader 720 incorporating an electronic paper, which includes a housing 721 and a housing 723. The housing 721 and the housing 723 are provided with a display portion 725 and a display portion 727, respectively. The housing 721 and the housing 723 are connected by a hinge portion 737 and can be opened or closed with the hinge portion 737. The housing 721 is provided with a power supply 731, an operation key 733, a speaker 735, and the like. At least one of the housing 721 and the housing 723 is provided with the semiconductor device described in any of the above embodiments. Therefore, an e-book reader in which writing and reading of data are performed at high speed, data is stored for a long time, and power consumption is sufficiently reduced can be realized.

Figure 11D:
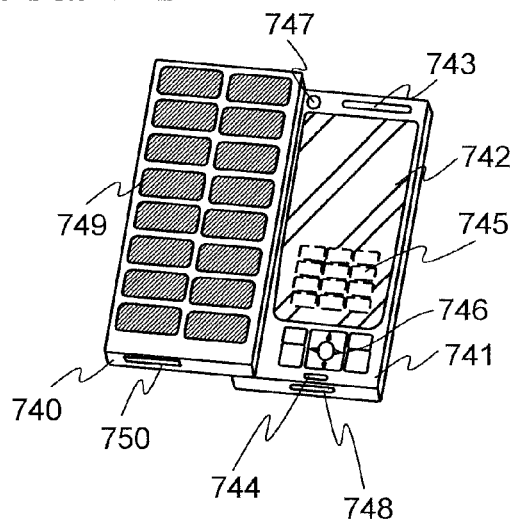

FIG. 11D illustrates a mobile phone, which includes a housing 740 and a housing 741. Moreover, the housing 740 and the housing 741 in a state where they are developed as illustrated in FIG. 11D can be slid so that one is lapped over the other. Therefore, the size of the mobile phone can be reduced, which makes the mobile phone suitable for being carried around. The housing 741 includes a display panel 742, a speaker 743, a microphone 744, an operation key 745, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. At least one of the housing 740 and the housing 741 is provided with the semiconductor device described in any of the above embodiments. Therefore, a mobile phone in which writing and reading of data are performed at high speed, data is stored for a long time, and power consumption is sufficiently reduced can be realized.

Figure 11E:
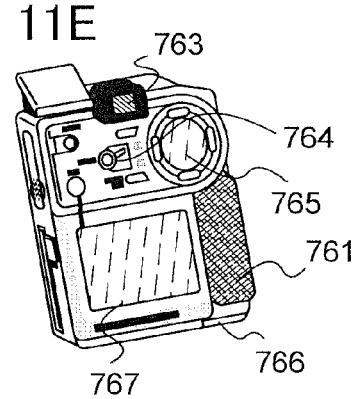

FIG. 11E illustrates a digital camera, which includes a main body 761, a display portion 767, an eyepiece 763, an operation switch 764, a display portion 765, a battery 766, and the like. In the main body 761, the semiconductor device described in any of the above embodiments is provided. Therefore, a digital camera in which writing and reading of data are performed at high speed, data is stored for a long time, and power consumption is sufficiently reduced can be realized.

Figure 11F:
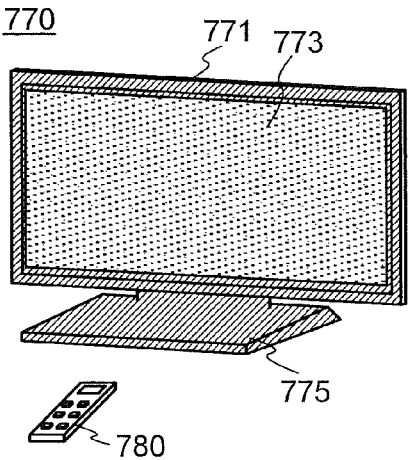

FIG. 11F illustrates a television device 770, which includes a housing 771, a display portion 773, a stand 775, and the like. The television device 770 can be operated with an operation switch of the housing 771 or a remote controller 780. The semiconductor device described in any of the above embodiments is mounted in the housing 771 and the remote controller 780. Therefore, a television device in which writing and reading of data are performed at high speed, data is stored for a long time, and power consumption is sufficiently reduced can be realized.

As described above, the electronic devices described in this embodiment each include the semiconductor device according to any of the above embodiments. Therefore, electronic devices with low power consumption can be realized.

Embodiment 4

In this embodiment, the transistor including an oxide semiconductor as a semiconductor material, which has been described in Embodiments 1 to 3, will be described in detail. Specifically, as the oxide semiconductor, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC oxide is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 12A to 12E, FIGS. 13A to 13C, and FIGS. 14A to 14C. In FIGS. 12A to 12E, FIGS. 13A to 13C, and FIGS. 14A to 14C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Figure 12A:
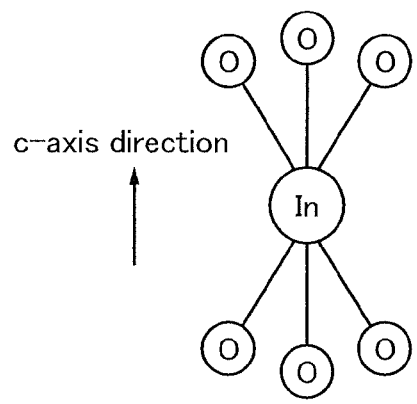
FIGS. 12A to 12E are views each illustrating a crystal structure of an oxide material.

FIG. 12A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 12A is actually an octahedral structure, but is illustrated as a planar structure for simplicity. Note that three tetracoordinate O atoms exist in each of an upper half and a lower half in FIG. 12A. In the small group illustrated in FIG. 12A, electric charge is 0.

Figure 12D:
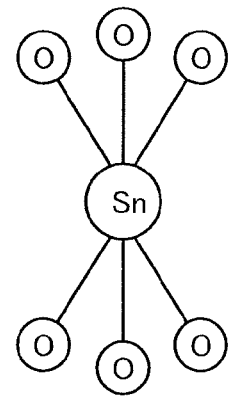
Figure 12B:
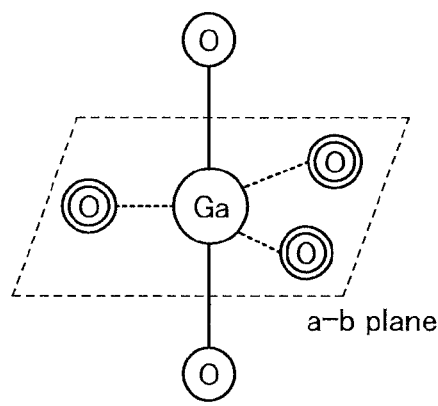

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 12B. An In atom can also have the structure illustrated in FIG. 12B because an In atom can have five ligands. In the small group illustrated in FIG. 12B, electric charge is 0.

Figure 12E:
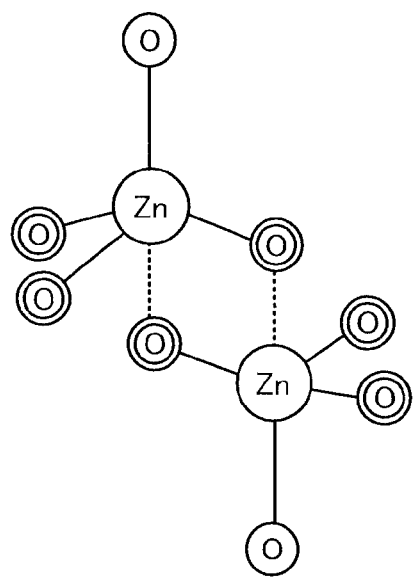
Figure 12C:
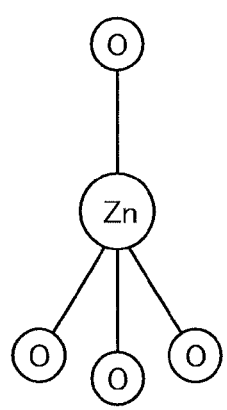

FIG. 12C illustrates a structure including one tetracoordinate Zn atom and four tetracoordinate O atoms proximate to the Zn atom. In FIG. 12C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 12C. In the small group illustrated in FIG. 12C, electric charge is 0.

FIG. 12D illustrates a structure including one hexacoordinate Sn atom and six tetracoordinate O atoms proximate to the Sn atom. In FIG. 12D, three tetracoordinate O atoms exist in each of an upper half and a lower half. In the small group illustrated in FIG. 12D, electric charge is +1.

FIG. 12E illustrates a small group including two Zn atoms. In FIG. 12E, one tetracoordinate O atom exists in each of an upper half and a lower half. In the small group illustrated in FIG. 12E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 12A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 13A illustrates a model of a medium group included in a layered structure of an In—Sn—Zn—O-based material. FIG. 13B illustrates a large group including three medium groups. Note that FIG. 13C illustrates an atomic arrangement in the case where the layered structure in FIG. 13B is observed from the c-axis direction.

In FIG. 13A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom is denoted by circled 3. Similarly, in FIG. 13A, one tetracoordinate O atom existing in each of an upper half and a lower half with respect to an In atom is denoted by circled 1. FIG. 13A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 13A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 12E can be given. For example, with one small group including two Zn atoms, electric charge of one small group including a Sn atom can be cancelled, so that the total electric charge of the layered structure can be 0.

When the large group illustrated in FIG. 13B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn—based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn—based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 14A:
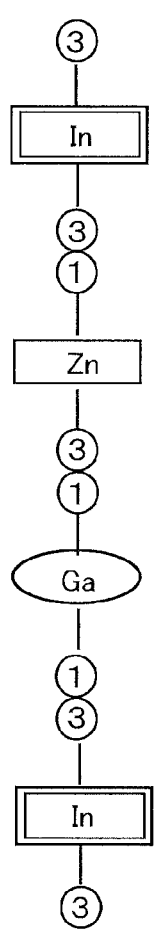
FIGS. 14A to 14C are views illustrating a crystal structure of an oxide material.

As an example, FIG. 14A illustrates a model of a medium group included in a layered structure of an In—Ga—Zn—O-based material.

In the medium group included in the layered structure of the In—Ga—Zn—O-based material in FIG. 14A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

Figure 14B:
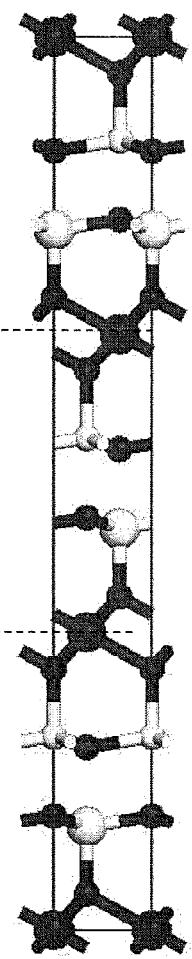
Figure 14C:
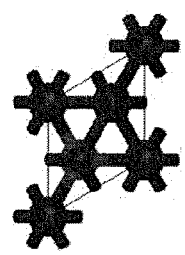

FIG. 14B illustrates a large group including three medium groups. Note that FIG. 14C illustrates an atomic arrangement in the case where the layered structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 14A but also a medium group in which the arrangement of the In atom, the Ga atom, and the Zn atom is different from that in FIG. 14A.

Embodiment 5

In this embodiment, mobility of the transistor including an oxide semiconductor for a channel formation region, which has been described in Embodiments 1 to 4 will be described.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \qquad \text{[Formula 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[Formula 3]}$$

Here, e represents the elementary charge, N represents the average defect density per unit area in a channel formation region, $\in$ represents the permittivity of the semiconductor, n represents the number of carriers per unit area in the channel formation region, $C_{ox}$ represents the capacitance per unit area, $V_g$ represents the gate voltage, and t represents the thickness of the channel formation region. In the case where the thickness of the semiconductor layer is less than or equal to 30 nm, the thickness of the channel formation region may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \quad \text{[Formula 4]}$$

Here, L represents the channel length and W represents the channel width, and L and W are each 10 µm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W \mu V_d C_{ox}}{L}\right) - \frac{E}{kT}$$
$$= \ln\left(\frac{W \mu V_d C_{ox}}{L}\right) - \frac{e^3 N^2 t}{8kT \varepsilon C_{ox} V_g} \quad \text{[Formula 5]}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}$/cm$^2$.

On the basis of the defect density obtained in this manner, or the like, $\mu_0$ can be calculated to be 120 cm$^2$/Vs from Formula 2 and Formula 3. The measured mobility of an In—Sn—Zn oxide including a defect is approximately 40 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel formation region and a gate insulating layer affects the transport property of the transistor. In other words, the mobility $\mu_1$ at a position that is distance x away from the interface between the channel formation region and the gate insulating layer can be expressed as the following formula.

$$\frac{1}{\mu_1} = \frac{1}{\mu_0} + \frac{D}{B}\exp\left(-\frac{x}{l}\right) \quad \text{[Formula 6]}$$

Here, D represents the electric field in the gate direction, and B and l are constants. B and l can be obtained from actual measurement results; according to the above measurement results, B is $4.75\times10^7$ cm/s and l is 10 nm (the depth to which the influence of interface scattering reaches). When D is increased (i.e., when the gate voltage is increased), the second term of Formula 6 is increased and accordingly the mobility $\mu_1$ is decreased.

Figure 15:
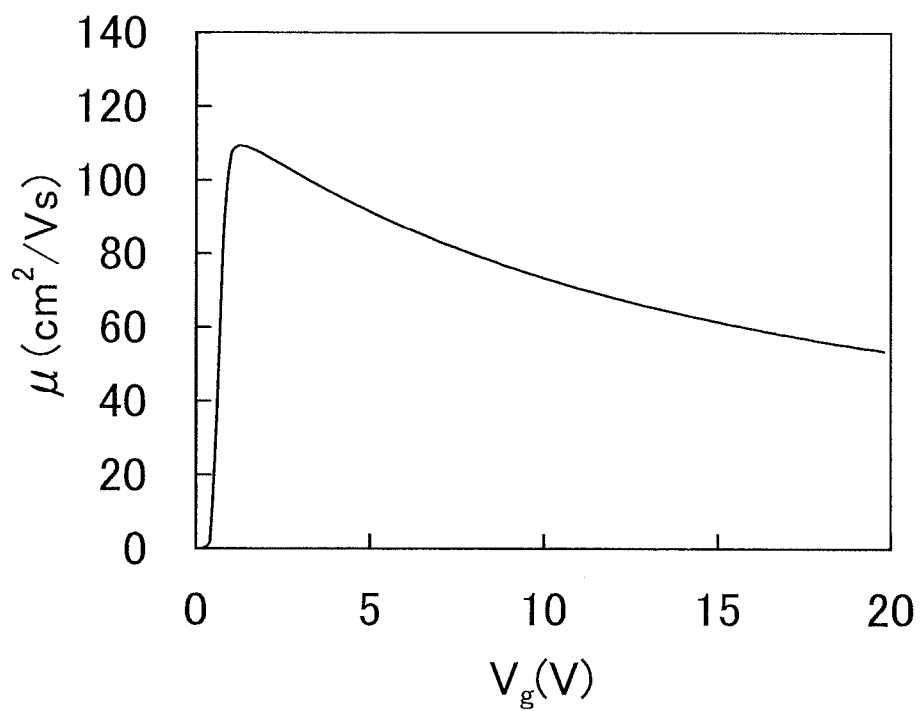
FIG. 15 is a graph showing gate voltage dependence of mobility, which is obtained by calculation.

Calculation results of the mobility $\mu_2$ of a transistor whose channel formation region includes an ideal oxide semiconductor without a defect inside the semiconductor are shown in FIG. 15. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate electrode, a source electrode, and a drain electrode were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 µm, and the drain voltage $V_d$ was assumed to be 0.1 V.

As shown in FIG. 15, the mobility has a peak of more than 100 cm$^2$/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 16A to 16C, FIGS. 17A to 17C, and FIGS. 18A to 18C. FIGS. 19A and 19B illustrate cross-sectional structures of the transistors used for the calculation. The transistors illustrated in FIGS. 19A and 19B each include a semiconductor region 103a and a semiconductor region 103c which have n$^+$-type conductivity in an oxide semiconductor layer. The resistivities of the semiconductor region 103a and the semiconductor region 103c are $2\times10^{-3}$ Ωcm.

The transistor illustrated in FIG. 19A is formed over a base insulating film 101 and an embedded insulator 102 which is embedded in the base insulating film 101 and formed of aluminum oxide. The transistor includes the semiconductor region 103a, the semiconductor region 103c, an intrinsic semiconductor region 103b serving as a channel formation region therebetween, and a gate electrode 105. The width of the gate electrode 105 is 33 nm.

A gate insulating layer 104 is formed between the gate electrode 105 and the semiconductor region 103b. In addition, a sidewall insulator 106a and a sidewall insulator 106b are formed on both side surfaces of the gate electrode 105, and an insulator 107 is formed over the gate electrode 105 so as to prevent a short circuit between the gate electrode 105 and another wiring. The sidewall insulator has a width of 5 nm. A source electrode 108a and a drain electrode 108b are provided in contact with the semiconductor region 103a and the semiconductor region 103c, respectively. Note that the channel width of this transistor is 40 nm.

The transistor of FIG. 19B is the same as the transistor of FIG. 19A in that it is formed over the base insulating film 101 and the embedded insulator 102 formed of aluminum oxide and that it includes the semiconductor region 103a, the semiconductor region 103c, the intrinsic semiconductor region 103b provided therebetween, the gate electrode 105 having a width of 33 nm, the gate insulating layer 104, the sidewall insulator 106a, the sidewall insulator 106b, the insulator 107, the source electrode 108a, and the drain electrode 108b.

The transistor illustrated in FIG. 19A is different from the transistor illustrated in FIG. 19B in the conductivity type of semiconductor regions under the sidewall insulator 106a and the sidewall insulator 106b. In the transistor illustrated in FIG. 19A, the semiconductor regions under the sidewall insulator 106a and the sidewall insulator 106b are part of the semiconductor region 103a having n$^+$-type conductivity and part of the semiconductor region 103c having n+-type conductivity, whereas in the transistor illustrated in FIG. 19B, the semiconductor regions under the sidewall insulator 106a and the sidewall insulator 106b are part of the intrinsic semiconductor region 103b. In other words, in the semiconductor layer of FIG. 19B, a region having a width of $L_{off}$ in which the semiconductor region 103a (the semiconductor region 103c) and the gate electrode 105 do not overlap is provided. This region is called an offset region, and the width $L_{off}$ is called an offset length. As is seen from the drawing, the offset length is equal to the width of the sidewall insulator 106a (the sidewall insulator 106b).

Figure 16A:
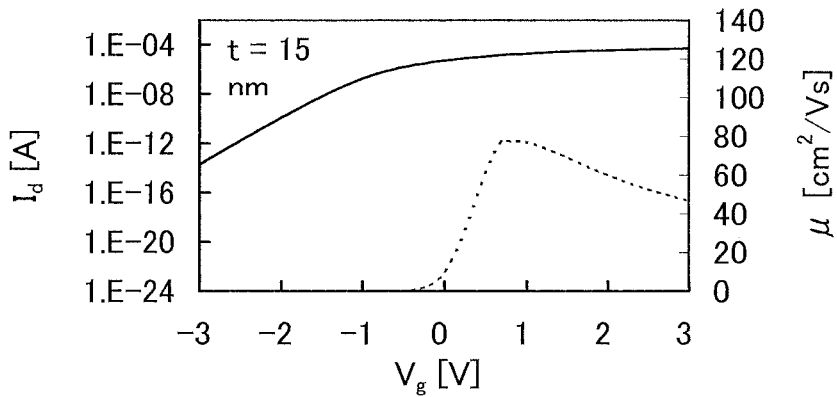
FIGS. 16A to 16C are graphs showing gate voltage dependence of drain current and mobility, which is obtained by calculation.
Figure 16B:
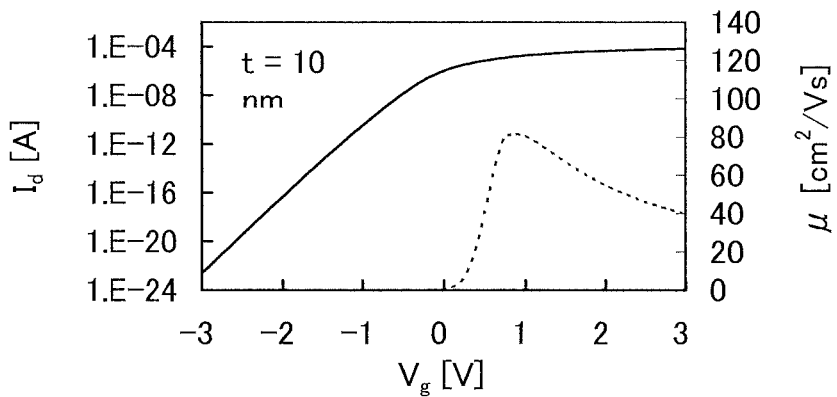
Figure 16C:
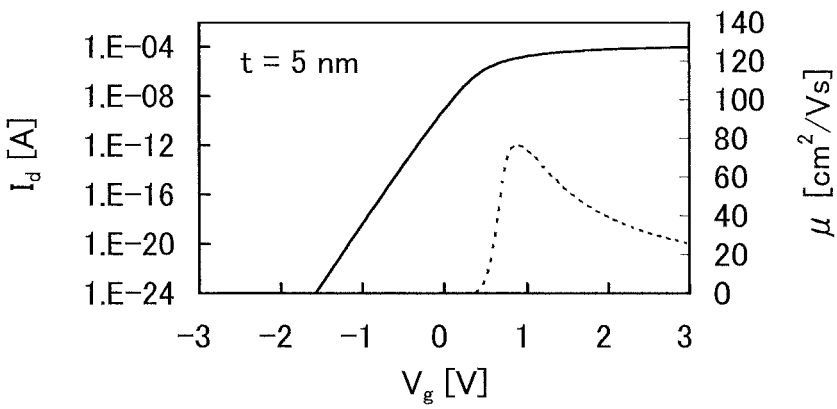

The other parameters used in calculation are as described above. For the calculation, device simulation software Sentaurus Device manufactured by Synopsys, Inc. was used. FIGS. 16A to 16C show the gate electrode voltage ($V_g$: a potential difference between the gate electrode and the source) dependence of the drain current ($I_d$, a solid line) and the mobility (μ, a dotted line) of the transistor having the structure illustrated in FIG. 19A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 16A shows the gate voltage dependence of the transistor in the case where the thickness of the gate insulating layer is 15 nm, FIG. 16B shows that of the transistor in the case where the thickness of the gate insulating layer is 10 nm, and FIG. 16C shows that of the transistor in the case where the thickness of the gate insulating layer is 5 nm. As the gate insulating layer is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is required in a transistor in a memory cell, and the like, at a gate voltage of around 1 V.

Figure 17A:
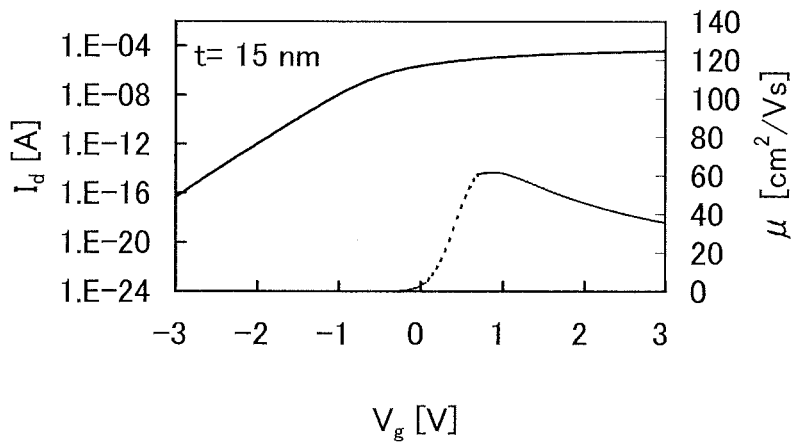
FIGS. 17A to 17C are graphs showing gate voltage dependence of drain current and mobility, which is obtained by calculation.
Figure 17B:
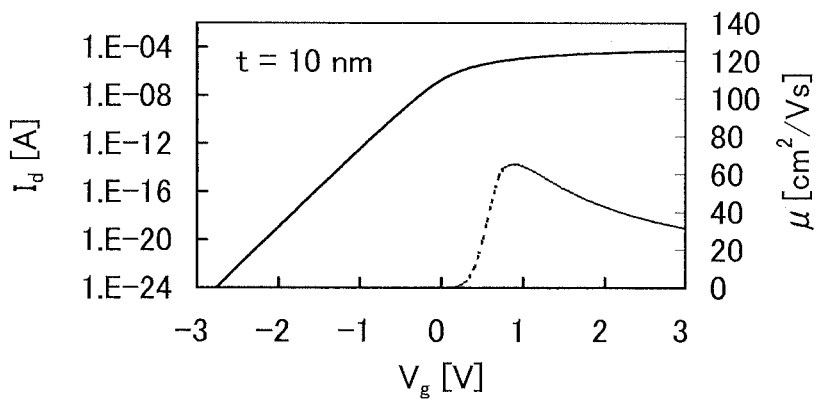
Figure 17C:
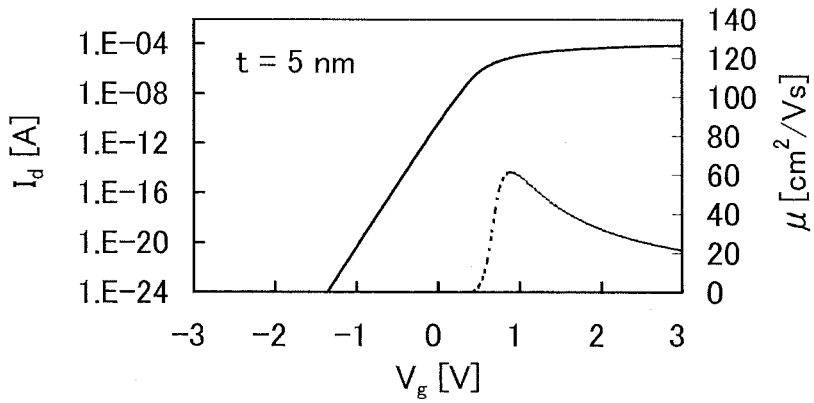

FIGS. 17A to 17C show the gate voltage $V_g$ dependence of the drain current $I_d$ (a solid line) and the mobility μ (a dotted line) of the transistor having the structure illustrated in FIG. 19B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 17A shows the gate voltage dependence of the transistor in the case where the thickness of the gate insulating layer is 15 nm, FIG. 17B shows that of the transistor in the case where the thickness of the gate insulating layer is 10 nm, and FIG. 17C shows that of the transistor in the case where the thickness of the gate insulating layer is 5 nm.

Figure 18A:
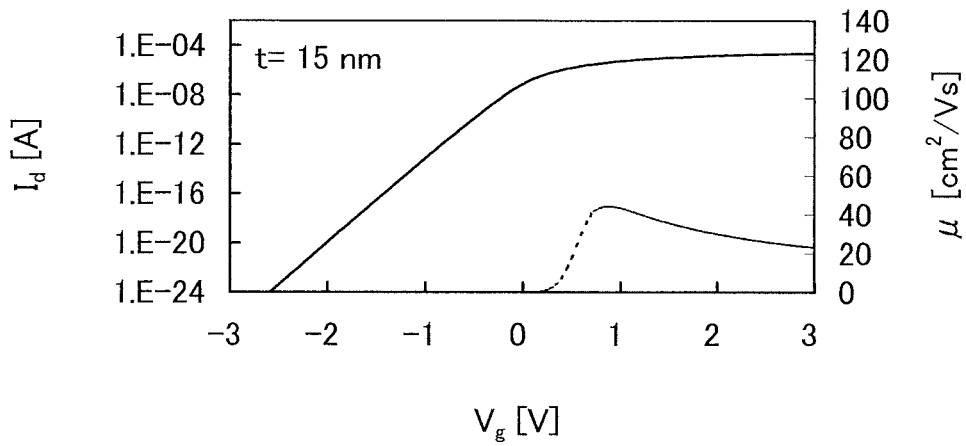
FIGS. 18A to 18C are graphs showing gate voltage dependence of drain current and mobility, which is obtained by calculation.
Figure 18B:
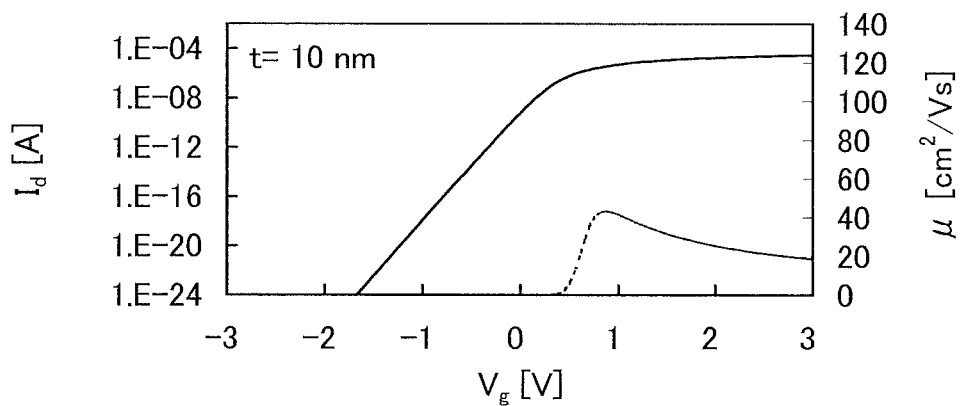
Figure 18C:
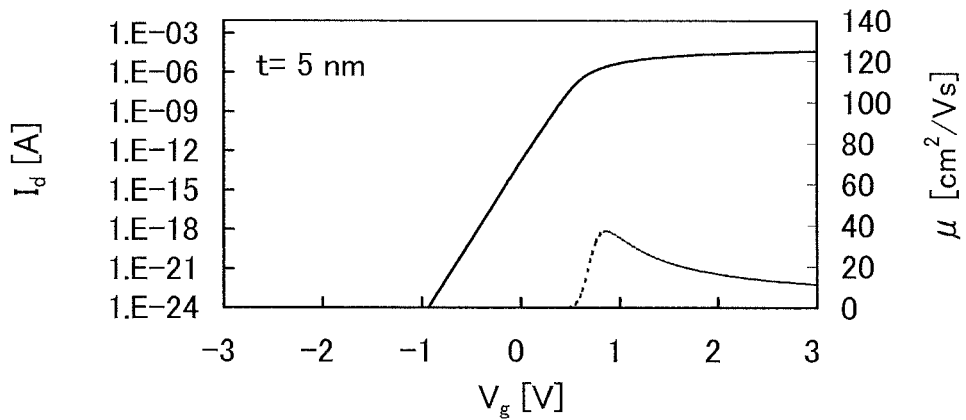
Figure 19A:
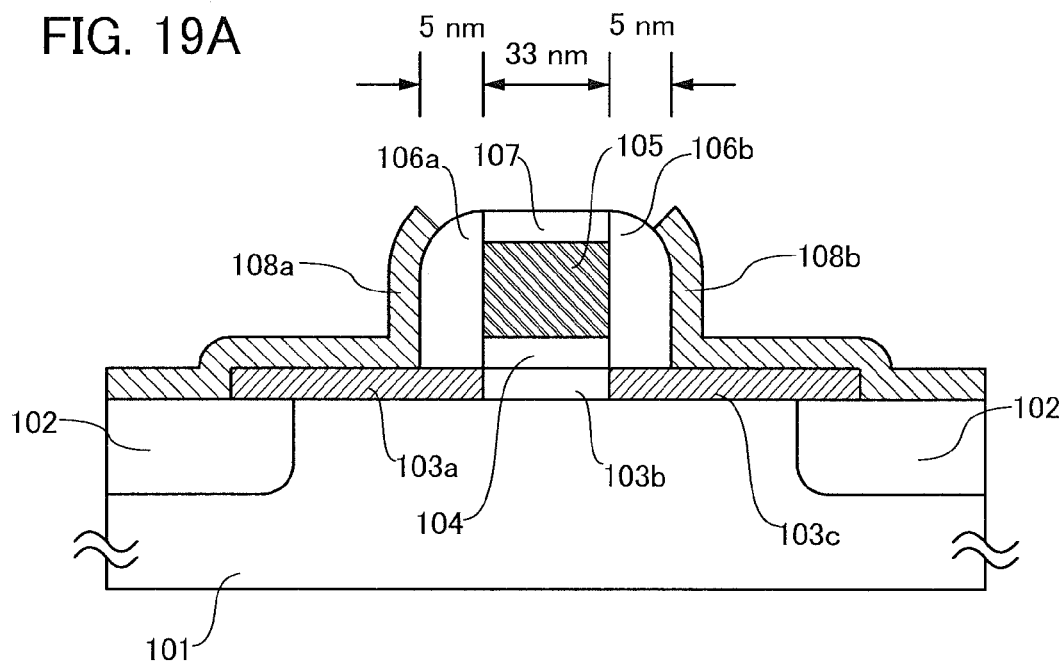
FIGS. 19A and 19B are views each illustrating a cross-sectional structure of a transistor used in the calculation.
Figure 19B:
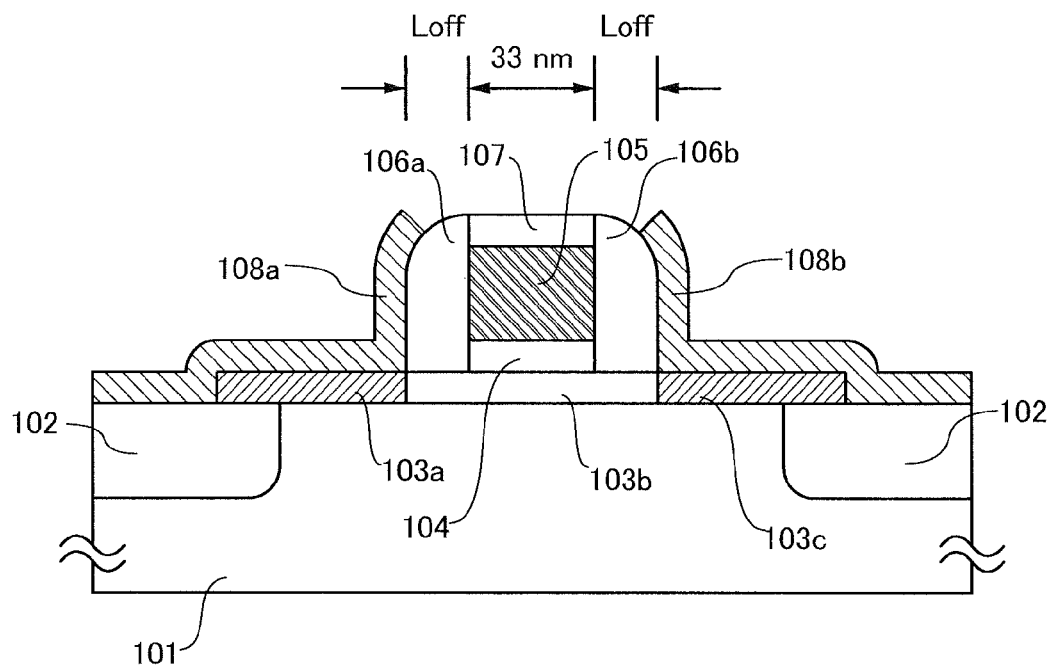

Further, FIGS. 18A to 18C show the gate voltage dependence of the drain current $I_d$ (a solid line) and the mobility μ (a dotted line) of the transistor having the structure illustrated in FIG. 19B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 18A shows the gate voltage dependence of the transistor in the case where the thickness of the gate insulating layer is 15 nm, FIG. 18B shows that of the transistor in the case where the thickness of the gate insulating layer is 10 nm, and FIG. 18C shows that of the transistor in the case where the thickness of the gate insulating layer is 5 nm.

In either of the structures, as the gate insulating layer is thinner, the off-state current is significantly decreased, whereas no noticeable change arises in the peak value of the mobility μ and the on-state current.

Note that the peak of the mobility μ is approximately 80 $cm^2$/Vs in FIGS. 16A to 16C, approximately 60 $cm^2$/Vs in FIGS. 17A to 17C, and approximately 40 $cm^2$/Vs in FIGS. 18A to 18C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a transistor in a memory cell, and the like, at a gate voltage of around 1 V.

Embodiment 6

A transistor in which an oxide semiconductor including In, Sn, and Zn as main components is used as a channel formation region, which has been described in Embodiments 1 to 5 will be described, can have favorable characteristics by depositing the oxide semiconductor while heating a substrate or by performing heat treatment after an oxide semiconductor film is formed. Note that a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 20A:
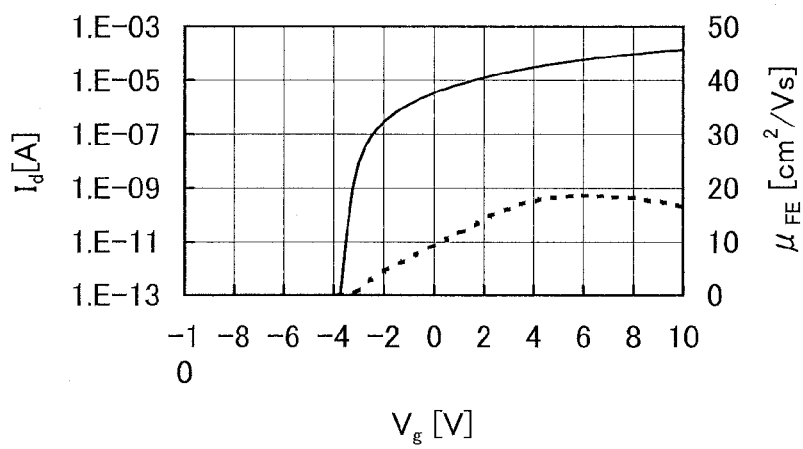
FIGS. 20A to 20C are graphs each showing characteristics of a transistor including an oxide semiconductor film.
Figure 20B:
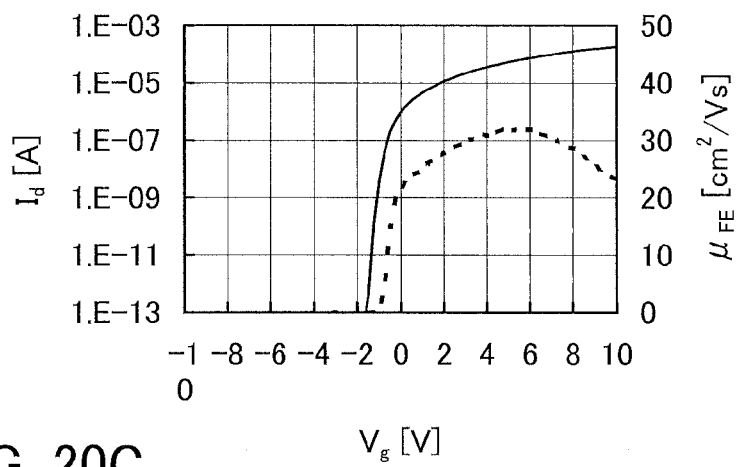
Figure 20C:
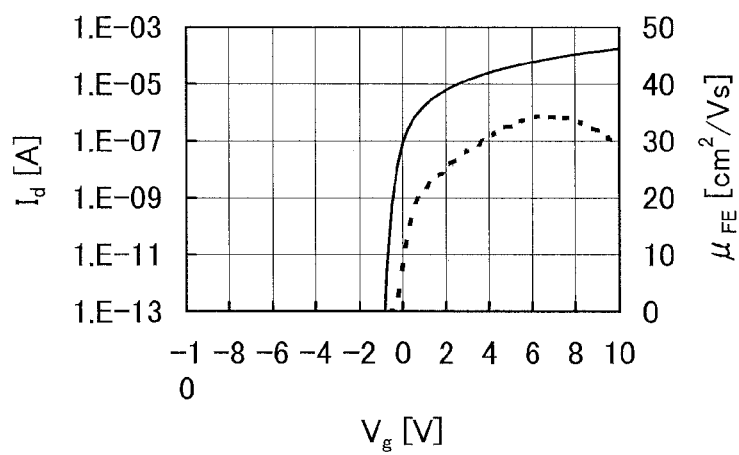

As an example, FIGS. 20A to 20C each show characteristics of a transistor in which an oxide semiconductor film including In, Sn, and Zn as main components and having a channel length L of 3 μm and a channel width W of 10 μm, and a gate insulating layer with a thickness of 100 nm are used. Note that $V_d$ was set to 10 V.

FIG. 20A shows characteristics of a transistor whose oxide semiconductor film including In, Sn, and Zn as main components was formed by a sputtering method without heating a substrate intentionally. The field-effect mobility of the transistor is 18.8 $cm^2$/Vsec. On the other hand, when the oxide semiconductor film including In, Sn, and Zn as main components is formed while heating the substrate intentionally, the field-effect mobility can be improved. FIG. 20B shows characteristics of a transistor whose oxide semiconductor film including In, Sn, and Zn as main components was formed while heating a substrate at 200° C. The field-effect mobility of the transistor is 32.2 $cm^2$/Vsec.

The field-effect mobility can be further improved by performing heat treatment after formation of the oxide semiconductor film including In, Sn, and Zn as main components. FIG. 20C shows characteristics of a transistor whose oxide semiconductor film including In, Sn, and Zn as main components was formed by sputtering at 200° C. and then subjected to heat treatment at 650° C. The field-effect mobility of the transistor is 34.5 $cm^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-singlecrystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 20A and 20B Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Note that $V_d$ refers to drain voltage (a potential difference between a drain and a source). Then, the substrate temperature was set to 150° C. and $V_d$ was set to 0.1 V. After that, 20 V of $V_g$ was applied so that the intensity of an electric field applied to gate insulating layers 608 was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set at 150° C. and $V_d$ was set to 0.1 V. After that, −20 V of $V_g$ was applied so that the intensity of an electric field applied to the gate insulating layers 608 was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 21A:
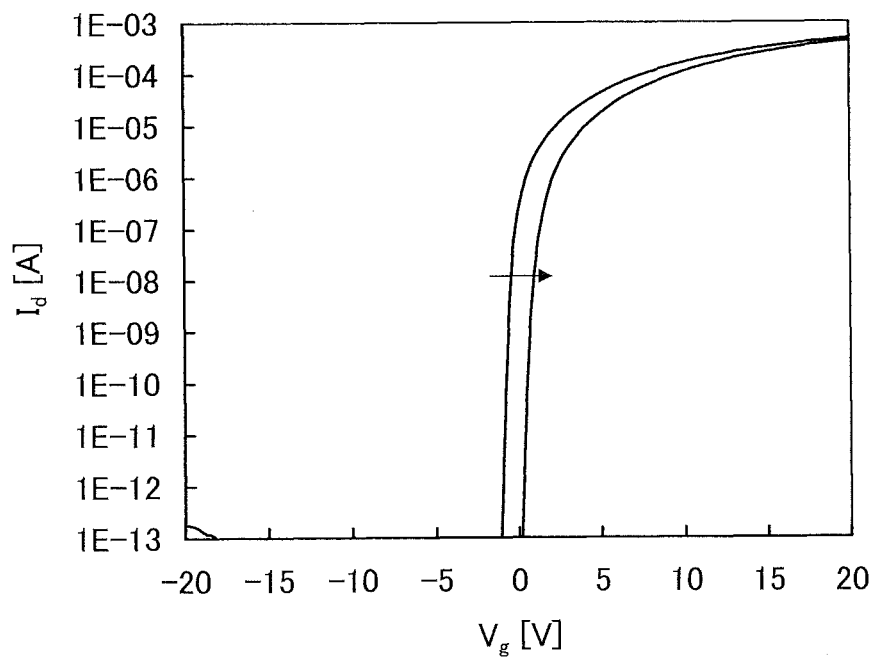
FIGS. 21A and 21B are graphs each showing $V_g$–$I_d$ characteristics after a BT test of a transistor that is Sample 1.
Figure 21B:
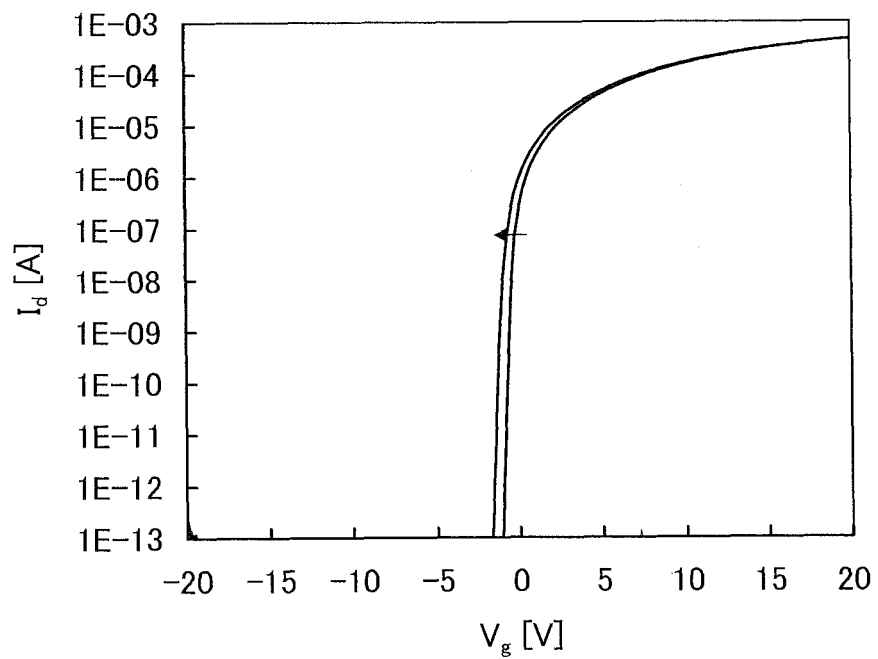
Figure 22A:
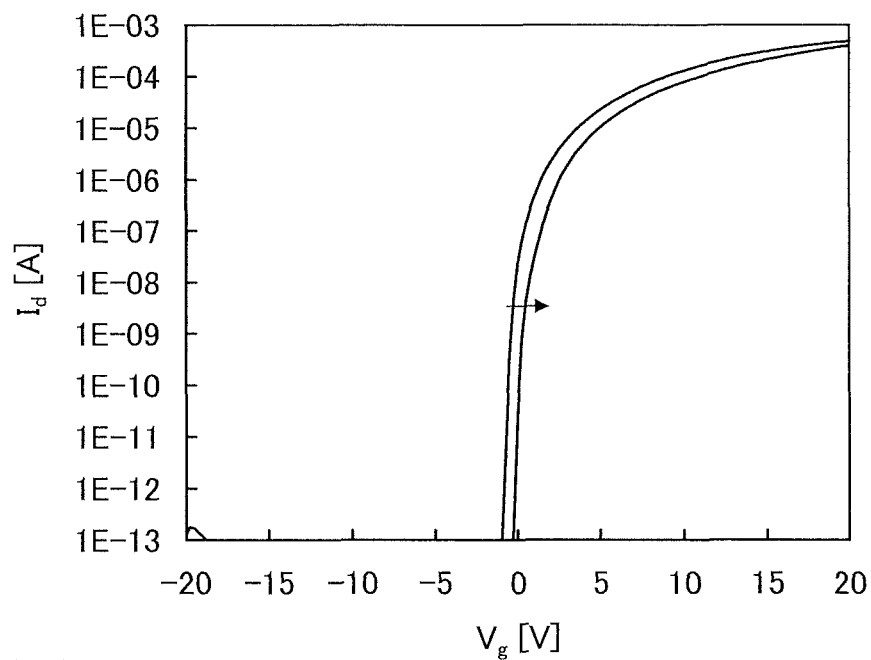
FIGS. 22A and 22B are graphs each showing $V_g$–$I_d$ characteristics after a BT test of a transistor that is Sample 2.
Figure 22B:
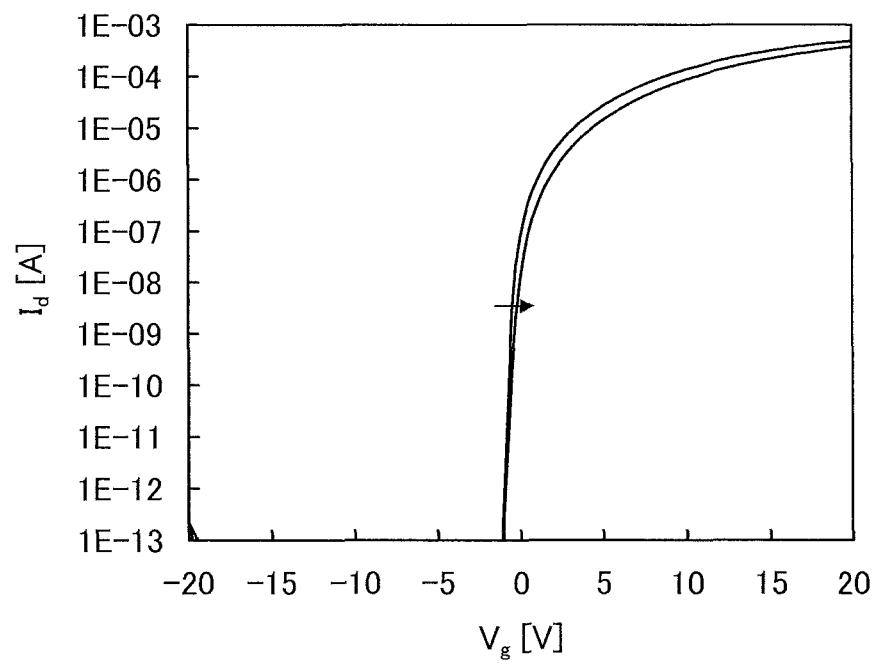

FIGS. 21A and 21B show a result of the positive BT test of Sample 1 and a result of the negative BT test of Sample 1, respectively. FIGS. 22A and 22B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1\times10^{16}$/cm$^3$ and lower than or equal to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 25:
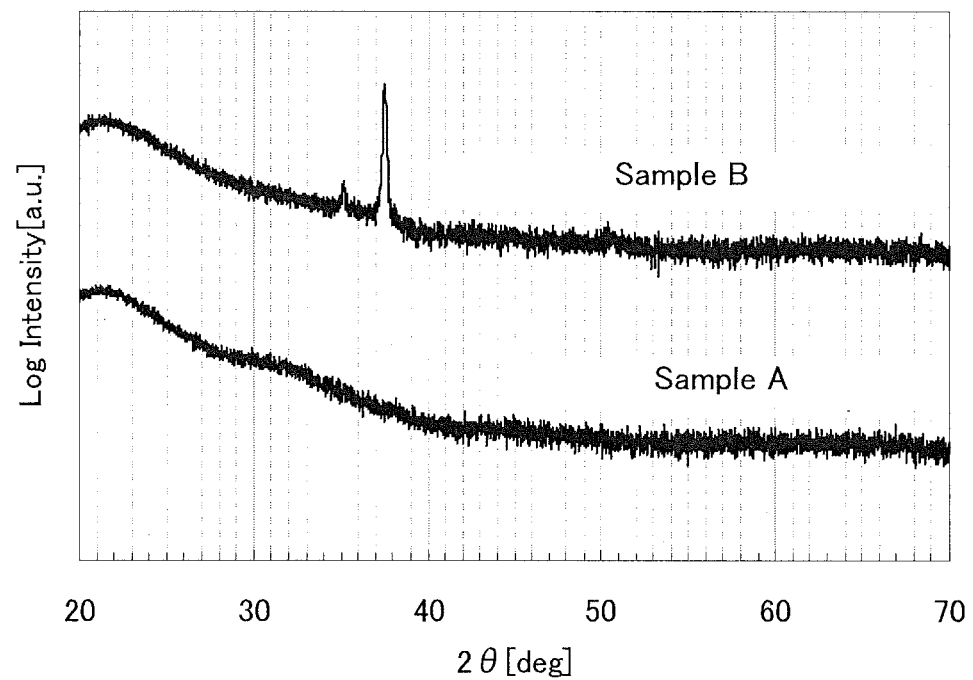
FIG. 25 is a graph showing XRD spectra of Sample A and Sample B.

FIG. 25 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current is used to indicate current per micrometer of a channel width.

Figure 26:
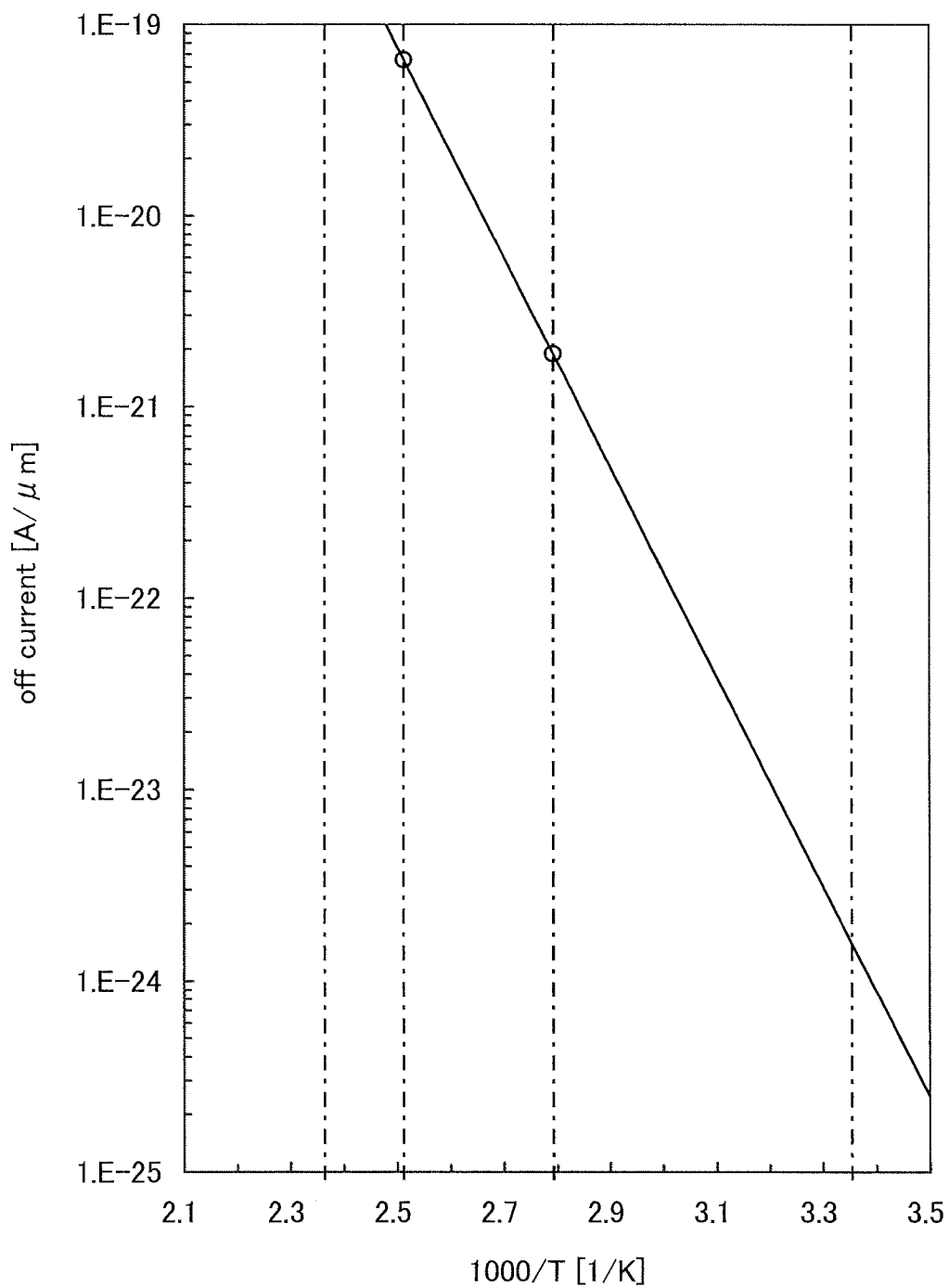
FIG. 26 is a graph showing the relationship between off-state current of a transistor and substrate temperature at measurement.

FIG. 26 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 26, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C. (398.15 K), 85° C. (358.15 K), and room temperature (27° C., 300.15 K), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at a substrate temperature of 125° C., a substrate temperature of 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor film, is referred to as dW.

Figure 23:
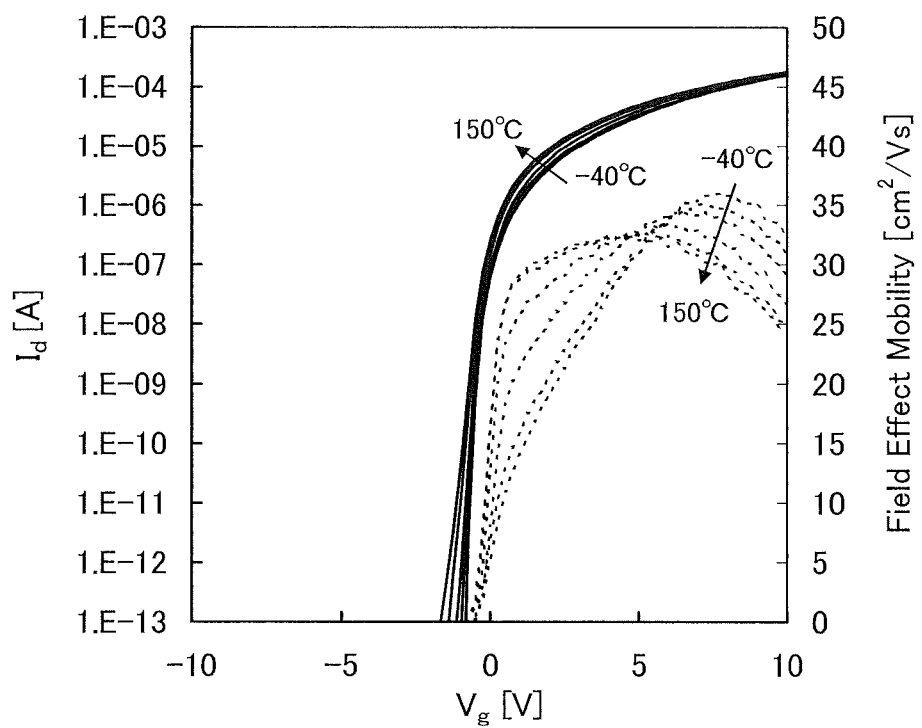
FIG. 23 is a graph showing $V_g$ dependence of $I_d$ (a solid line) and field-effect mobility.
Figure 24A:
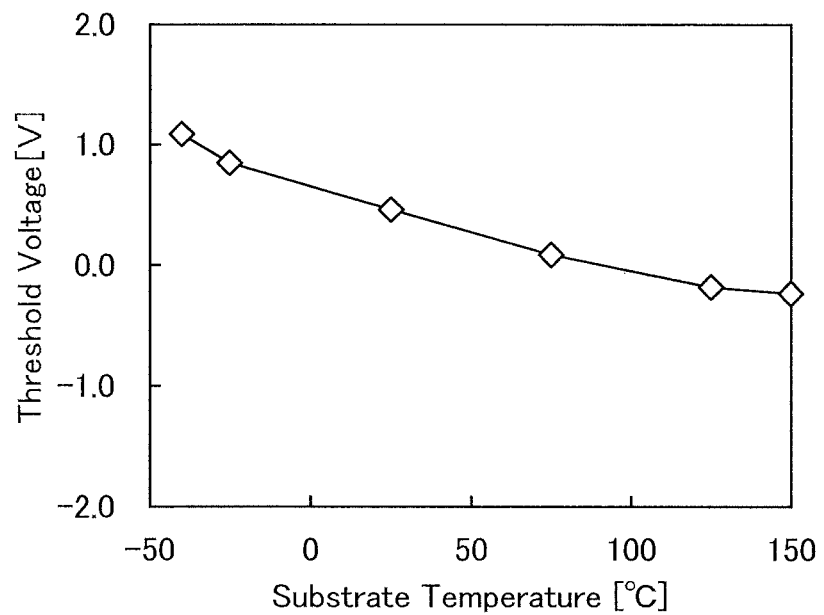
FIGS. 24A and 24B are a graph showing the relationship between substrate temperature and threshold voltage and a graph showing the relationship between substrate temperature and field effect mobility, respectively.

FIG. 23 shows the $V_g$ dependence of $I_d$ (a solid line) and field-effect mobility (a dotted line). FIG. 24A shows a relation between the substrate temperature and the threshold voltage, and FIG. 24B shows a relation between the substrate temperature and the field-effect mobility.

From FIG. 24A, it is found that the threshold voltage gets lower as the substrate temperature increases. Note that the threshold voltage is decreased from 1.09 V to −0.23 V in the range from −40° C. to 150° C.

Figure 24B:
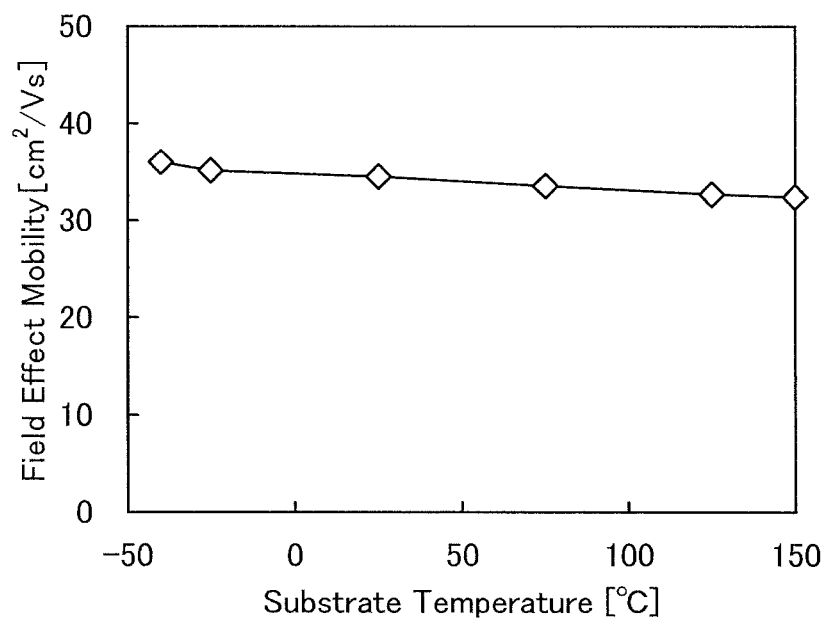

From FIG. 24B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm²/Vsec or higher, preferably 40 cm²/Vsec or higher, further preferably 60 cm²/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

Example 1

In this example, an example of a transistor in which an In—Sn—Zn—O film is used as an oxide semiconductor film will be described with reference to FIGS. 27A and 27B.

Figure 27A:
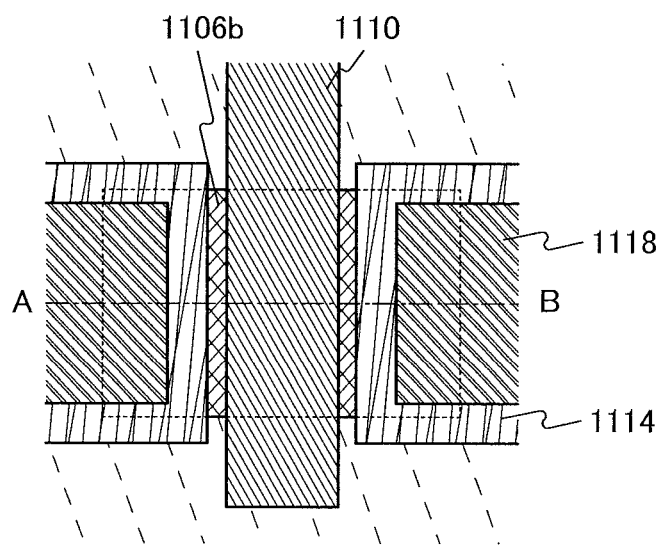
FIGS. 27A and 27B are a top view and a cross-sectional view of a coplanar top-gate top-contact transistor including an In—Sn—Zn—O film as an oxide semiconductor film.
Figure 27B:
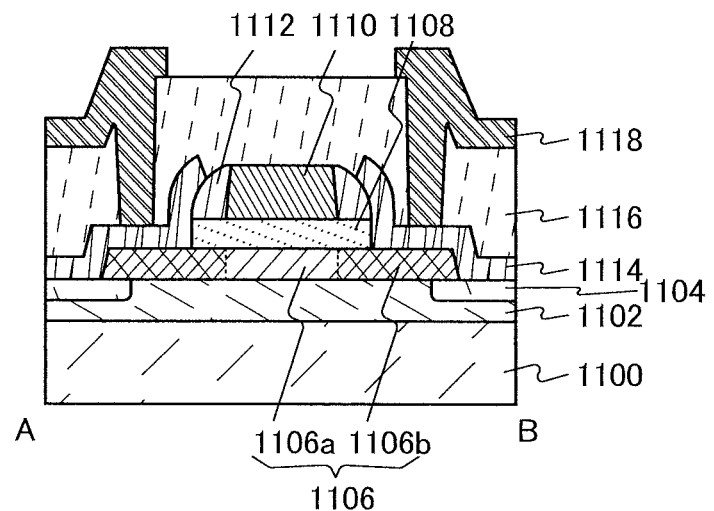

FIGS. 27A and 27B are a top view and a cross-sectional view of a coplanar transistor having a top-gate top-contact structure. FIG. 27A is the top view of the transistor. FIG. 27B illustrates cross section A-B along dashed-dotted line A-B in FIG. 27A.

The transistor illustrated in FIG. 27B includes a substrate 1100; a base insulating film 1102 provided over the substrate 1100; a protective insulating film 1104 provided in the periphery of the base insulating film 1102; an oxide semiconductor film 1106 provided over the base insulating film 1102 and the protective insulating film 1104 and including a high-resistance region 1106a and low-resistance regions 1106b; a gate insulating layer 1108 provided over the oxide semiconductor film 1106; a gate electrode 1110 provided to overlap with the oxide semiconductor film 1106 with the gate insulating layer 1108 positioned therebetween; a sidewall insulating film 1112 provided in contact with a side surface of the gate electrode 1110; a pair of electrodes 1114 provided in contact with at least the low-resistance regions 1106b; an interlayer insulating film 1116 provided to cover at least the oxide semiconductor film 1106, the gate electrode 1110, and the pair of electrodes 1114; and a wiring 1118 provided to be connected to at least one of the pair of electrodes 1114 through an opening formed in the interlayer insulating film 1116.

Although not illustrated, a protective film may be provided to cover the interlayer insulating film 1116 and the wiring 1118. With the protective film, a minute amount of leakage current generated by surface conduction of the interlayer insulating film 1116 can be reduced and thus the off-state current of the transistor can be reduced.

Example 2

In this example, another example of a transistor in which an In—Sn—Zn—O film is used as an oxide semiconductor film will be described.

Figure 28A:
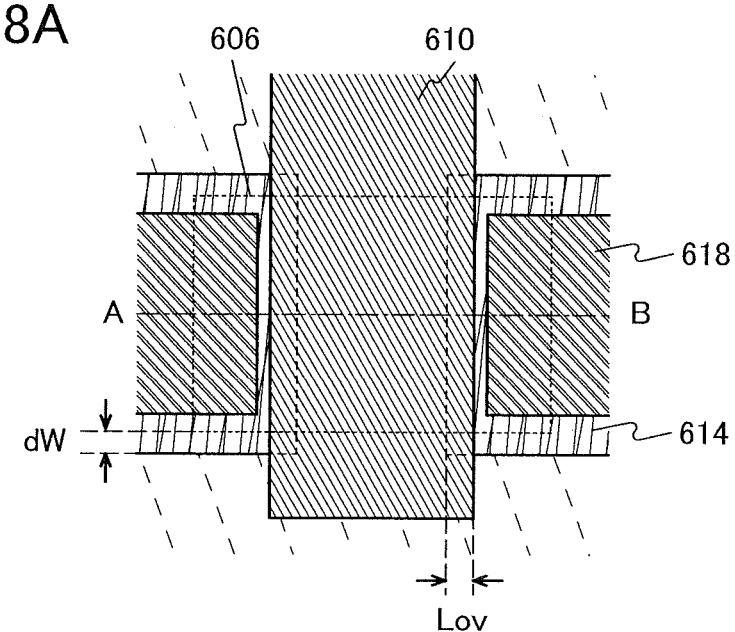
FIGS. 28A and 28B are a top view and a cross-sectional view illustrating a structure of a transistor manufactured in Example 2.
Figure 28B:
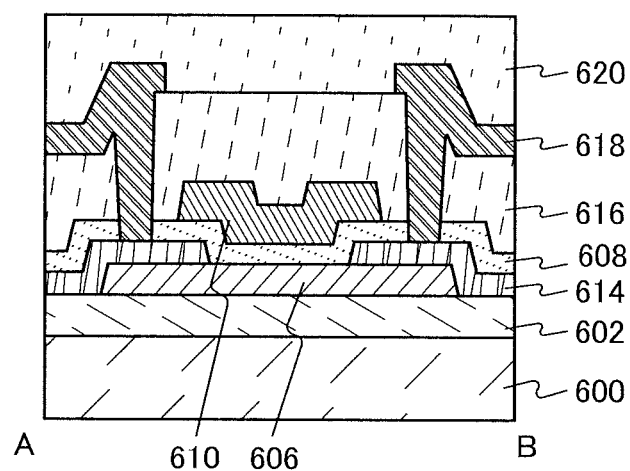

FIGS. 28A and 28B are a top view and a cross-sectional view which illustrate a structure of a transistor manufactured in this example. FIG. 28A is the top view of the transistor. FIG. 28B is a cross-sectional view along dashed-dotted line A-B in FIG. 28A.

The transistor illustrated in FIG. 28B includes a substrate 600; a base insulating film 602 provided over the substrate 600; an oxide semiconductor film 606 provided over the base insulating film 602; a pair of electrodes 614 in contact with the oxide semiconductor film 606; a gate insulating layer 608 provided over the oxide semiconductor film 606 and the pair of electrodes 614; a gate electrode 610 provided to overlap with the oxide semiconductor film 606 with the gate insulating layer 608 positioned therebetween; an interlayer insulating film 616 provided to cover the gate insulating layer 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 600, a glass substrate can be used. As the base insulating film 602, a silicon oxide film can be used. As the oxide semiconductor film 606, an In—Sn—Zn—O film can be used. As the pair of electrodes 614, a tungsten film can be used. As the gate insulating layer 608, a silicon oxide film can be used. The gate electrode 610 can have a stacked structure of a tantalum nitride film and a tungsten film. The interlayer insulating film 616 can have a stacked structure of a silicon oxynitride film and a polyimide film. The wirings 618 can each have a stacked structure in which a titanium film, an aluminum film, and a titanium film are formed in this order. As the protective film 620, a polyimide film can be used.

Note that in the transistor having the structure illustrated in FIG. 28A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

This application is based on Japanese Patent Application serial no. 2010-176982 filed with the Japan Patent Office on Aug. 6, 2010 and Japanese Patent Application serial no. 2011-108051 filed with the Japan Patent Office on May 13, 2011, the entire contents of which are hereby incorporated by reference.

What is claimed is:

1. A semiconductor device comprising:
a bit line;
a source line;
a word line; and
a memory cell comprising a first transistor and a second transistor,
wherein the first transistor is a p-channel transistor,
wherein the first transistor comprises a first gate, a first source, a first drain, and a first channel formation region comprising crystalline silicon,
wherein the second transistor comprises a second gate, a second source, a second drain, and an oxide semiconductor layer including a second channel formation region,
wherein the first gate is electrically connected to one of the second source and the second drain,
wherein one of the first source and the first drain and the other of the second source and the second drain are electrically connected to the bit line,
wherein the other of the first source and the first drain is electrically connected to the source line, and
wherein the second gate is electrically connected to the word line.

2. The semiconductor device according to claim 1, wherein the second transistor overlaps with the first transistor with a first insulating layer interposed therebetween.

3. The semiconductor device according to claim 2, further comprising a second insulating layer covering the second transistor,
wherein the bit line is over the second insulating layer.

4. The semiconductor device according to claim 1, wherein the second transistor is an n-channel transistor.

5. The semiconductor device according to claim 1, further comprising a source line switching circuit electrically connected to the source line,
wherein the source line switching circuit is configured to switch a potential of the source line.

6. The semiconductor device according to claim 5, further comprising a first driver circuit, a second driver circuit and a third driver circuit,
wherein the bit line is electrically connected to the first driver circuit,
wherein the word line is electrically connected to the second driver circuit, and
wherein the third driver circuit is configured to control the source line switching circuit, the first driver circuit and the second driver circuit.

7. A semiconductor device comprising:
a bit line;
a source line;
a first word line;
a second word line; and
a memory cell comprising a first transistor, a second transistor and a capacitor,
wherein the first transistor is a p-channel transistor,
wherein the first transistor comprises a first gate, a first source, a first drain, and a first channel formation region comprising crystalline silicon,
wherein the second transistor comprises a second gate, a second source, a second drain, and an oxide semiconductor layer including a second channel formation region,
wherein the first gate, one of the second source and the second drain, and one of a pair of electrodes of the capacitor are electrically connected to one another,
wherein one of the first source and the first drain and the other of the second source and the second drain are electrically connected to the bit line,
wherein the other of the first source and the first drain is electrically connected to the source line,
wherein the second gate is electrically connected to the first word line, and
wherein the other of the pair of electrodes of the capacitor is electrically connected to the second word line.

8. The semiconductor device according to claim 7, wherein the capacitor and the second transistor overlap with the first transistor with a first insulating layer interposed therebetween.

9. The semiconductor device according to claim 8, further comprising a second insulating layer covering the second transistor,
wherein the bit line is over the second insulating layer.

10. The semiconductor device according to claim 7, wherein the second transistor is an n-channel transistor.

11. The semiconductor device according to claim 7, further comprising a source line switching circuit electrically connected to the source line,
wherein the source line switching circuit is configured to switch a potential of the source line.

12. The semiconductor device according to claim 11, further comprising a first driver circuit, a second driver circuit and a third driver circuit,
wherein the bit line is electrically connected to the first driver circuit,
wherein the first word line and the second word line are electrically connected to the second driver circuit, and
wherein the third driver circuit is configured to control the source line switching circuit, the first driver circuit and the second driver circuit.

13. A semiconductor device comprising:
a bit line;
a first word line;
a second word line;
a first memory cell and a second memory cell, each of the first memory cell and the second memory cell comprising:
a first transistor; and
a second transistor,
wherein the first transistor is a p-channel transistor,
wherein the first transistor comprises a first gate, a first source, a first drain, and a first channel formation region comprising crystalline silicon,
wherein the second transistor comprises a second gate, a second source, a second drain, and an oxide semiconductor layer including a second channel formation region, and
wherein the first gate is electrically connected to one of the second source and the second drain,
wherein one of the first source and the first drain and the other of the second source and the second drain in each of the first memory cell and the second memory cell are electrically connected to the bit line,
wherein the second gate in the first memory cell is electrically connected to the first word line, and
wherein the second gate in the second memory cell is electrically connected to the second word line.

14. The semiconductor device according to claim 13,
wherein each of the first memory cell and the second memory cell further comprises a capacitor, and
wherein one of a pair of electrodes of the capacitor is electrically connected to the first gate.

15. The semiconductor device according to claim 13, wherein in each of the first memory cell and the second memory cell, the second transistor overlaps with the first transistor with a first insulating layer interposed therebetween.

16. The semiconductor device according to claim 15, further comprising a second insulating layer covering the second transistor in each of the first memory cell and the second memory cell,
wherein the bit line is over the second insulating layer.

17. The semiconductor device according to claim 13, wherein the second transistor is an n-channel transistor.

18. The semiconductor device according to claim 13, further comprising a source line and a source line switching circuit electrically connected to the source line,
wherein the source line is electrically connected to the other of the second source and the second drain in each of the first memory cell and the second memory cell, and
wherein the source line switching circuit is configured to switch a potential of the source line.

19. The semiconductor device according to claim 18, further comprising a first driver circuit, a second driver circuit and a third driver circuit,
wherein the bit line is electrically connected to the first driver circuit,
wherein the first word line and the second word line are electrically connected to the second driver circuit, and
wherein the third driver circuit is configured to control the source line switching circuit, the first driver circuit and the second driver circuit.

\* \* \* \* \*